(12) United States Patent
Higo et al.

(10) Patent No.: US 10,903,379 B2
(45) Date of Patent: Jan. 26, 2021

(54) PHOTOVOLTAIC DEVICES AND PHOTOVOLTAIC MODULES

(71) Applicant: SHARP KABUSHIKI KAISHA, Osaka (JP)

(72) Inventors: Teruaki Higo, Sakai (JP); Chikao Okamoto, Sakai (JP); Naoki Asano, Sakai (JP); Masamichi Kobayashi, Sakai (JP); Natsuko Fujiwara, Sakai (JP); Rihito Suganuma, Sakai (JP); Toshihiko Sakai, Sakai (JP); Kazuya Tsujino, Sakai (JP); Liumin Zou, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/557,728

(22) PCT Filed: Mar. 7, 2016

(86) PCT No.: PCT/JP2016/056929
§ 371 (c)(1),
(2) Date: Sep. 12, 2017

(87) PCT Pub. No.: WO2016/147924
PCT Pub. Date: Sep. 22, 2016

(65) Prior Publication Data
US 2018/0069139 A1    Mar. 8, 2018

(30) Foreign Application Priority Data

Mar. 13, 2015 (JP) .................................. 2015-050674
Mar. 13, 2015 (JP) .................................. 2015-050899

(51) Int. Cl.
| | |
|---|---|
| *H01L 31/0352* | (2006.01) |
| *H01L 31/05* | (2014.01) |
| *H01L 31/0747* | (2012.01) |
| *H01L 31/0224* | (2006.01) |
| *H01L 31/0216* | (2014.01) |

(52) U.S. Cl.
CPC ...... *H01L 31/0352* (2013.01); *H01L 31/0224* (2013.01); *H01L 31/02167* (2013.01);
(Continued)

(58) Field of Classification Search
CPC ....... H01L 31/022441; H01L 31/02245; H01L 31/022458; H01L 31/0682;
(Continued)

(56) References Cited

U.S. PATENT DOCUMENTS

2005/0062041 A1* 3/2005 Terakawa ............ H01L 31/0747
257/53
2010/0032014 A1    2/2010 Bettinelli et al.
(Continued)

FOREIGN PATENT DOCUMENTS

JP    2005-101427 A    4/2005
JP    2010-522976 A    7/2010
(Continued)

*Primary Examiner* — Eric R Smith
(74) *Attorney, Agent, or Firm* — ScienBiziP, P.C.

(57) ABSTRACT

A photovoltaic device includes: a semiconductor substrate stretching in a first direction and a second direction that intersects the first direction; and a first amorphous semiconductor film and a second amorphous semiconductor film both provided on the semiconductor substrate. The second amorphous semiconductor film has a differ conductivity type from the first amorphous semiconductor film. The first amorphous semiconductor film and the second amorphous semiconductor film are divided into a plurality of sections in the first direction and the second direction. Therefore, the photovoltaic device has an improved heat resistance.

19 Claims, 35 Drawing Sheets

(52) U.S. Cl.
CPC ...... *H01L 31/022441* (2013.01); *H01L 31/05* (2013.01); *H01L 31/0516* (2013.01); *H01L 31/0747* (2013.01); *Y02E 10/50* (2013.01)

(58) Field of Classification Search
CPC ..... H01L 31/035272; H01L 31/035281; H01L 31/03529
See application file for complete search history.

(56) References Cited

U.S. PATENT DOCUMENTS

| | | | | |
|---|---|---|---|---|
| 2010/0078069 | A1* | 4/2010 | Ide | H01L 31/022425 |
| | | | | 136/256 |
| 2010/0243028 | A1* | 9/2010 | Sainoo | H01L 31/02245 |
| | | | | 136/244 |
| 2011/0146747 | A1* | 6/2011 | Hieslmair | H01L 31/048 |
| | | | | 136/244 |
| 2011/0277817 | A1* | 11/2011 | Ide | H01L 31/022441 |
| | | | | 136/246 |
| 2014/0261671 | A1* | 9/2014 | Zhu | H01L 31/022425 |
| | | | | 136/256 |
| 2015/0114454 | A1* | 4/2015 | Kim | H01L 31/0508 |
| | | | | 136/251 |
| 2015/0280027 | A1* | 10/2015 | Moors | H01L 31/022441 |
| | | | | 136/256 |

FOREIGN PATENT DOCUMENTS

| | | |
|---|---|---|
| JP | 2012-49390 A | 3/2012 |
| JP | 2012-138533 A | 7/2012 |
| JP | 2013-175743 A | 9/2013 |

* cited by examiner (A)

(B)

(C)

(A)

(B)

(A)

(B)

(C)

PHOTOVOLTAIC DEVICES AND PHOTOVOLTAIC MODULES

TECHNICAL FIELD

The present invention relates to photovoltaic devices and photovoltaic modules.

BACKGROUND ART

Photovoltaic devices, capable of converting sunlight or another kind of light energy to electric energy, are increasingly expected as a next-generation energy source in view of global environmental problems. Some known photovoltaic devices have a back contact structure in which electrodes are provided only on a back face opposite a light-incident face to improve efficiency in the conversion of light energy to electric energy (see, for example, Japanese Unexamined Patent Application Publication, Tokukai, No. 2005-101427 (Patent Literature 1)).

CITATION LIST

Patent Literature

Patent Literature 1: Japanese Unexamined Patent Application Publication, Tokukai, No. 2005-101427
Patent Literature 2: Japanese Unexamined Patent Application Publication, Tokukai, No. 2012-49390

SUMMARY OF INVENTION

Technical Problem

The photovoltaic device described in Patent Literature 1 includes a large-area p-type amorphous silicon film and a large-area n-type amorphous silicon film on the back face of a semiconductor substrate. Semiconductor films containing a dopant, including p-type and n-type amorphous silicon films, have a low heat resistance. Therefore, the photovoltaic device described in Patent Literature 1 in which large-area p-type and n-type amorphous silicon films are provided has a low heat resistance.

In the photovoltaic module described in Patent Literature 2, a wiring material is electrically connected to a photovoltaic device, but only at an end section of the photovoltaic device. Therefore, mechanical connection between the photovoltaic device and the wiring material is relatively week.

It is an object of the present invention to provide a photovoltaic device that exhibits an improved heat resistance.

It is another object of the present invention to provide a photovoltaic module in which mechanical connection between a photovoltaic device and a wiring material has an improved strength.

Solution to Problem

The present invention is directed to a photovoltaic device including a semiconductor substrate, a first amorphous semiconductor film of a first conductivity type, a second amorphous semiconductor film of a second conductivity type that differs from the first conductivity type, first electrodes, and second electrodes. The semiconductor substrate has a first face and a second face opposite the first face. The semiconductor substrate is a monocrystal semiconductor substrate. The semiconductor substrate stretches in a first direction and a second direction that intersects the first direction. The first amorphous semiconductor film is disposed on the second face of the semiconductor substrate and divided into a plurality of sections in the first direction and the second direction. The second amorphous semiconductor film is disposed on the second face of the semiconductor substrate and divided into a plurality of sections in the first direction and the second direction. The first electrodes are disposed respectively on these sections of the first amorphous semiconductor film. The second electrodes are disposed respectively on these sections of the second amorphous semiconductor film.

The present invention is also directed to a photovoltaic module including a photovoltaic device and a wiring sheet. The photovoltaic device includes a semiconductor substrate, a first amorphous semiconductor film of a first conductivity type, a second amorphous semiconductor film of a second conductivity type that differs from the first conductivity type, first electrodes, and second electrodes. The semiconductor substrate has a first face and a second face opposite the first face. The semiconductor substrate is a monocrystal semiconductor substrate. The semiconductor substrate stretches in a first direction and a second direction that intersects the first direction. The first amorphous semiconductor film is disposed on the second face of the semiconductor substrate. The second amorphous semiconductor film is disposed on the second face of the semiconductor substrate. The first electrodes are disposed on the first amorphous semiconductor film and separated in the first direction and the second direction. The second electrodes are disposed on the second amorphous semiconductor film and separated in the first direction and the second direction. The photovoltaic device is mechanically connected to the wiring sheet using a junction material. The junction material is disposed in at least one of a region surrounded by the wiring sheet and an adjacent pair of the first electrodes and a region surrounded by the wiring sheet and an adjacent pair of the second electrodes. The wiring sheet includes first wires electrically connected to the first electrodes and second wires electrically connected to the second electrodes.

Advantageous Effects of Invention

The present invention provides a photovoltaic device that exhibits an improved heat resistance.

The present invention provides a photovoltaic module in which mechanical connection between a photovoltaic device and a wiring sheet has an improved strength.

DESCRIPTION OF EMBODIMENTS

Embodiment 1

Figure 1:
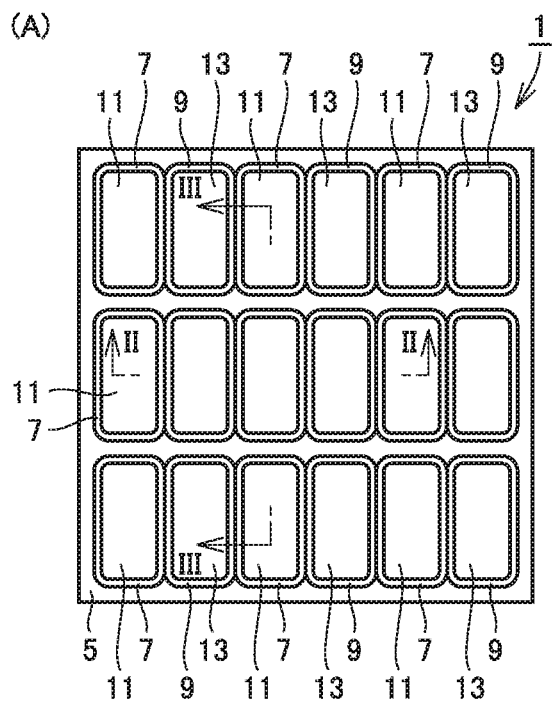
FIG. 1(A) is a schematic plan view of a photovoltaic device in accordance with Embodiment 1 as viewed from a second face side of a semiconductor substrate.
FIG. 1(B) is a schematic plan view of the photovoltaic device in accordance with Embodiment 1 as viewed from the second face side of the semiconductor substrate with first electrodes and second electrodes being omitted.
Figure 1:
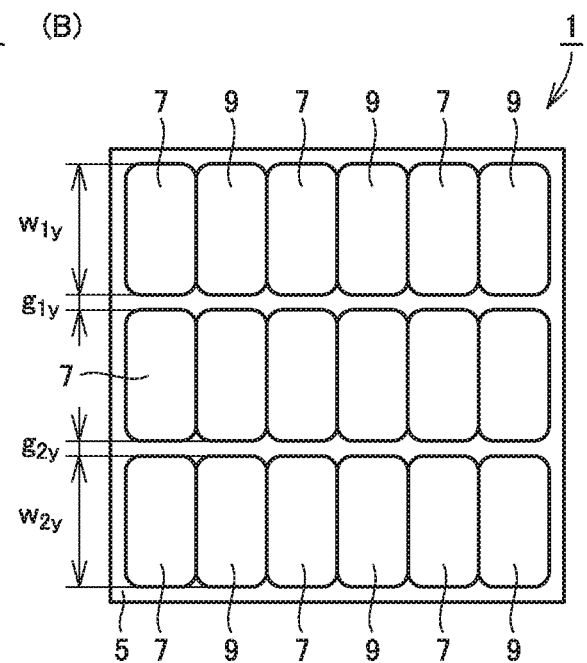
Figure 2:
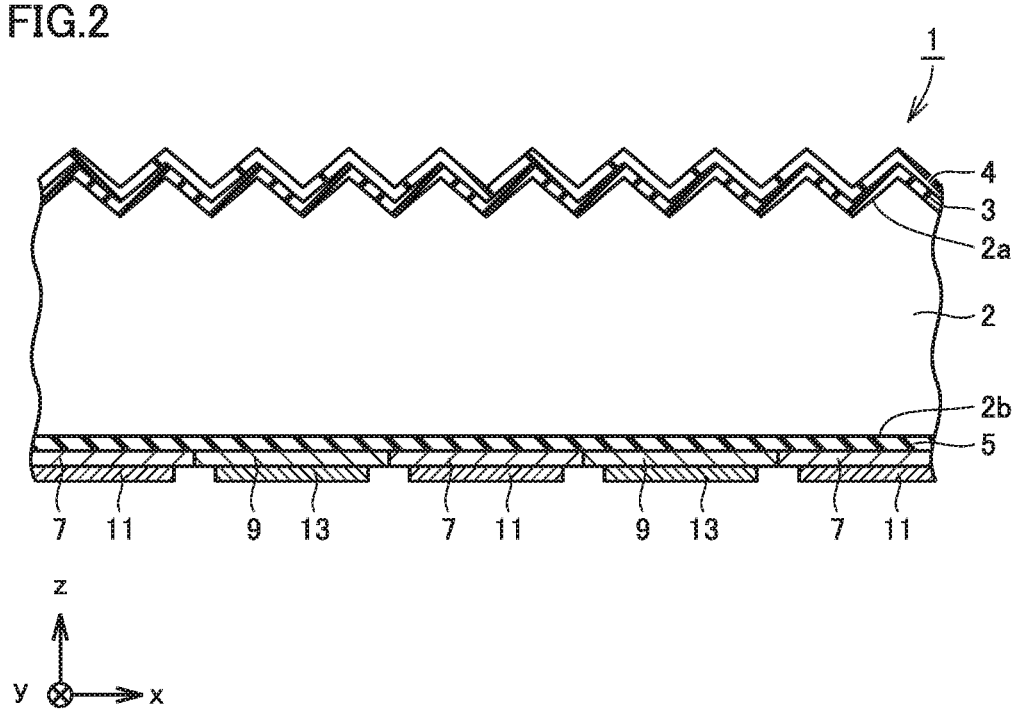
FIG. 2 is a schematic cross-sectional view of the photovoltaic device in accordance with Embodiment 1, taken along cross-sectional line II-II in FIG. 1(A).
Figure 3:
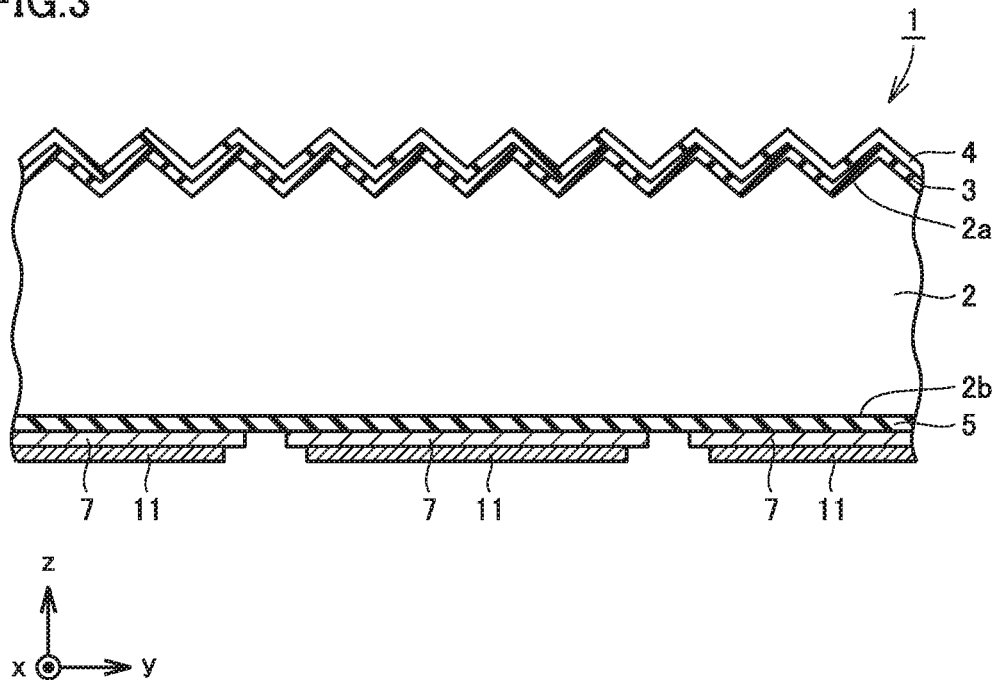
FIG. 3 is a schematic cross-sectional view of the photovoltaic device in accordance with Embodiment 1, taken along cross-sectional line III-III in FIG. 1(A).

A photovoltaic device 1 in accordance with Embodiment 1 will be described in reference to FIGS. 1 to 3.

The photovoltaic device 1 in accordance with the present embodiment includes a semiconductor substrate 2, an i-type amorphous semiconductor film 5, a first amorphous semiconductor film 7, a second amorphous semiconductor film 9, first electrodes 11, second electrodes 13, a third amorphous semiconductor film 3, and an antireflection coat 4.

The semiconductor substrate 2 stretches both in a first direction and in a second direction that intersects the first direction. In the present embodiment, the first direction coincides with the x-direction, and the second direction coincides with the y-direction, which is perpendicular to the x-direction. "Intersect" throughout this description does not necessarily mean "perpendicular." The semiconductor substrate 2 may be either an n-type or a p-type monocrystal semiconductor substrate. The semiconductor substrate 2 in the present embodiment is an n-type monocrystal silicon substrate. The semiconductor substrate 2 has a first face 2a and a second face 2b opposite the first face 2a.

The first face 2a of the semiconductor substrate 2 has irregularities. Light is incident to the photovoltaic device 1 from a first face 2a side. The irregularities of the first face 2a (serving as a light-incident face) of the semiconductor substrate 2 suppress reflection of light off the first face 2a of the semiconductor substrate 2. This structure enables more light to enter the photovoltaic device 1 and allows for improvement of the light-energy-to-electric-energy conversion efficiency in the photovoltaic device 1.

The third amorphous semiconductor film 3 is disposed on the first face 2a of the semiconductor substrate 2. The third amorphous semiconductor film 3 can limit recombination of carriers (electrons or holes) generated in the semiconductor substrate 2 by the light incident on the first face 2a side of the semiconductor substrate 2. The photovoltaic device 1 in accordance with the present embodiment, including the third amorphous semiconductor film 3, thus exhibits an improved light-energy-to-electric-energy conversion efficiency. The third amorphous semiconductor film 3 may be, for example, an i-type amorphous silicon film or a stack of an i-type amorphous silicon film and an n-type amorphous silicon film. Note that throughout this description, an "i-type semiconductor" refers not only to a completely intrinsic semiconductor, but also to a semiconductor containing an n-type or p-type impurity at a sufficiently low concentration (n-type impurity concentration lower than $1 \times 10^{15}/cm^3$, and p-type impurity concentration lower than $1 \times 10^{15}/cm^3$). Note also that throughout this description, an "amorphous semiconductor" refers not only to an amorphous semiconductor containing atoms with a dangling bond (not bonded to a hydrogen), but also to a hydrogenated amorphous silicon or another like semiconductor containing atoms with no dangling bonds left (bonded to a hydrogen).

In the present embodiment, the antireflection coat 4 is disposed on a face of the third amorphous semiconductor film 3 opposite from the semiconductor substrate 2. The antireflection coat 4 on the first face 2a (serving as a light-incident face) of the semiconductor substrate 2 suppresses reflection of incident light off the first face 2a of the semiconductor substrate 2. This structure enables more light to enter the photovoltaic device 1 and allows for improvement of the light-energy-to-electric-energy conversion efficiency in the photovoltaic device 1. The antireflection coat 4 may be, for example, a dielectric film or a dielectric multilayer film. The antireflection coat 4 in the present embodiment is a silicon nitride film.

The first amorphous semiconductor film 7 is disposed on the second face 2b of the semiconductor substrate 2. The first amorphous semiconductor film 7 has a first conductivity type and may be either an n-type or a p-type amorphous semiconductor film. The first amorphous semiconductor film 7 may be, for example, a p-type amorphous silicon film or an n-type amorphous silicon film. The first amorphous semiconductor film 7 in the present embodiment is a p-type amorphous silicon film.

The first amorphous semiconductor film 7 in the present embodiment has a lattice pattern when viewed from a second face 2b side of the semiconductor substrate 2. The first amorphous semiconductor film 7 is divided into a plurality of sections in the first direction and the second direction. Each section of the first amorphous semiconductor film 7 may, when viewed from the second face 2b side of the semiconductor substrate 2, have a rectangular shape with first rounded corners (see FIG. 1(B)) and alternatively be shaped like a circle, a polygon, or a polygon with first rounded corners. These circles and first rounded corners may have a radius of curvature of from 1 μm to 10 mm inclusive, preferably from 10 μm to 1 mm inclusive.

Those sections of the first amorphous semiconductor film 7 which are adjacent in the second direction are separated by a distance $g_{1y}$ that may be from 30 μm to 1 mm inclusive. The distance $g_{1y}$ separating these second-direction-wise adjacent sections of the first amorphous semiconductor film 7 may be from one thousandth to one tenth inclusive, of the second-direction length, $w_{1y}$, of each section of the first amorphous semiconductor film 7.

The regions between the sections of the first amorphous semiconductor film 7 do not contribute to collection of carriers by the first amorphous semiconductor film 7. The distance $g_{1y}$ separating the sections of the first amorphous semiconductor film 7 in the second direction may be less than or equal to the diffusion length in the semiconductor substrate 2 of minority carriers generated in the semiconductor substrate 2 by the light incident on the first face 2a side of the semiconductor substrate 2. The "minority carriers" refers to holes when the semiconductor substrate 2 is an n-type monocrystal semiconductor substrate and to electrons when the semiconductor substrate 2 is a p-type monocrystal semiconductor substrate. The "diffusion length" of carriers refers to the length that the carriers diffuse to a density of 1/e, where "e" is the base of natural logarithm.

The sections of the first amorphous semiconductor film 7 in the present embodiment are arranged cyclically in the first direction and the second direction. The sections of the first amorphous semiconductor film 7 may be arranged non-cyclically in either one of the first direction and the second direction or in both. The sections of the first amorphous semiconductor film 7 in the present embodiment are arranged in a lattice pattern on the second face 2b of the semiconductor substrate 2. The sections of the first amorphous semiconductor film 7 are not necessarily arranged in a lattice pattern and may alternatively be arranged in a triangular lattice pattern or a non-cyclic pattern.

The second amorphous semiconductor film 9 is disposed on the second face 2b of the semiconductor substrate 2. The second amorphous semiconductor film 9 has a second conductivity type that differs from the first conductivity type. The second amorphous semiconductor film 9 may be either an n-type or a p-type amorphous semiconductor film. The second amorphous semiconductor film 9 may be, for example, a p-type amorphous silicon film or an n-type amorphous silicon film. The second amorphous semiconductor film 9 in the present embodiment is an n-type amorphous silicon film.

The second amorphous semiconductor film 9 in the present embodiment has a lattice pattern when viewed from the second face 2b side of the semiconductor substrate 2. The second amorphous semiconductor film 9 is divided into a plurality of sections in the first direction and the second direction. Each section of the second amorphous semiconductor film 9 may, when viewed from the second face 2b side of the semiconductor substrate 2, have a rectangular shape with second rounded corners (see FIG. 1(B)) and alternatively be shaped like a circle, a polygon, or a polygon with second rounded corners. These circles and second rounded corners may have a radius of curvature of from 1 µm to 10 mm inclusive, preferably from 10 µm to 1 mm inclusive.

Those sections of the second amorphous semiconductor film 9 which are adjacent in the second direction are separated by a distance $g_{2y}$ that may be from 30 µm to 1 mm inclusive. The distance $g_{2y}$ separating these second-direction-wise adjacent sections of the second amorphous semiconductor film 9 may be from one thousandth to one tenth inclusive, of the second-direction length, $w_{2y}$, of each section of the second amorphous semiconductor film 9.

The regions between the sections of the second amorphous semiconductor film 9 do not contribute to collection of carriers by the second amorphous semiconductor film 9. The distance $g_{2y}$ separating those sections of the second amorphous semiconductor film 9 which are adjacent in the second direction may be less than or equal to the diffusion length in the semiconductor substrate 2 of minority carriers generated in the semiconductor substrate 2 by the light incident on the first face 2a side of the semiconductor substrate 2.

The sections of the second amorphous semiconductor film 9 in the present embodiment are arranged cyclically in the first direction and the second direction. The sections of the second amorphous semiconductor film 9 may be arranged non-cyclically in either one of the first direction and the second direction or in both. The sections of the second amorphous semiconductor film 9 in the present embodiment are arranged in a lattice pattern on the second face 2b of the semiconductor substrate 2. The sections of the second amorphous semiconductor film 9 are not necessarily arranged in a lattice pattern and may alternatively be arranged in a triangular lattice pattern or a non-cyclic pattern.

The sections of the first amorphous semiconductor film 7 and the sections of the second amorphous semiconductor film 9 in the present embodiment are arranged alternately when viewed in the first direction. Meanwhile, when viewed in the second direction, there are formed columns composed exclusively of sections of the first amorphous semiconductor film 7 (containing no sections of the second amorphous semiconductor film 9) and columns composed exclusively of sections of the second amorphous semiconductor film 9 (containing no sections of the first amorphous semiconductor film 7). As a result, in the first direction, each one of the sections of the first amorphous semiconductor film 7 is adjacent to one of the sections of the second amorphous semiconductor film 9, but none of the sections of the first amorphous semiconductor film 7 is adjacent to another one of the sections of the first amorphous semiconductor film 7. Likewise, in the first direction, each one of the sections of the second amorphous semiconductor film 9 is adjacent to one of the sections of the first amorphous semiconductor film 7, but none of the sections of the second amorphous semiconductor film 9 is adjacent to another one of the sections of the second amorphous semiconductor film 9. In contrast, in the second direction, each one of the sections of the first amorphous semiconductor film 7 is adjacent to another one of the sections of the first amorphous semiconductor film 7, and each one of the sections of the second amorphous semiconductor film 9 is adjacent to another one of the sections of the second amorphous semiconductor film 9. All the sections of the second amorphous semiconductor film 9 and all the sections of the first amorphous semiconductor film 7 have the same shape and area in the present embodiment.

The i-type amorphous semiconductor film 5 may be disposed between the semiconductor substrate 2 and the first amorphous semiconductor film 7 and between the semiconductor substrate 2 and the second amorphous semiconductor film 9. The i-type amorphous semiconductor film 5 in the present embodiment is an i-type amorphous silicon film. The i-type amorphous semiconductor film 5 is also disposed on the second face 2b of the semiconductor substrate 2. The photovoltaic device 1 may not include the i-type amorphous semiconductor film 5.

The first amorphous semiconductor film 7 may, in the first direction, be either in contact with the second amorphous semiconductor film 9 or separated from the second amorphous semiconductor film 9. The i-type amorphous semiconductor film 5 may be disposed also between the first amorphous semiconductor film 7 and the second amorphous semiconductor film 9 in the first direction.

The first electrodes 11 are disposed respectively on the sections of the first amorphous semiconductor film 7. Each first electrode 11 may, when viewed from the second face 2b side of the semiconductor substrate 2, have a rectangular shape with third rounded corner portions (see FIG. 1(A)) and alternatively be shaped like a circle, a polygon, or a polygon with third rounded corners. These circles and third rounded corners may have a radius of curvature of from 1 µm to 10 mm inclusive, preferably from 10 µm to 1 mm inclusive. The first electrodes 11 in the present embodiment are arranged in a lattice pattern on the second face 2b of the semiconductor substrate 2 (see FIG. 1(A)). The first electrodes 11 are not necessarily arranged in a lattice pattern and may alternatively be arranged in a triangular lattice pattern or a non-cyclic pattern. The first electrodes 11 may be, for example, metal electrodes. The first electrodes 11 in the present embodiment are silver (Ag) and may be p-type electrodes.

Those first electrodes 11 which are adjacent in the second direction are separated by a distance that may be from 30 μm to 1 mm inclusive. The distance separating these second-direction-wise adjacent first electrodes 11 may be from one thousandth to one tenth inclusive, of the second-direction length of each first electrode 11 and also may be less than or equal to the diffusion length in the semiconductor substrate 2 of minority carriers generated in the semiconductor substrate 2 by the light incident on the first face 2a side of the semiconductor substrate 2.

The second electrodes 13 are disposed respectively on the sections of the second amorphous semiconductor film 9. Each second electrode 13 may, when viewed from the second face 2b side of the semiconductor substrate 2, have a rectangular shape with fourth rounded corner portions (see FIG. 1(A)) and alternatively be shaped like a circle, a polygon, or a polygon with fourth rounded corners. These circles and fourth rounded corners may have a radius of curvature of from 1 μm to 10 mm inclusive, preferably from 10 μm to 1 mm inclusive. The second electrodes 13 in the present embodiment are arranged in a lattice pattern on the second face 2b of the semiconductor substrate 2 (see FIG. 1(A)). The second electrodes 13 are not necessarily arranged in a lattice pattern and may alternatively be arranged in a triangular lattice pattern or a non-cyclic pattern. The second electrodes 13 may be, for example, metal electrodes. The second electrodes 13 in the present embodiment are silver (Ag) and may be n-type electrodes.

Those second electrodes 13 which are adjacent in the second direction are separated by a distance that may be from 30 μm to 1 mm inclusive. The distance separating these second-direction-wise adjacent second electrodes 13 may be from one thousandth to one tenth inclusive, of the second-direction length of each second electrode 13 and also may be less than or equal to the diffusion length in the semiconductor substrate 2 of minority carriers generated in the semiconductor substrate 2 by the light incident on the first face 2a side of the semiconductor substrate 7.

The first electrodes 11 and the second electrodes 13 in the present embodiment are arranged alternately when viewed in the first direction. Meanwhile, when viewed in the second direction, there are formed columns composed exclusively of first electrodes 11 (containing no second electrodes 13) and columns composed exclusively of second electrodes 13 (containing no first electrodes 11). As a result, in the first direction, each one of the first electrodes 11 is adjacent to one of the second electrodes 13, but none of the first electrodes 11 is adjacent to another one of the first electrodes 11. Likewise, in the first direction, each one of the second electrodes 13 is adjacent to one of the first electrodes 11, but none of the second electrodes 13 is adjacent another one of the second electrodes 13. In contrast, in the second direction, each one of the first electrodes 11 is adjacent to another one of the first electrodes 11, and each one of the second electrodes 13 is adjacent to another one of the second electrodes 13. All the first electrodes 11 and all the second electrodes 13 have the same shape and area in the present embodiment.

An exemplary method of manufacturing the photovoltaic device 1 in accordance with the present embodiment will be described in reference to FIGS. 4 to 14.

Figure 4:
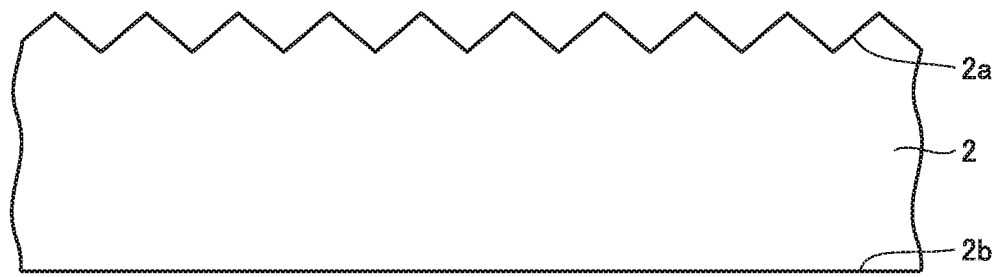
FIG. 4 is a schematic cross-sectional view taken along line FIG. 1, illustrating one of steps of a method of manufacturing the photovoltaic device in accordance with Embodiment 1.

Referring to FIG. 4, irregularities are formed on the first face 2a of the semiconductor substrate 2. The irregularities may be formed on the first face 2a of the semiconductor substrate 2, for example, by anisotropic etching of the first face 2a of the semiconductor substrate 2 (n-type monocrystal silicon substrate) using potassium hydroxide (KOH).

Figure 5:
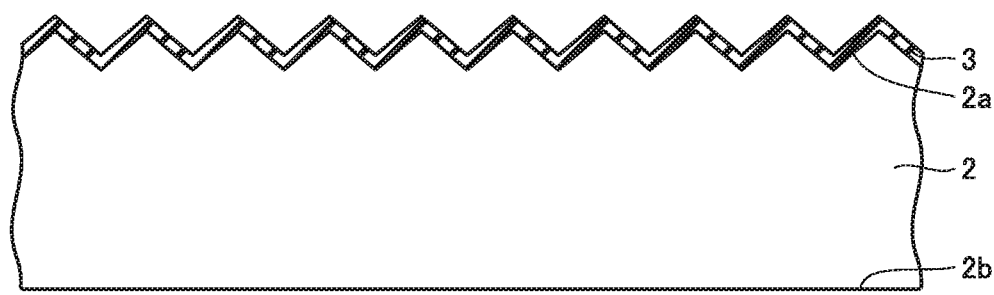
FIG. 5 is a schematic cross-sectional view illustrating a step carried out subsequent to the step shown in FIG. 4 in the method of manufacturing the photovoltaic device in accordance with Embodiment 1.

Referring to FIG. 5, the third amorphous semiconductor film 3 is formed on the first face 2a of the semiconductor substrate 2 on which irregularities have been formed. The third amorphous semiconductor film 3 is not necessarily formed by any particular method and may be formed, for example, by plasma-enhanced chemical vapor deposition (CVD).

Figure 6:
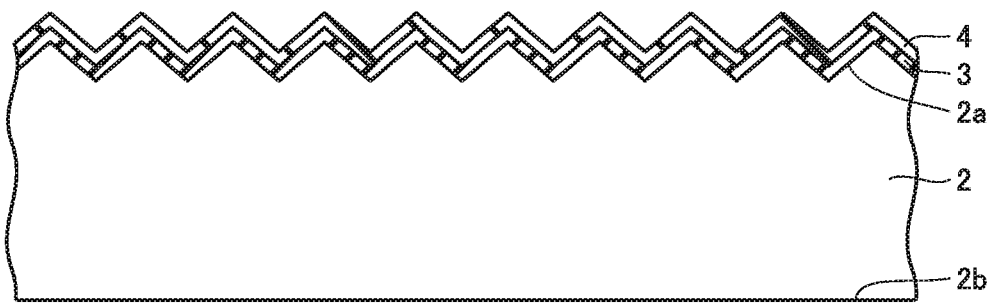
FIG. 6 is a schematic cross-sectional view illustrating a step carried out subsequent to the step shown in FIG. 5 in the method of manufacturing the photovoltaic device in accordance with Embodiment 1.

Referring to FIG. 6, the antireflection coat 4 is formed on the third amorphous semiconductor film 3. The antireflection coat 4 is not necessarily formed by any particular method and may be formed, for example, by plasma-enhanced chemical vapor deposition (CVD).

Figure 7:
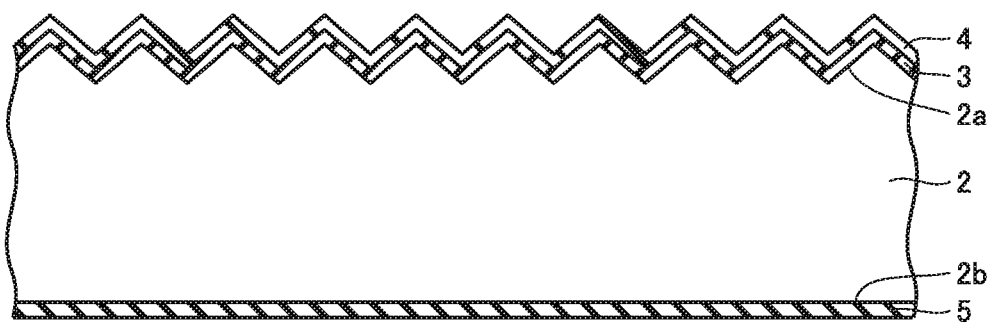
FIG. 7 is a schematic cross-sectional view illustrating a step carried out subsequent to the step shown in FIG. 6 in the method of manufacturing the photovoltaic device in accordance with Embodiment 1.

Referring to FIG. 7, the i-type amorphous semiconductor film 5 is formed on the second face 2b of the semiconductor substrate 2. The i-type amorphous semiconductor film 5 is not necessarily formed by any particular method and may be formed, for example, by plasma-enhanced chemical vapor deposition (CVD).

Figure 8:
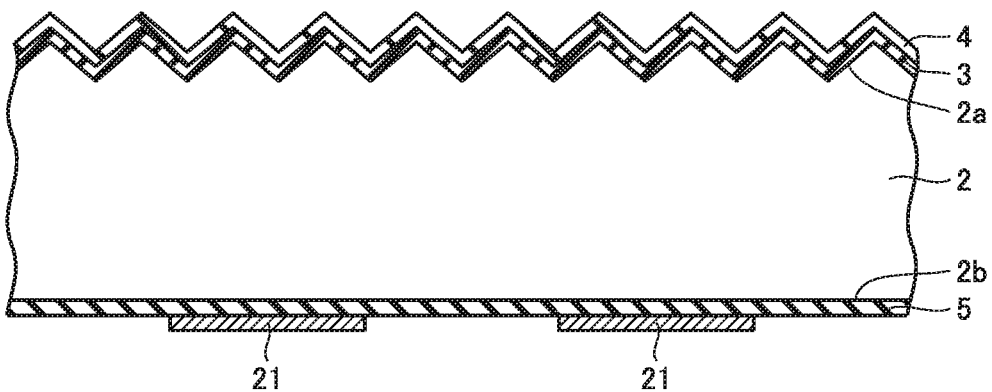
FIG. 8 is a schematic cross-sectional view illustrating a step carried out subsequent to the step shown in FIG. 7 in the method of manufacturing the photovoltaic device in accordance with Embodiment 1.
Figure 9:
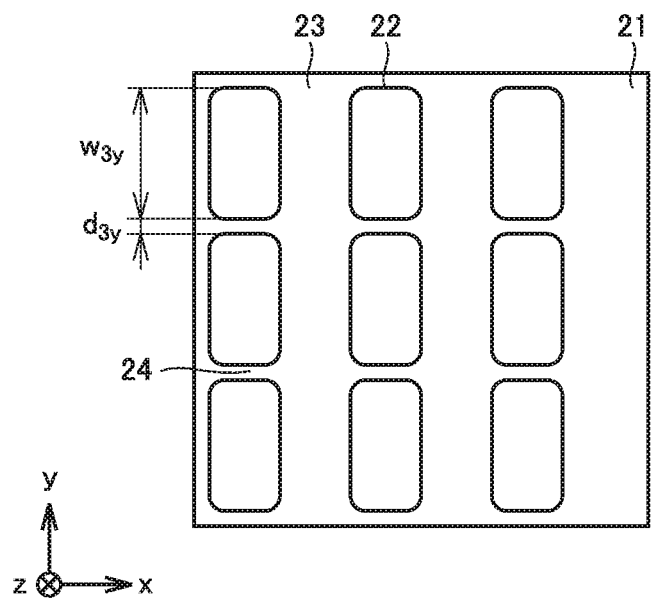
FIG. 9 is a schematic plan view of a first mask used in the step shown in FIG. 8 in the method of manufacturing the photovoltaic device in accordance with Embodiment 1.

Referring to FIGS. 8 and 9, a first mask 21 is placed on the i-type amorphous semiconductor film 5. The first mask 21 has a first opening 22. The first opening 22 of the first mask 21 is divided into a plurality of sections in the first direction and the second direction.

The sections of the first opening 22 of the first mask 21 are separated in the first direction by a first bridge section 23 of the first mask 21. Those sections of the first opening 22 of the first mask 21 which are adjacent in the first direction are separated by a distance that is equal to the first-direction width of the first bridge section 23 of the first mask 21.

The sections of the first opening 22 of the first mask 21 are separated in the second direction by a second bridge section 24 of the first mask 21. Those sections of the first opening 22 of the first mask 21 which are adjacent in the second direction are separated by a distance $d_{3y}$ that is equal to the second-direction width of the second bridge section 24 of the first mask 21. The distance $d_{3y}$ separating these second-direction-wise adjacent sections of the first opening 22 of the first mask 21 may be, for example, from 30 μm to 1 mm inclusive. The second-direction width of the second bridge section 24 of the first mask 21 may be, for example, from 30 μm to 1 mm inclusive. The use of the first mask 21 enables the second-direction-wise adjacent sections of the first amorphous semiconductor film 7 to be separated by the distance $g_{1y}$ that is from 30 μm to 1 mm inclusive.

The distance $d_{3y}$ separating the second-direction-wise adjacent sections of the first opening 22 of the first mask 21 may be from one thousandth to one tenth inclusive, of the second-direction length, $w_{3y}$, of each section of the first opening 22 of the first mask 21. The width of the second bridge section 24 of the first mask 21 may be from one thousandth to one tenth inclusive, of the second-direction length, $w_{3y}$, of each section of the first opening 22 of the first mask 21. The use of the first mask 21 enables the second-direction-wise adjacent sections of the first amorphous semiconductor film 7 to be separated by the distance $g_{1y}$ that is from one thousandth to one tenth inclusive, of the second-direction length, $w_{1y}$, of each section of the first amorphous semiconductor film 7.

The distance $d_{3y}$ separating the second-direction-wise adjacent sections of the first opening 22 of the first mask 21 may be less than or equal to the diffusion length in the semiconductor substrate 2 of minority carriers generated in the semiconductor substrate 2 by the light incident on the first face 2a side of the semiconductor substrate 2. The second-direction width of the second bridge section 24 of the first mask 21 may be less than or equal to the diffusion length in the semiconductor substrate 2 of minority carriers generated in the semiconductor substrate 2 by the light incident on the first face 2a side of the semiconductor substrate 2. The use of the first mask 21 enables the second-direction-wise adjacent sections of the first amorphous semiconductor film 7 to be separated by the distance $g_{1y}$ that is less than or equal to the diffusion length in the semiconductor substrate 2 of minority carriers generated in the semiconductor substrate 2 by the light incident on the first face 2a side of the semiconductor substrate 2.

The sections of the first opening 22 of the first mask 21 in the present embodiment are arranged in a lattice pattern and may alternatively be arranged in another pattern. Each section of the first opening 22 of the first mask 21 may have a rectangular shape with first rounded corners (see FIG. 9) and may alternatively be shaped like a circle, a polygon, or a polygon with first rounded corners. These circles and first rounded corners may have a radius of curvature of from 1 μm to 10 mm inclusive, preferably from 10 μm to 1 mm inclusive. The first mask 21 may be, for example, a metal mask.

Figure 10:
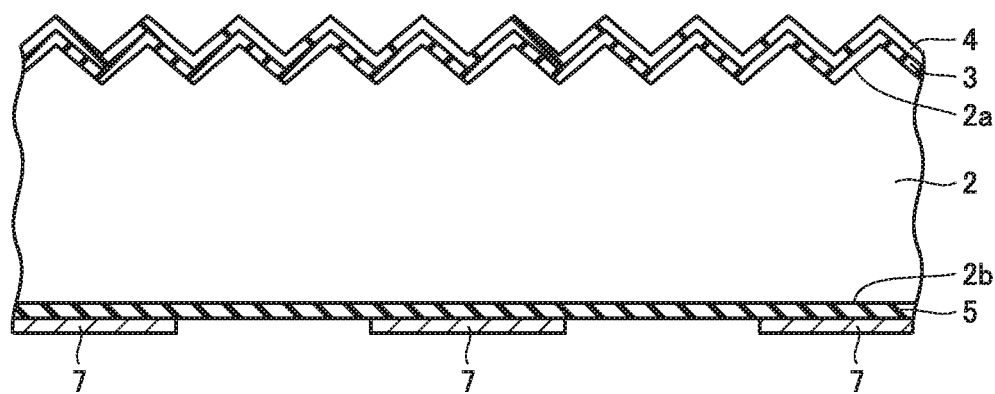
FIG. 10 is a schematic cross-sectional view illustrating a step carried out subsequent to the step shown in FIG. 8 in the method of manufacturing the photovoltaic device in accordance with Embodiment 1.

Referring to FIG. 10, the first amorphous semiconductor film 7 is formed on those regions of the second face 2b of the semiconductor substrate 2 where the first opening 22 of the first mask 21 resides. More specifically, the first amorphous semiconductor film 7 is formed on those regions of the i-type amorphous semiconductor film 5 where the first opening 22 of the first mask 21 resides. The first amorphous semiconductor film 7 is not necessarily formed by any particular method and may be formed, for example, by plasma-enhanced chemical vapor deposition (CVD). The first mask 21 is subsequently removed.

Figure 11:
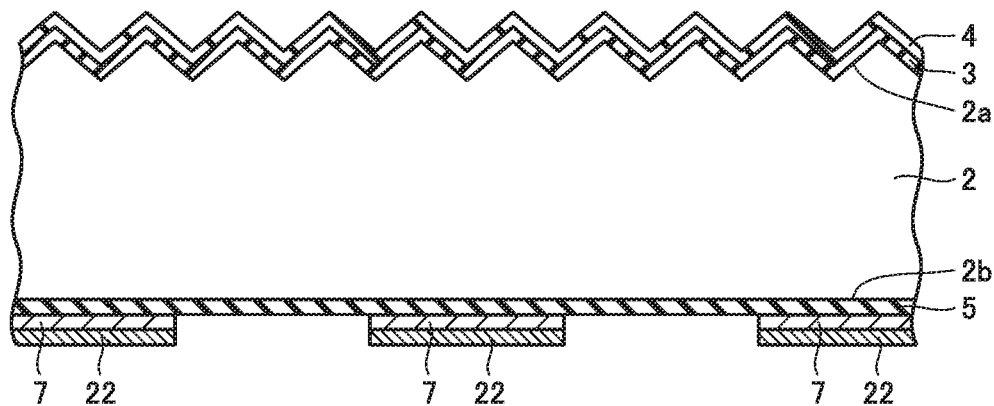
FIG. 11 is a schematic cross-sectional view illustrating a step carried out subsequent to the step shown in FIG. 10 in the method of manufacturing the photovoltaic device in accordance with Embodiment 1.
Figure 12:
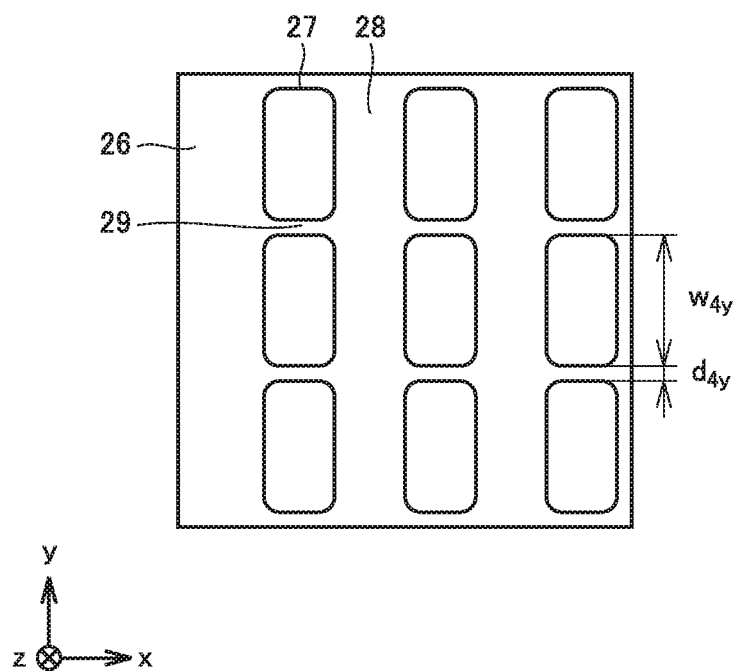
FIG. 12 is a schematic plan view of a second mask used in the step shown in FIG. 11 in the method of manufacturing the photovoltaic device in accordance with Embodiment 1.

Referring to FIGS. 11 and 12, a second mask 26 is placed on the first amorphous semiconductor film 7. The second mask 26 has a second opening 27. The second opening 27 of the second mask 26 is divided into a plurality of sections in the first direction and the second direction.

The sections of the second opening 27 of the second mask 26 are separated in the first direction by a third bridge section 28 of the second mask 26. Those sections of the second opening 27 of the second mask 26 which are adjacent in the first direction are separated by a distance that is equal to the first-direction width of the third bridge section 28 of the second mask 26.

The sections of the second opening 27 of the second mask 26 are separated in the second direction by a fourth bridge section 29 of the second mask 26. Those sections of the second opening 27 of the second mask 26 which are adjacent in the second direction are separated by a distance $d_{4y}$ that is equal to the second-direction width of the fourth bridge section 29 of the second mask 26. The distance $d_{4y}$ separating these second-direction-wise adjacent sections of the second opening 27 of the second mask 26 may be, for example, from 30 μm to 1 mm inclusive. The second-direction width of the fourth bridge section 29 of the second mask 26 may be, for example, from 30 μm to 1 mm inclusive. The use of the second mask 26 enables the second-direction-wise adjacent sections of the second amorphous semiconductor film 9 to be separated by the distance $g_{2y}$ that is from 30 μm to 1 mm inclusive.

In the present embodiment, the distance $d_{4y}$ separating the second-direction-wise adjacent sections of the second opening 27 of the second mask 26 may be from one thousandth to one tenth inclusive, of the second-direction length, $w_{4y}$, of each section of the second opening 27 of the second mask 26. The width of the fourth bridge section 29 of the second mask 26 may be from one thousandth to one tenth inclusive, of the second-direction length, $w_{4y}$, of each section of the second opening 27 of the second mask 26. The use of the second mask 26 enables the second-direction-wise adjacent sections of the second amorphous semiconductor film 9 to be separated by the distance $g_{2y}$ that is from one thousandth to one tenth inclusive, of the second-direction length, $w_{2y}$, of each section of the second amorphous semiconductor film 9.

The distance $d_{4y}$ separating the second-direction-wise adjacent sections of the second opening 27 of the second mask 26 may be less than or equal to the diffusion length in the semiconductor substrate 2 of minority carriers generated in the semiconductor substrate 2 by the tight incident on the first face 2a side of the semiconductor substrate 2. The second-direction width of the fourth bridge section 29 of the second mask 26 may be less than or equal to the diffusion length in the semiconductor substrate 2 of minority carriers generated in the semiconductor substrate 2 by the light incident on the first face 2a side of the semiconductor substrate 2. The use of the second mask 26 enables the second-direction-wise adjacent sections of the second amorphous semiconductor film 9 to be separated by the distance $g_{2y}$ that is less than or equal to the diffusion length in the semiconductor substrate 2 of minority carriers generated in the semiconductor substrate 2 by the light incident on the first face 2a side of the semiconductor substrate 2.

The sections of the second opening 27 of the second mask 26 in the present embodiment are arranged in a lattice pattern and may alternatively be arranged in another pattern. Each section of the second opening 27 of the second mask 26 may have a rectangular shape with second rounded corners (see FIG. 12) and may alternatively be shaped like a circle, a polygon, or a polygon with second rounded corners. These circles and second rounded corners may have a radius of curvature of from 1 μm to 10 mm inclusive, preferably from 10 μm to 1 mm inclusive. The second mask 26 may be, for example, a metal mask.

Figure 13:
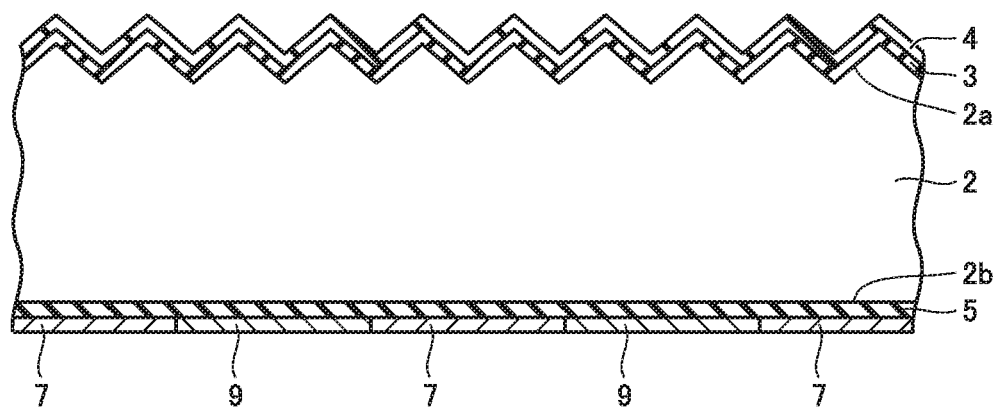
FIG. 13 is a schematic cross-sectional view illustrating a step carried out subsequent to the step shown in FIG. 11 in the method of manufacturing the photovoltaic device in accordance with Embodiment 1.
Figure 14:
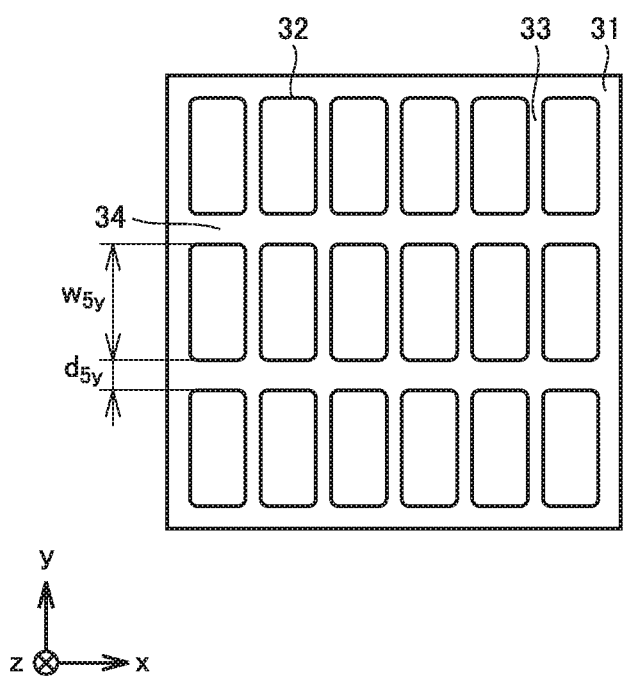
FIG. 14 is a schematic plan view of a third mask used in a step carried out subsequent to the step shown in FIG. 13 in the method of manufacturing the photovoltaic device in accordance with Embodiment 1.

Referring to FIG. 13, the second amorphous semiconductor film 9 is formed on those regions of the second face 2b of the semiconductor substrate 2 where the second opening 27 of the second mask 26 resides. More specifically, the second amorphous semiconductor film 9 is formed on those regions of the i-type amorphous semiconductor film 5 where the second opening 27 of the second mask 26 resides. The second amorphous semiconductor film 9 is not necessarily formed by any particular method and may be formed, for example, by plasma-enhanced chemical vapor deposition (CVD). The second mask 26 is subsequently removed.

Next, the first electrodes 11 are formed on the first amorphous semiconductor film 7, and the second electrodes 13 are formed on the second amorphous semiconductor film 9. The first electrodes 11 and the second electrodes 13 may be formed respectively on the first amorphous semiconductor film 7 and the second amorphous semiconductor film 9 using a third mask 31 having a third opening 32 shown in FIG. 14.

The third mask 31 is placed on the first amorphous semiconductor film 7 and the second amorphous semiconductor film 9. The third mask 31 has the third opening 32. The third opening 32 of the third mask 31 is divided into a plurality of sections in the first direction and the second direction that intersects the first direction.

The sections of the third opening 32 of the third mask 31 are separated in the first direction by a fifth bridge section 33 of the third mask 31. Those sections of the third opening 32 of the third mask 31 which are adjacent in the first direction are separated by a distance that is equal to the first-direction width of the fifth bridge section 33 of the third mask 31.

The sections of the third opening 32 of the third mask 31 are separated in the second direction by a sixth bridge section 34 of the third mask 31. Those sections of the third opening 32 of the third mask 31 which are adjacent in the second direction are separated by a distance $d_{5y}$ that is equal to the second-direction width of the sixth bridge section 34 of the third mask 31. The distance $d_{5y}$ separating these second-direction-wise adjacent sections of the third opening 32 of the third mask 31 may be, for example, from 30 µm to 1 mm inclusive. The second-direction width of the sixth bridge section 34 of the third mask 31 may be, for example, from 30 µm to 1 mm inclusive. The distance $d_{5y}$ separating the second-direction-wise adjacent sections of the third opening 32 of the third mask 31 may be from one thousandth to one tenth inclusive, of the second-direction length, $w_{5y}$, of each section of the third opening 32 of the third mask 31. The width of the sixth bridge section 34 of the third mask 31 may be from one thousandth to one tenth inclusive, of the second-direction length, $w_{5y}$, of each section of the third opening 32 of the third mask 31.

The distance $d_{5y}$ separating the second-direction-wise adjacent sections of the third opening 32 of the third mask 31 may be less than or equal to the diffusion length in the semiconductor substrate 2 of minority carriers generated in the semiconductor substrate 2 by the light incident on the first face 2a side of the semiconductor substrate 2. The second-direction width of the sixth bridge section 34 of the third mask 31 may be less than or equal to the diffusion length in the semiconductor substrate 2 of minority carriers generated in the semiconductor substrate 2 by the light incident on the first face 2a side of the semiconductor substrate 2.

Figure 15:
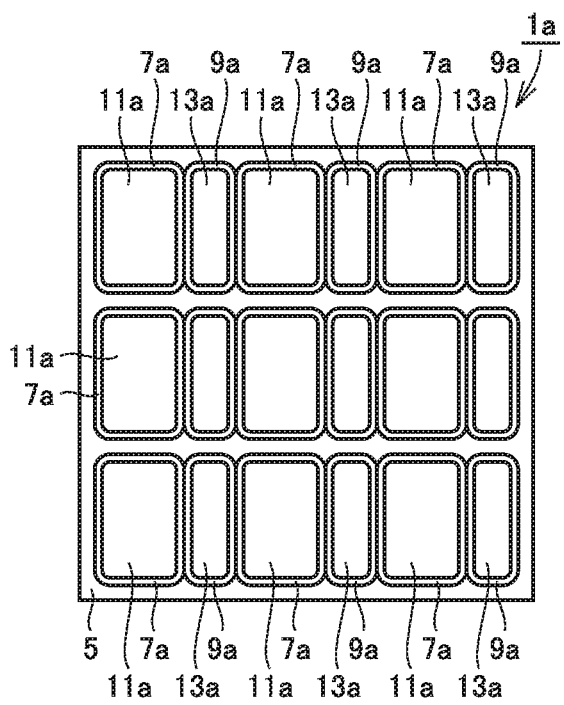
FIG. 15(A) is a schematic plan view of a photovoltaic device in accordance with Embodiment 2 as viewed from a second face side of a semiconductor substrate.
FIG. 15(B) is a schematic plan view of the photovoltaic device in accordance with Embodiment 2 as viewed from the second face side of the semiconductor substrate with first electrodes and second electrodes being omitted.
Figure 15:
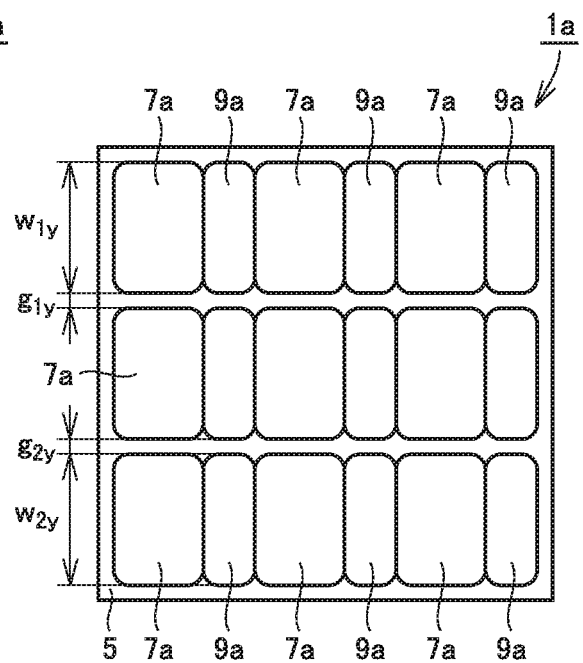
Figure 16:
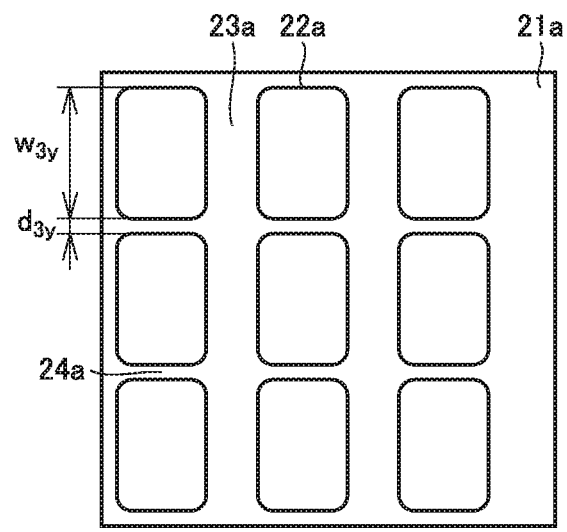
FIG. 16(A) is a schematic plan view of a first mask used in a method of manufacturing the photovoltaic device in accordance with Embodiment 2.
FIG. 16(B) is a schematic plan view of a second mask used in the method of manufacturing the photovoltaic device in accordance with Embodiment 2.
FIG. 16(C) is a schematic plan view of a third mask used in the method of manufacturing the photovoltaic device in accordance with Embodiment 2.
Figure 16:
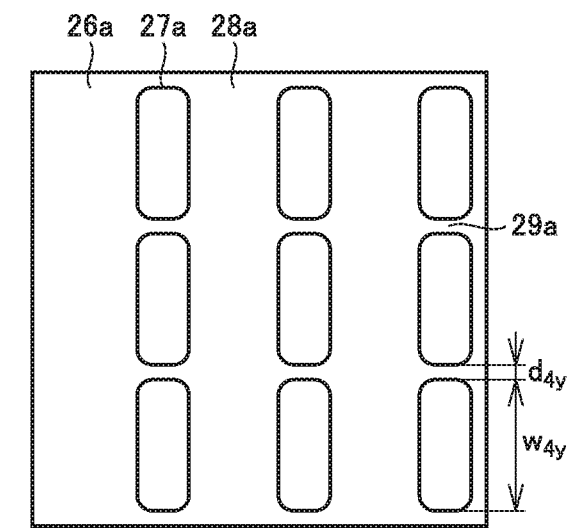
Figure 16:
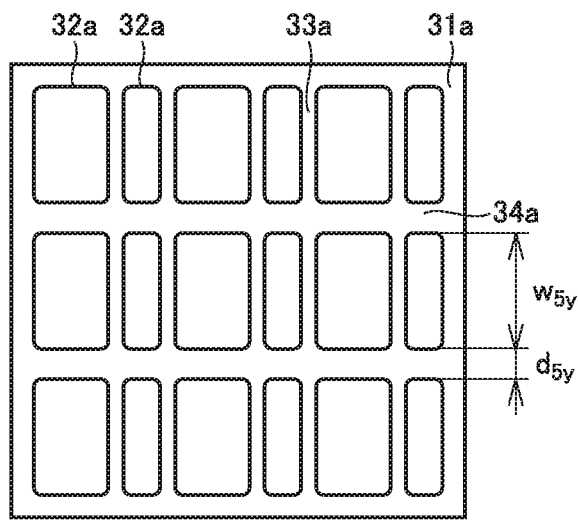
Figure 17:
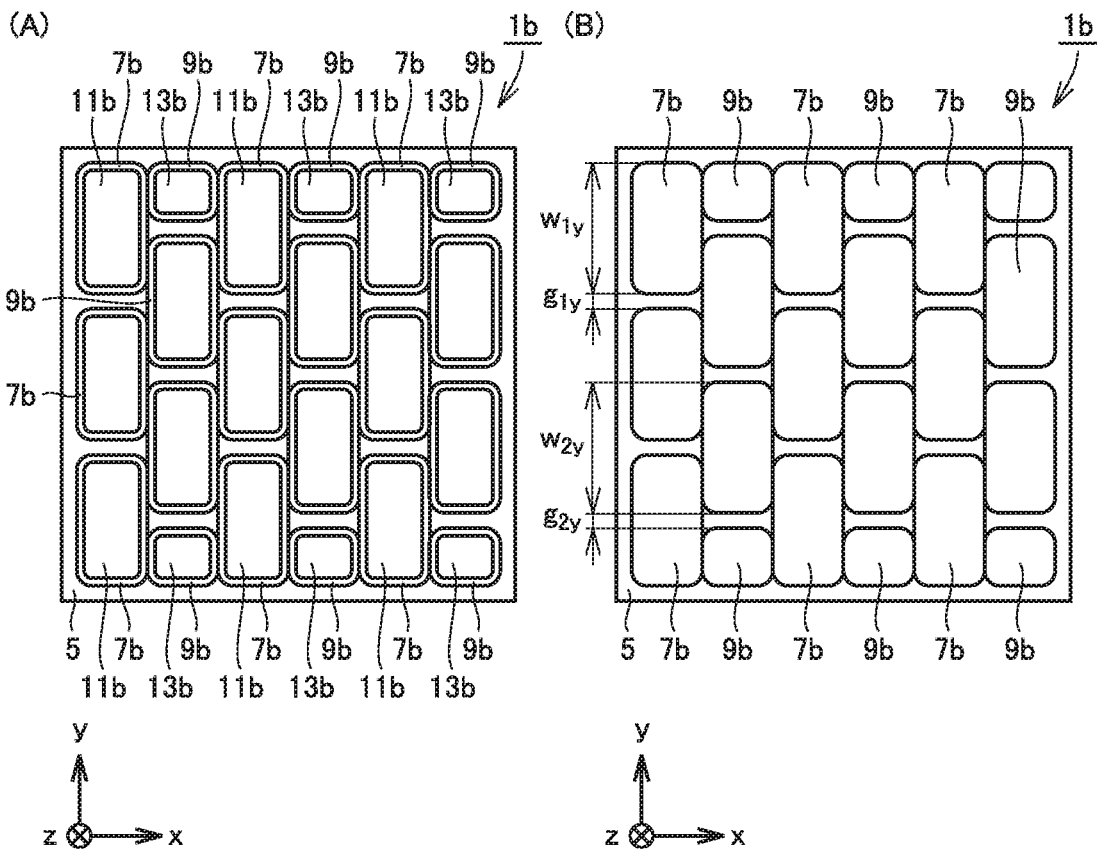
FIG. 17(A) is a schematic plan view of a photovoltaic device in accordance with Embodiment 3 as viewed from a second face side of a semiconductor substrate.
FIG. 17(B) is a schematic plan view of the photovoltaic device in accordance with Embodiment 3 as viewed from the second face side of the semiconductor substrate with first electrodes and second electrodes being omitted.
Figure 18:
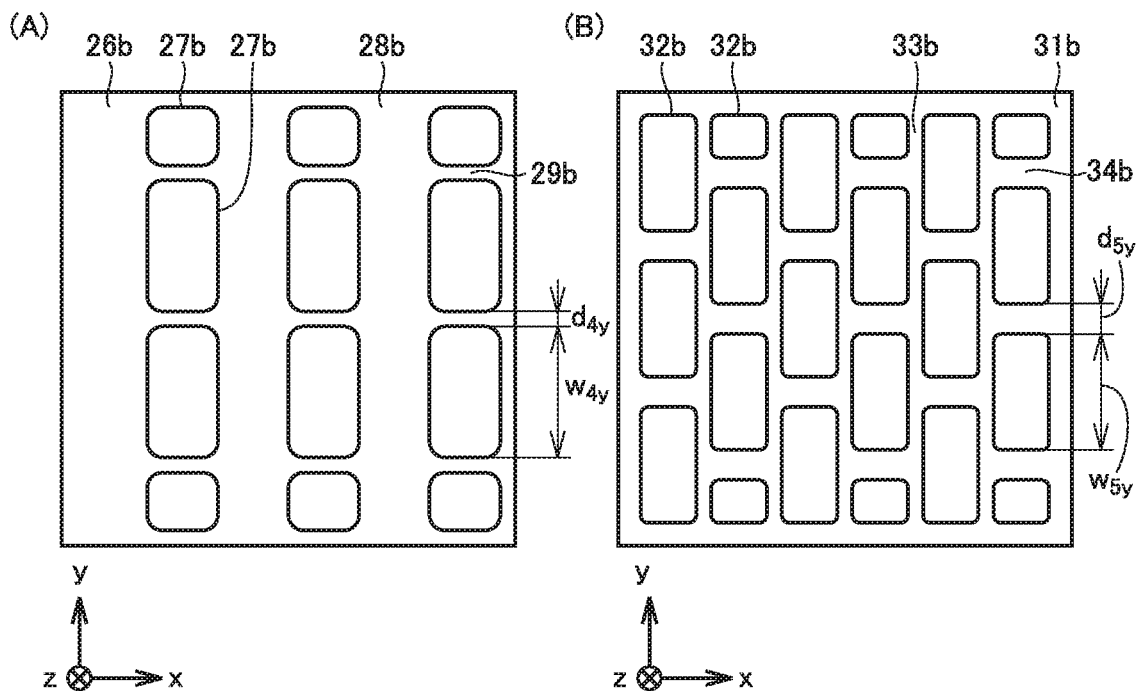
FIG. 18(A) is a schematic plan view of a second mask used in a method of manufacturing the photovoltaic device in accordance with Embodiment 3.
FIG. 18(B) is a schematic plan view of a third mask used in the method of manufacturing the photovoltaic device in accordance with Embodiment 3.
Figure 19:
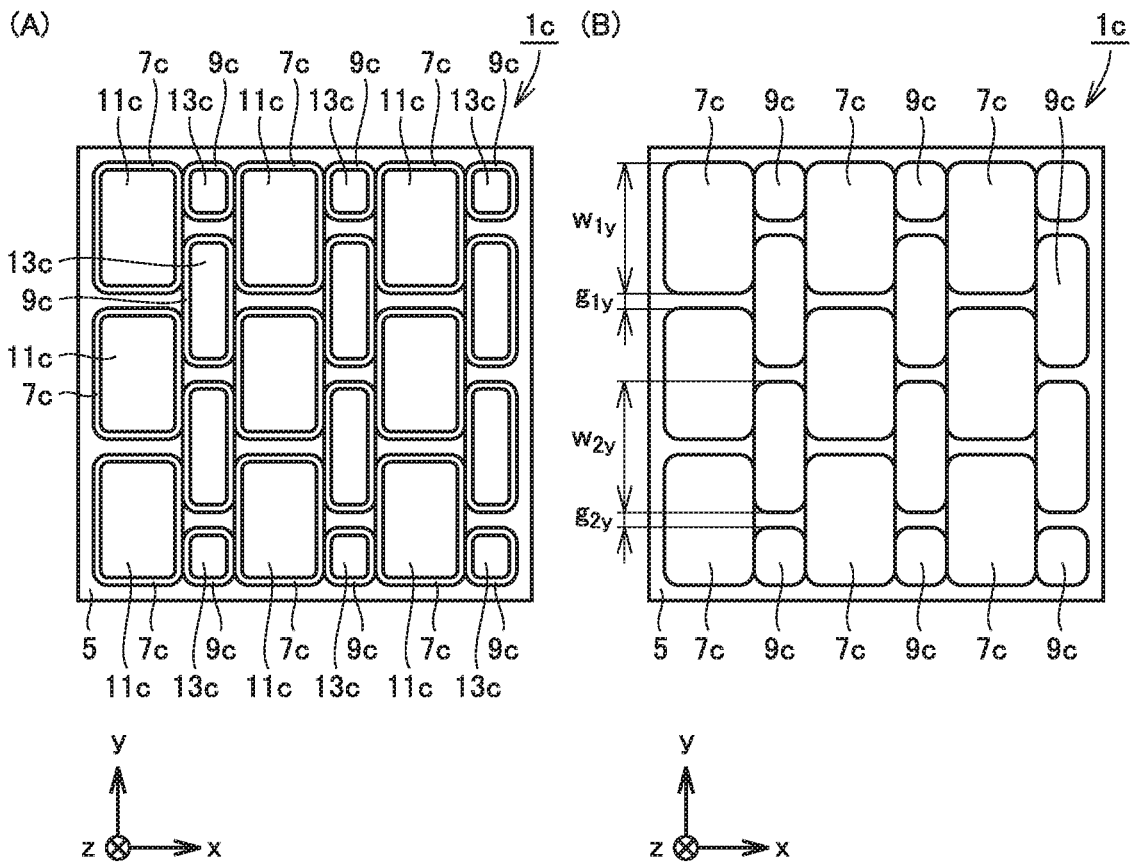
FIG. 19(A) is a schematic plan view of a photovoltaic device in accordance with Embodiment 4 as viewed from a second face side of a semiconductor substrate.
FIG. 19(B) is a schematic plan view of the photovoltaic device in accordance with Embodiment 4 as viewed from the second face side of the semiconductor substrate with first electrodes and second electrodes being omitted.
Figure 20:
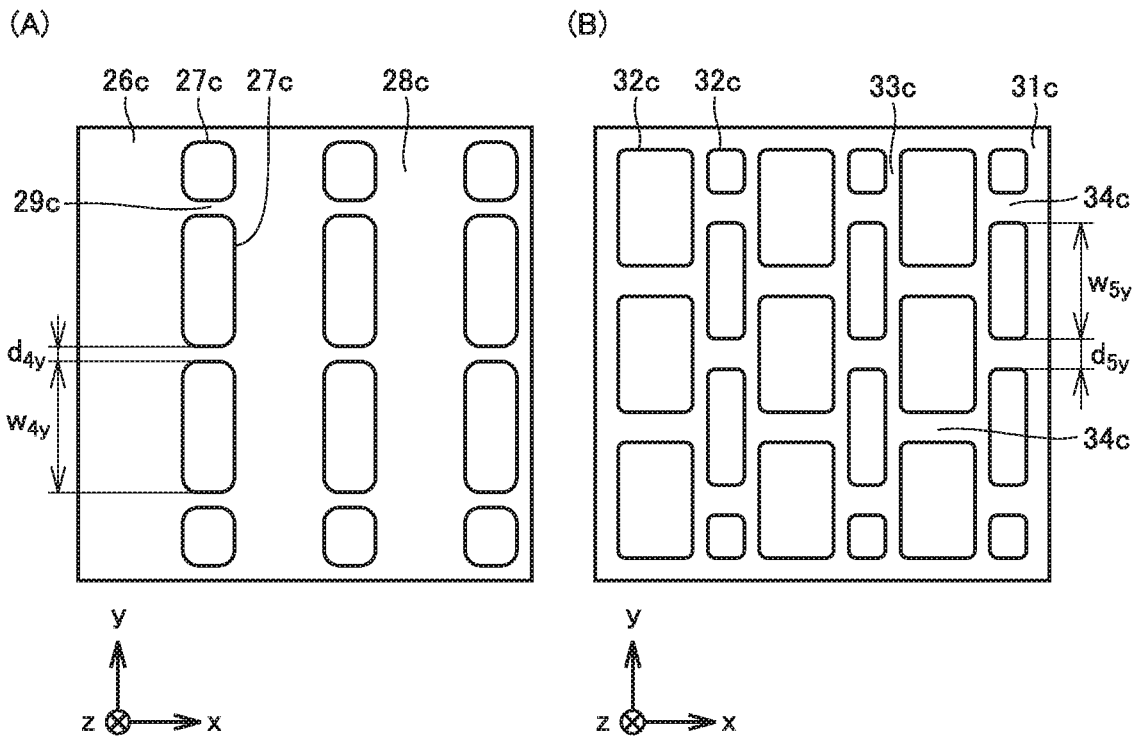
FIG. 20(A) is a schematic plan view of a second mask used in a method of manufacturing the photovoltaic device in accordance with Embodiment 4.
FIG. 20(B) is a schematic plan view a third mask used in the method of manufacturing the photovoltaic device in accordance with Embodiment 4.
Figure 21:
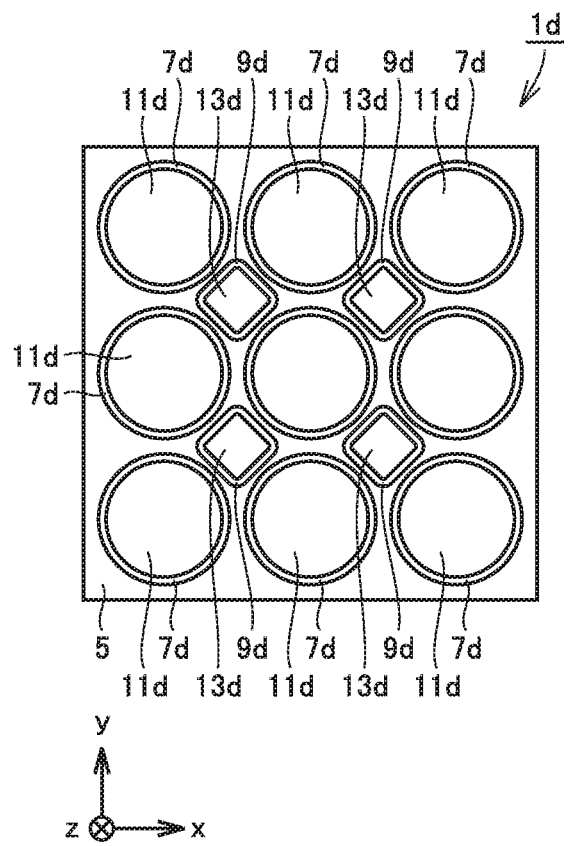
FIG. 21(A) is a schematic plan view of a photovoltaic device in accordance with Embodiment 5 as viewed from a second face side of a semiconductor substrate.
FIG. 21(B) is a schematic plan view of the photovoltaic device in accordance with Embodiment 5 as viewed from the second face side of the semiconductor substrate with first electrodes and second electrodes being omitted.
Figure 21:
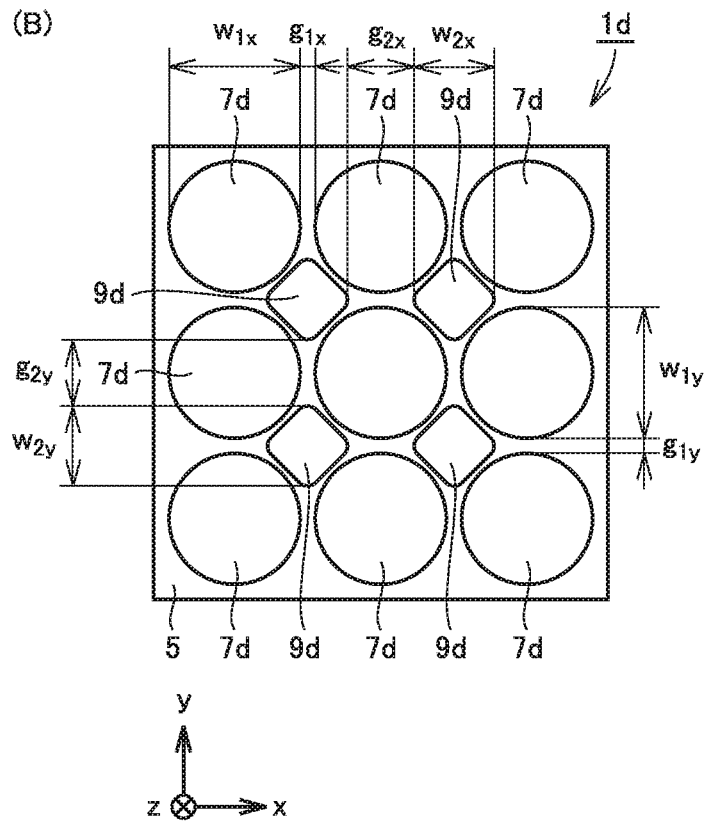
Figure 22:
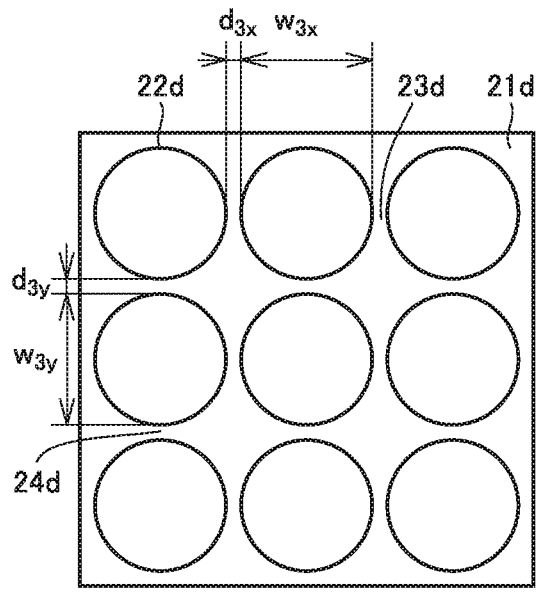
FIG. 22(A) is a schematic plan view of a first mask used in a method of manufacturing the photovoltaic device in accordance with Embodiment 5.
FIG. 22(B) is a schematic plan view of a second mask used in the method of manufacturing the photovoltaic device in accordance with Embodiment 5.
FIG. 22(C) is a schematic plan view of a third mask used in the method of manufacturing the photovoltaic device in accordance with Embodiment 5.
Figure 22:
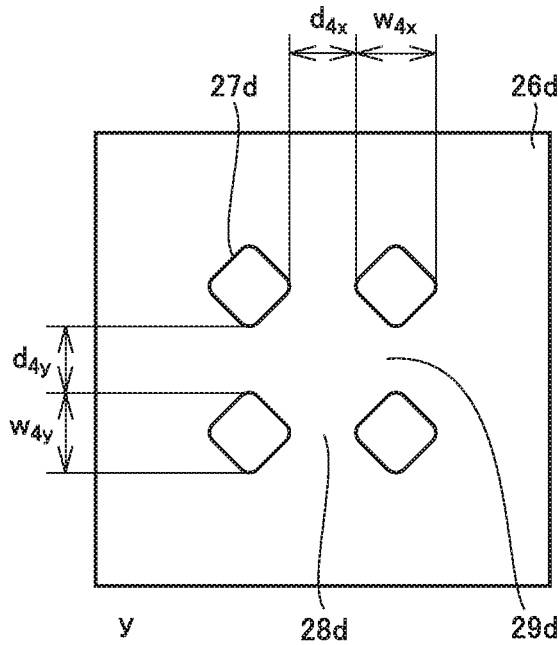
Figure 22:
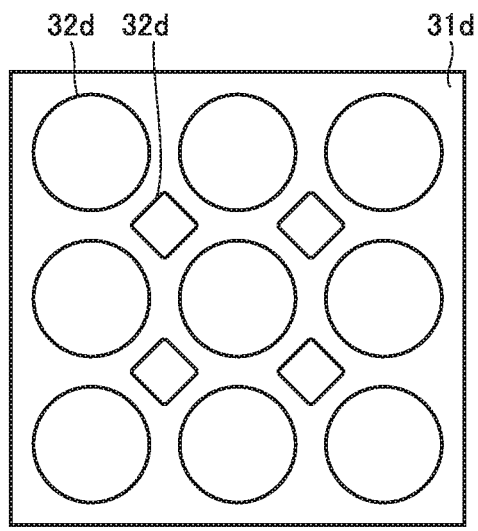

The sections of the third opening 32 of the third mask 31 in the present embodiment are arranged in a lattice pattern and may be alternatively be arranged in another pattern. Each section of the third opening 32 of the third mask 31 may have a rectangular shape with third rounded corners (see FIG. 15) and may alternatively be shaped like a circle, a polygon, or a polygon with third rounded corners. These circles and third rounded corners may have a radius of curvature of from 1 µm to 10 mm inclusive, preferably from 10 µm to 1 mm inclusive. The third mask 31 may be, for example, a metal mask.

The first electrodes 11 and the second electrodes 13 are then formed on those regions of the second face 2b of the semiconductor substrate 2 where the third opening 32 of the third mask 31 resides. Specifically, the first electrodes 11 are formed on the first amorphous semiconductor film 7, and the second electrodes 13 are formed on the second amorphous semiconductor film 9. The first electrodes 11 and the second electrodes 13 are not necessarily formed by any particular method and may be formed, for example, by sputtering. The third mask 31 is subsequently removed. That concludes the manufacture of the photovoltaic device 1 in accordance with the present embodiment shown in FIGS. 1(A) to 3.

Effects of the photovoltaic device 1 in accordance with the present embodiment and the method of manufacturing the photovoltaic device 1 will be described.

The photovoltaic device 1 in accordance with the present embodiment includes the semiconductor substrate 2, the first amorphous semiconductor film 7 of the first conductivity type, the second amorphous semiconductor film 9 of the second conductivity type that differs from the first conductivity type, the first electrodes 11, and the second electrodes 13. The semiconductor substrate 2 has the first face 2a and the second face 2b opposite the first face 2a. The semiconductor substrate 2 is a monocrystal semiconductor substrate. The semiconductor substrate 2 stretches both in the first direction and in the second direction that intersects the first direction. The first amorphous semiconductor film 7 is disposed on the second face 2b of the semiconductor substrate and divided into a plurality of sections in the first direction and the second direction. The second amorphous semiconductor film 9 is disposed on the second face 2b of the semiconductor substrate 2 and is divided into a plurality of sections in the first direction and the second direction. The first electrodes 11 are disposed respectively on these sections of the first amorphous semiconductor film 7. The second electrodes 13 are disposed respectively on these sections of the second amorphous semiconductor film 9.

In the photovoltaic device 1 in accordance with the present embodiment, the first amorphous semiconductor film 7 of the first conductivity type and the second amorphous semiconductor film 9 of the second conductivity type are divided into a plurality of sections in the second direction. The photovoltaic device 1 in accordance with the present embodiment, in the second direction, has regions where neither the first amorphous semiconductor film 7 of the first conductivity type nor the second amorphous semiconductor film 9 of the second conductivity type is formed. Therefore, the photovoltaic device 1 in accordance with the present embodiment can reduce the area of the poorly heat resistant, first amorphous semiconductor film 7 of the first conductivity type and the area of the poorly heat resistant, second amorphous semiconductor film 9 of the second conductivity type. As a result, the photovoltaic device 1 in accordance with the present embodiment exhibits an improved heat resistance.

In the photovoltaic device 1 in accordance with the present embodiment, the first electrodes 11 are separated not only in the first direction, but also in the second direction that intersects the first direction. Therefore, some of the first electrodes 11 could possibly come off the first amorphous semiconductor film 7, but the other first electrodes 11 will not come off the first amorphous semiconductor film 7. The photovoltaic device 1 in accordance with the present embodiment hence has a low defective rate. In the photovoltaic device 1 in accordance with the present embodiment, the second electrodes 13 are separated not only in the first direction, but also in the second direction that intersects the first direction. Therefore, some of the second electrodes 13 could possibly come off the second amorphous semiconductor film 9, but the other second electrodes 13 will not come off the second amorphous semiconductor film 9. The photovoltaic device 1 in accordance with the present embodiment hence has a low defective rate.

In the photovoltaic device 1 in accordance with the present embodiment, at least one of the sections of the first amorphous semiconductor film 7 and the sections of the second amorphous semiconductor film 9 may be shaped like a circle, a polygon, or a polygon with first rounded corners, when viewed from the second face 2b side of the semiconductor substrate 2. The carriers (electrons or holes) generated in the semiconductor substrate 2 by the light incident on the first face 2a side of the semiconductor substrate 2 move to the first amorphous semiconductor film 7 or the second amorphous semiconductor film 9 formed on the second face 2b of the semiconductor substrate 2. At least one of the sections of the first amorphous semiconductor film 7 and the sections of the second amorphous semiconductor film 9 is shaped like a circle, a polygon, or a polygon with first rounded corners when viewed from the second face 2b side of the semiconductor substrate 2. This structure can restrain the carriers from accumulating in a particular part of the first amorphous semiconductor film 7 or the second amorphous semiconductor film 9, thereby suppressing temperature rises in this particular part. That can in turn restrain the first amorphous semiconductor film 7 and the second amorphous semiconductor film 9 from being degraded or coming off the semiconductor substrate 2 due to a temperature rise in the first amorphous semiconductor film 7 or the second amorphous semiconductor film 9.

In the photovoltaic device 1 in accordance with the present embodiment, these circles and first rounded corners may have a radius of curvature of from 1 μm to 10 mm inclusive. This structure can restrain the carriers (electrons or holes) generated in the semiconductor substrate 2 by the light incident on the first face 2a side of the semiconductor substrate 2 from accumulating in a particular part of the first amorphous semiconductor film 7 or the second amorphous semiconductor film 9, thereby further suppressing temperature rises in this particular part. That can in turn further restrain the first amorphous semiconductor film 7 and the second amorphous semiconductor film 9 from being degraded or coming off the semiconductor substrate 2 due to a temperature rise in the first amorphous semiconductor film 7 or the second amorphous semiconductor film 9.

In the photovoltaic device 1 in accordance with the present embodiment, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 may be less than or equal to the diffusion length in the semiconductor substrate 2 of minority carriers generated in the semiconductor substrate 2 by the light incident on the first face 2a side of the semiconductor substrate 2. In this structure, the minority carriers can be efficiently collected through either the first amorphous semiconductor film 7 and the first electrodes 11 or the second amorphous semiconductor film 9 and the second electrodes 13.

In the photovoltaic device 1 in accordance with the present embodiment, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 may be from 30 μm to 1 mm inclusive. At least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 is not smaller than 30 μm. This structure can reduce the area of at least one of the poorly heat resistant, first amorphous semiconductor film 7 of the first conductivity type and the poorly heat resistant, second amorphous semiconductor film 9 of the second conductivity type. The photovoltaic device 1 in accordance with the present embodiment hence exhibits a further improved heat resistance. At least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 is not larger than 1 mm. This structure can prevent excess drop in light-energy-to-electric-energy conversion efficiency in the photovoltaic device 1.

In the photovoltaic device 1 in accordance with the present embodiment, the distance $g_{1y}$ separating the second-direction-wise adjacent sections of the first amorphous semiconductor film 7 may be from one thousandth to one tenth inclusive, of the second-direction length, $w_{1y}$, of each section of the first amorphous semiconductor film 7. The distance $g_{1y}$ separating the second-direction-wise adjacent sections of the first amorphous semiconductor film 7 is not smaller than one thousandth of the second-direction length, $w_{1y}$, of each section of the first amorphous semiconductor film 7. This structure can reduce the area of the poorly heat resistant, first amorphous semiconductor film 7 of the first conductivity type. The photovoltaic device 1 in accordance with the present embodiment hence exhibits a further improved heat resistance. The distance $g_{1y}$ separating the second-direction-wise adjacent sections of the first amorphous semiconductor film 7 is not larger than one tenth of the second-direction length, $w_{1y}$, of each section of the first amorphous semiconductor film 7. This structure can prevent excess drop in light-energy-to-electric-energy conversion efficiency in the photovoltaic device 1.

In the photovoltaic device 1 in accordance with the present embodiment, the distance $g_{2y}$ separating the second-direction-wise adjacent sections of the second amorphous semiconductor film 9 may be from one thousandth to one tenth inclusive, of the second-direction length, $w_{2y}$, of each section of the second amorphous semiconductor film 9. The distance $g_{2y}$ separating the second-direction-wise adjacent sections of the second amorphous semiconductor film 9 is not smaller than one thousandth of the second-direction length, $w_{2y}$, of each section of the second amorphous semiconductor film 9. This structure can reduce the area of the poorly heat resistant, second amorphous semiconductor film 9 of the second conductivity type. The photovoltaic device 1 in accordance with the present embodiment hence exhibits a further improved heat resistance. The distance $g_{2y}$ separating the second-direction-wise adjacent sections of the second amorphous semiconductor film 9 is not larger than one tenth of the second-direction length, $w_{2y}$, of each section of the second amorphous semiconductor film 9. This structure can prevent excess drop in light-energy-to-electric-energy conversion efficiency in the photovoltaic device 1.

The photovoltaic device 1 in accordance with the present embodiment may further include the i-type amorphous semiconductor film 5 between the semiconductor substrate 2 and the first amorphous semiconductor film 7 and between the semiconductor substrate 2 and the second amorphous semiconductor film 9. The i-type amorphous semiconductor film 5 can limit recombination of carriers (electrons or holes) generated in the semiconductor substrate 2 by the light incident on the first face 2a side of the semiconductor substrate 2. The photovoltaic device 1 in accordance with the present embodiment can hence further improve the light-energy-to-electric-energy conversion efficiency.

The method of manufacturing the photovoltaic device 1 in accordance with the present embodiment includes the following steps. The first amorphous semiconductor film 7 of the first conductivity type is formed on the second face 2b of the semiconductor substrate 2 using the first mask 21, the semiconductor substrate 2 having the first face 2a and the second face 2b opposite the first face 2a. The semiconductor substrate 2 is a monocrystal semiconductor substrate and stretches in the first direction and the second direction that intersects the first direction. The first mask 21 includes the first bridge section 23, the second bridge section 24, and the first opening 22. The first opening 22 is, in the first direction, divided into a plurality of sections by the first bridge section 23. The first opening 22 is, in the second direction, divided into a plurality of sections by the second bridge section 24. The second amorphous semiconductor film 9 of the second conductivity type that differs from the first conductivity type is formed on the second lace 2*b* of the semiconductor substrate 2, using the second mask 26 having the third bridge section 28, the fourth bridge section 29, and the second opening 27. The second opening 27 is, in the first direction, divided into a plurality of sections by the third bridge section 28. The second opening 27 is, in the second direction, divided into a plurality of sections by the fourth bridge section 29. The first electrodes 11 are formed respectively on the sections of the first amorphous semiconductor film 7. The second electrodes 13 are formed respectively on the sections of the second amorphous semiconductor film 9.

According to the method of manufacturing the photovoltaic device 1 in accordance with the present embodiment, the first amorphous semiconductor film 7 and the second amorphous semiconductor film 9 are, in the second direction, divided into a plurality of sections. According to the method of manufacturing the photovoltaic device 1 in accordance with the present embodiment, the resultant photovoltaic device 1, in the second direction, has regions where neither the first amorphous semiconductor film 7 of the first conductivity type nor the second amorphous semiconductor film 9 of the second conductivity type is formed. Therefore, the method can reduce the area of the poorly heat resistant, first amorphous semiconductor film 7 of the first conductivity type and the area of the poorly heat resistant, second amorphous semiconductor film 9 of the second conductivity type. According to the method of manufacturing the photovoltaic device 1 in accordance with the present embodiment, the resultant photovoltaic device 1 exhibits an improved heat resistance.

According to the method of manufacturing the photovoltaic device 1 in accordance with the present embodiment, the first electrodes 11 are separated not only in the first direction, but also in the second direction that intersects the first direction. Therefore, some of the first electrodes 11 could possibly come off the first amorphous semiconductor film 7, but the other first electrodes 11 will not come off the first amorphous semiconductor film 7. According to the method of manufacturing the photovoltaic device 1 in accordance with the present embodiment, the photovoltaic device 1 can hence be manufactured at an improved non-defective product rate. According to the method of manufacturing the photovoltaic device 1 in accordance with the present embodiment, the second electrodes 13 are separated not only in the first direction, but also in the second direction that intersects the first direction. Therefore, some of the second electrodes 13 could possibly come off the second amorphous semiconductor film 9, but the other second electrodes 13 will not come off the second amorphous semiconductor film 9. According to the method of manufacturing the photovoltaic device 1 in accordance with the present embodiment, the photovoltaic device 1 can hence be manufactured at an improved non-defective product rate.

According to the method of manufacturing the photovoltaic device 1 in accordance with the present embodiment, the sections of the first amorphous semiconductor film 7 are formed using the first mask 21 having the first bridge section 23, the second bridge section 24, and the first opening 22. The first mask 21 has the first bridge section 23 as well as the second bridge section 24, and both the first bridge section 23 and the second bridge section 24 can impart improved mechanical strength to the first mask 21. This structure can restrain the first mask 21 from warping, thereby rendering the first opening 22 less likely to deform, when the first amorphous semiconductor film 7 is formed using the first mask 21. According to the method of manufacturing the photovoltaic device 1 in accordance with the present embodiment, the first amorphous semiconductor film 7 can hence be formed in a more accurate pattern. According to the method of manufacturing the photovoltaic device 1 in accordance with the present embodiment, the sections of the second amorphous semiconductor film 9 are formed using the second mask 26 having the third bridge section 28, the fourth bridge section 29, and the second opening 27. The second mask 26 has not only the third bridge section 28, but also the fourth bridge section 29, and both the third bridge section 28 and the fourth bridge section 29 can impart improved mechanical strength to the second mask 26. This structure can restrain the second mask 26 from warping, thereby rendering the second opening 27 less likely to deform, when the second amorphous semiconductor film 9 is formed using the second mask 26. According to the method of manufacturing the photovoltaic device 1 in accordance with the present embodiment, the second amorphous semiconductor film 9 can hence be formed in a more accurate pattern.

In the method of manufacturing the photovoltaic device 1 in accordance with the present embodiment, at least one of the sections of the first opening 22 of the first mask 21 and the sections of the second opening 27 of the second mask 26 may be shaped like a circle, a polygon, or a polygon with rounded corners. According to the method of manufacturing the photovoltaic device 1 in accordance with the present embodiment, the resultant photovoltaic device 1 includes the first amorphous semiconductor film 7 and the second amorphous semiconductor film 9 in which at least one of the sections of the first amorphous semiconductor film 7 and the sections of the second amorphous semiconductor film 9 is shaped like a circle, a polygon, or a polygon with rounded corners when viewed from the second face 2*b* side of the semiconductor substrate 2. The carriers (electrons or holes) generated in the semiconductor substrate 2 by the light incident on the first face 2*a* side of the semiconductor substrate 2 move to the first amorphous semiconductor film 7 or the second amorphous semiconductor film 9 formed on the second face 2*b* of the semiconductor substrate 2. At least one of the sections of the first amorphous semiconductor film 7 and the sections of the second amorphous semiconductor film 9 is shaped like a circle, a polygon, or a polygon with rounded corners when viewed from the second face 2*b* side of the semiconductor substrate 2. This structure can restrain the carriers from accumulating in a particular part of the first amorphous semiconductor film 7 or the second amorphous semiconductor film 9, thereby suppressing temperature rises in this particular part. That can in turn restrain the first amorphous semiconductor film 7 and the second amorphous semiconductor film 9 from being degraded or coming off the semiconductor substrate 2 due to a temperature rise in the first amorphous semiconductor film 7 or the second amorphous semiconductor film 9.

In the method of manufacturing the photovoltaic device 1 in accordance with the present embodiment, these circles and rounded corners may have a radius of curvature of from 1 μm to 10 mm inclusive. This structure can restrain the carriers (electrons or holes) generated in the semiconductor substrate 2 by the light incident on the first face 2*a* side of the semiconductor substrate 2 from accumulating in a particular part, of the first amorphous semiconductor film 7 or the second amorphous semiconductor film 9, thereby further suppressing temperature rises in this particular part. That can in turn further restrain the first amorphous semiconductor film 7 and the second amorphous semiconductor film 9 from being degraded or coming off the semiconductor substrate 2 due to a temperature rise in the first amorphous semiconductor film 7 or the second amorphous semiconductor film 9.

In the method of manufacturing the photovoltaic device 1 in accordance with the present embodiment, at least one of the second-direction width of the second bridge section 24 of the first mask 21 and the second-direction width of the fourth bridge section 29 of the second mask 26 may be less than or equal to the diffusion length in the semiconductor substrate of minority carriers generated in the semiconductor substrate by the light incident on the first face side of the semiconductor substrate. By using at least one of the first mask 21 and the second mask 26, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 can be rendered less than or equal to the diffusion length in the semiconductor substrate 2 of minority carriers generated in the semiconductor substrate 2 by the light incident on the first face 2a side of the semiconductor substrate 2. According to the method of manufacturing the photovoltaic device 1 in accordance with the present embodiment, the minority carriers can hence be efficiently collected through either the first amorphous semiconductor film 7 and the first electrodes 11 or the second amorphous semiconductor film 9 and the second electrodes 13.

In the method of manufacturing the photovoltaic device 1 in accordance with the present embodiment, at least one of the second-direction width of the second bridge section 24 of the first mask 21 and the second-direction width of the fourth bridge section 29 of the second mask 26 may be from 30 μm to 1 mm inclusive. By using at least one of the first mask and the second mask 26, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 can be rendered not smaller than 30 μm. This structure can reduce the area of at least one of the poorly heat resistant, first amorphous semiconductor film 7 of the first conductivity type and the poorly heat resistant, second amorphous semiconductor film 9 of the second conductivity type. According to the method of manufacturing the photovoltaic device 1 in accordance with the present embodiment, the resultant photovoltaic device 1 hence exhibits a further improved heat resistance. In addition, at least one of the second-direction width of the second bridge section 24 of the first mask 21 and the second-direction width of the fourth bridge section 29 of the second mask 26 is not smaller than 30 μm. This structure can impart further improved mechanical strength to at least one of the first mask 21 and the second mask 26. That can in turn further restrain at least one of the first mask 21 and the second mask 26 from warping, thereby rendering at least one of the first opening 22 and the second opening 27 even less likely to deform, when at least one of the first amorphous semiconductor film 7 and the second amorphous semiconductor film 9 is formed using at least one of the first mask 21 and the second mask 26. At least one of the first amorphous semiconductor film 7 and the second amorphous semiconductor film 9 can hence be formed in a more accurate pattern. Furthermore, by using at least one of the first mask 21 and the second mask 26, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 can be rendered not larger than 1 mm. The method of manufacturing the photovoltaic device 1 in accordance with the present embodiment can hence prevent excess drop in light-energy-to-electric-energy conversion efficiency in the photovoltaic device 1.

In the method of manufacturing the photovoltaic device 1 in accordance with the present embodiment, the second-direction width of the second bridge section 24 of the first mask 21 may be from one thousandth to one tenth inclusive, of the second-direction length, $w_{3y}$, of each section of the first opening 22 of the first mask 21. By using the first mask 21, the distance $g_{1y}$ separating the second-direction-wise adjacent sections of the first amorphous semiconductor film 7 can be rendered not smaller than one thousandth of the second-direction length, $w_{1y}$, of each section of the first amorphous semiconductor film 7. This structure can reduce the area of the poorly heat resistant, first amorphous semiconductor film 7 of the first conductivity type. According to the method of manufacturing the photovoltaic device 1 in accordance with the present embodiment, the resultant photovoltaic device 1 hence exhibits a further improved heat resistance. Additionally, the second-direction width of the second bridge section 24 of the first mask 21 is not smaller than one thousandth of the second-direction length, $w_{3y}$, of each section of the first opening 22 of the first mask 21. This structure can impart further improved mechanical strength to the first mask 21. The structure can further restrain the first mask 21 from warping, thereby rendering the first opening 22 even less likely to deform, when the first amorphous semiconductor film 7 is formed using the first mask 21. According to the method of manufacturing the photovoltaic device 1 in accordance with the present embodiment, the first amorphous semiconductor film 7 can hence be formed in a more accurate pattern. Furthermore, by using the first mask 21, the distance $g_{1y}$ separating the second-direction-wise adjacent sections of the first amorphous semiconductor film 7 can be rendered not larger than one tenth of the second-direction length, $w_{1y}$, of each section of the first amorphous semiconductor film 7. The method of manufacturing the photovoltaic device 1 in accordance with the present embodiment can hence prevent excess drop in light-energy-to-electric-energy conversion efficiency in the photovoltaic device 1.

In the method of manufacturing the photovoltaic device 1 in accordance with the present embodiment, the second-direction width of the fourth bridge section 29 of the second mask 26 may be from one thousandth to one tenth inclusive, of the second-direction length, $w_{4y}$, of each section of the second opening 27 of the second mask 26. By using the second mask 26, the distance $g_{2y}$ separating the second-direction-wise adjacent sections of the second amorphous semiconductor film 9 can be rendered not smaller than one thousandth of the second-direction length, $w_{2y}$, of each section of the second amorphous semiconductor film 9. This structure can reduce the area of the poorly heat resistant, second amorphous semiconductor film 9 of the second conductivity type. According to the method of manufacturing the photovoltaic device 1 in accordance with the present embodiment, the resultant photovoltaic device 1 hence exhibits a further improved heat resistance. In addition, the second-direction width of the fourth bridge section 29 of the second mask 26 is not smaller than one thousandth of the second-direction length, $w_{4y}$, of each section of the second opening 27 of the second mask 26. This structure can impart further improved mechanical strength to the second mask 26. That can in turn further restrain the second mask 26 from warping, thereby rendering the second opening 27 even less likely to deform, when the second amorphous semiconductor film 9 is formed using the second mask 26. According to the method of manufacturing the photovoltaic device 1 in accordance with the present embodiment, the second amorphous semiconductor film 9 can hence be formed in a more accurate pattern. Additionally, by using the second mask 26, the distance $g_{2y}$, separating the second-direction-wise adjacent sections of the second amorphous semiconductor film 9 can be rendered not larger than one tenth of the second-direction length, $w_{2y}$, of each section of the second amorphous semiconductor film 9. The method of manufacturing the photovoltaic device 1 in accordance with the present embodiment can hence prevent excess drop in light-energy-to-electric-energy conversion efficiency in the photovoltaic device 1.

In the method of manufacturing the photovoltaic device in accordance with the present embodiment, the i-type amorphous semiconductor film 5 may be further formed between the semiconductor substrate 2 and the first amorphous semiconductor film 7 and between the semiconductor substrate 2 and the second amorphous semiconductor film 9. The i-type amorphous semiconductor film 5 can limit recombination of carriers (electrons or holes) generated in the semiconductor substrate 2 by the light incident on the first face 2a side of the semiconductor substrate 2. The method of manufacturing the photovoltaic device 1 in accordance with the present embodiment can hence further improve light-energy-to-electric-energy conversion efficiency in the photovoltaic device 1.

As a first variation example of the present embodiment, an n-type monocrystal silicon substrate, an n-type amorphous semiconductor film, and a p-type amorphous semiconductor film may be used respectively as the semiconductor substrate 2, the first amorphous semiconductor film 7, and the second amorphous semiconductor film 9. As a second variation example of the present embodiment, a p-type monocrystal silicon substrate, a p-type amorphous semiconductor film, and an n-type amorphous semiconductor film may be used respectively as the semiconductor substrate 2, the first amorphous semiconductor film 7, and the second amorphous semiconductor film 9. As a third variation example of the present embodiment, a p-type monocrystal silicon substrate, an n-type amorphous semiconductor film, and a p-type amorphous semiconductor film may be used respectively as the semiconductor substrate 2, the first amorphous semiconductor film 7, and the second amorphous semiconductor film 9.

Embodiment 2

A photovoltaic device 1a and a method of manufacturing the photovoltaic device 1a will be described in accordance with Embodiment 2 in reference to FIGS. 15(A) to 16(C). The photovoltaic device 1a in accordance with the present embodiment basically has the same configuration and achieves the same effects as the photovoltaic device 1 in accordance with Embodiment 1 shown in FIGS. 1 to 3, and differs in the areas of a first amorphous semiconductor film 7a, a second amorphous semiconductor film 9a, first electrodes 11a, and second electrodes 13a.

Referring to FIGS. 15(A) and 15(B), the first amorphous semiconductor film 7a has a larger area than the second amorphous semiconductor film 9a when the photovoltaic device 1a in accordance with the present embodiment is viewed from the second face 2b side of the semiconductor substrate 2. Specifically, the sections of the first amorphous semiconductor film 7a have a larger area than the sections of the second amorphous semiconductor film 9a when viewed from the second face 2b side of the semiconductor substrate 2. More specifically, the sections of the first amorphous semiconductor film 7a have a larger first-direction length than the sections of the second amorphous semiconductor film 9a. Also, the first electrodes 11a have a larger area than the second electrodes 13a when viewed from the second face 2b side of the semiconductor substrate 2. Specifically, the first electrodes 11a have a larger first-direction length than the second electrodes 13a.

An exemplary method of manufacturing the photovoltaic device 1a in accordance with the present embodiment basically includes the same steps and achieves the same effects as the method of manufacturing the photovoltaic device 1 in accordance with Embodiment 1 shown in FIGS. 4 to 14, and differs in the area of a first opening 22a of a first mask 21a, the area of a second opening 27a of a second mask 26a, and the area of a third opening 32a of a third mask 31a. The first amorphous semiconductor film 7a is formed using the first mask 21a shown in FIG. 16(A). The second amorphous semiconductor film 9a is formed using the second mask 26a shown in FIG. 16(B). The first electrodes 11a and the second electrodes 13a are formed using the third mask 31a shown in FIG. 16(C).

Referring to FIGS. 16(A) and 16(B), the first opening 22a of the first mask 21a has a larger area than the second opening 27a of the second mask 26a. Specifically, the sections of the first opening 22a of the first mask 21a have a larger area than the sections of the second opening 27a of the second mask 26a. More specifically, the sections of the first opening 22a of the first mask 21a have a larger first-direction length than the sections of the second opening 27a of the second mask 26a. The sections of the first opening 22a are separated in the first direction by a first bridge section 23a and in the second direction by a second bridge section 24a. The sections of the second opening 27a are separated in the first direction by a third bridge section 28a and in the second direction by a fourth bridge section 29a. In addition, referring to FIG. 16(C), that third opening 32a of the third mask 31a which corresponds to the first electrodes 11a has a larger area than that third opening 32a of the third mask 31a which corresponds to the second electrodes 13a. Specifically, those sections of the third opening 32a which correspond to the first electrodes 11a have a larger area than those sections of the third opening 32a which correspond to the second electrodes 13a. More specifically, those sections of the third opening 32a which correspond to the first electrodes 11a have a larger first-direction length than those sections of the third opening 32a which correspond to the second electrodes 13a. The sections of the third opening 32a are separated in the first direction by a fifth bridge section 33a and in the second direction by a sixth bridge section 34a.

Effects of the photovoltaic device 1a in accordance with the present embodiment will be described. The photovoltaic device 1a in accordance with the present embodiment allows the area ratio of the first amorphous semiconductor film 7a to the semiconductor substrate 2 and the area ratio of the second amorphous semiconductor film 9a to the semiconductor substrate 2 to be freely altered. As an example, electric current collection in the photovoltaic device 1a can be improved by increasing the proportion of the area of the first amorphous semiconductor film 7a which is composed of a p-type amorphous silicon film to the area of the semiconductor substrate 2 which is composed of an n-type monocrystal semiconductor substrate, as viewed from the second face 2b side of the semiconductor substrate 2. On the other hand, passivation characteristics in the photovoltaic device 1a can be improved by increasing the proportion of the area of the second amorphous semiconductor film 9a which is composed of an n-type amorphous silicon film to the area of the semiconductor substrate 2 which is composed of an n-type monocrystal semiconductor substrate, as viewed from the second face 2b side of the semiconductor substrate 2. The photovoltaic device 1a in accordance with the present embodiment thus allows for greater freedom design.

Effects of the method of manufacturing the photovoltaic device 1a in accordance with the present embodiment will be described. The method of manufacturing the photovoltaic device 1a in accordance with the present embodiment allows the area ratio of the first amorphous semiconductor film 7a to the semiconductor substrate 2 and the area ratio of the second amorphous semiconductor film 9a to the semiconductor substrate 2 to be freely altered. As an example, electric current collection in the photovoltaic device 1a can be improved by increasing the proportion of the area of the p-type, first amorphous semiconductor film 7a to the area of the semiconductor substrate 2 which is composed of an n-type monocrystal semiconductor substrate, as viewed from the second face 2b side of the semiconductor substrate 2. On the other hand, passivation characteristics n the photovoltaic device 1a can be improved by increasing the proportion of the area of the n-type, second amorphous semiconductor film 9a to the area of the semiconductor substrate 2 which is composed of an n-type monocrystal semiconductor substrate, as viewed from the second face 2b side of the semiconductor substrate 2. The method of manufacturing the photovoltaic device 1a in accordance with the present embodiment thus allows for greater freedom in the design of the photovoltaic device 1a.

Embodiment 3

A photovoltaic device 1b and a method of manufacturing the photovoltaic device 1b will be described in accordance with Embodiment 3 in reference to FIGS. 9 and 17(A) to 18(B). The photovoltaic device 1b in accordance with the present embodiment basically has the same configuration and achieves the same effects as the photovoltaic device 1 in accordance with Embodiment 1 shown in FIGS. 1 to 3, and differs in the arrangement pattern of a first amorphous semiconductor film 7b and a second amorphous semiconductor film 9b and the arrangement pattern of first electrodes 11b and second electrodes 13b.

Referring to FIGS. 17(A) and 17(B), the first amorphous semiconductor film 7b and the second amorphous semiconductor film 9b are arranged in a zigzag pattern in the photovoltaic device 1b in accordance with the present embodiment, when viewed from the second face 2b side of the semiconductor substrate 2. The first electrodes 11b and the second electrodes 13b are arranged in a zigzag pattern. The first amorphous semiconductor film 7b and the second amorphous semiconductor film 9b are not necessarily arranged in a zigzag pattern, and neither are the first electrodes 11b and the second electrodes 13b.

An exemplary method of manufacturing the photovoltaic device 1b in accordance with the present embodiment basically includes the same steps and achieves the same effects as the method of manufacturing the photovoltaic device 1 in accordance with Embodiment 1 shown in FIGS. 4 to 14, and differs in the pattern of a second opening 27b of a second mask 26b and the pattern of a third opening 32b of a third mask 31b. The first amorphous semiconductor film 7b is formed using the first mask 21 shown in FIG. 9. The second amorphous semiconductor film 9b is formed using the second mask 26b shown in FIG. 18(A). The first electrodes 11b and the second electrodes 13b are formed using the third mask 31b shown in FIG. 18(B).

Referring to FIG. 18(A), the second opening 27b of the second mask 26b has a pattern in which the second opening 27 of the second mask 26 of Embodiment 1 is shifted by half a cycle in the second direction and also in which the first opening 22 of the first mask 21 is shifted by half a cycle in the first and second directions. The second opening 27b is divided into a plurality of sections that is separated in the first direction by a third bridge section 28b and in the second direction by a fourth bridge section 29b. Referring to FIG. 18(B), that third opening 32b of the third mask 31b which corresponds to the first electrodes 11b in the present embodiment has the same pattern as that third opening 32 of the third mask 31 which corresponds to the first electrodes 11 of Embodiment 1. In addition, that third opening 32b of the third mask 31b which corresponds to the second electrodes 13b in the present embodiment has a pattern in which that third opening 32 of the third mask 31 which corresponds to the second electrodes 13 of Embodiment 1 is shifted by half a cycle in the second direction. The third opening 32b is divided into a plurality of sections that is separated in the first direction by a fifth bridge section 33b and in the second direction by a sixth bridge section 34b.

The photovoltaic device 1b in accordance with the present embodiment enables the first amorphous semiconductor film 7b and the second amorphous semiconductor film 9b, as well as the first electrodes 11b and the second electrodes 13b, to be arranged in a zigzag or any other pattern as viewed from the second face 2b side of the semiconductor substrate 2. The photovoltaic device 1b in accordance with the present embodiment thus allows for greater freedom in design.

The method of manufacturing the photovoltaic device 1b in accordance with the present embodiment enables the first amorphous semiconductor film 7b and the second amorphous semiconductor film 9b, as well as the first electrodes 11b and the second electrodes 13b, to be arranged in a zigzag or any other pattern as viewed from the second face 2b side of the semiconductor substrate 2. The method of manufacturing the photovoltaic device 1b in accordance with the present embodiment thus allows for greater freedom in the design of the photovoltaic device 1b.

Embodiment 4

A photovoltaic device 1c and a method of manufacturing the photovoltaic device 1c will be described in accordance with Embodiment 4 in reference to FIG. 16(A) and FIGS. 19(A) to 20(B). The photovoltaic device 1c in accordance with the present embodiment basically has the same configuration and achieves the same effects as the photovoltaic device 1a in accordance with Embodiment 2 shown in FIGS. 15(A) to 16(B), and differs in the arrangement pattern of a first amorphous semiconductor film 7c and a second amorphous semiconductor film 9c and the arrangement pattern of first electrodes 11c and second electrodes 13c.

Referring to FIGS. 19(A) and 19(B), the first amorphous semiconductor film 7c and the second amorphous semiconductor film 9c are arranged in a zigzag pattern in the photovoltaic device 1c in accordance with the present embodiment, when viewed from the second face 2b side of the semiconductor substrate 2. The first electrodes 11c and the second electrodes 13c are arranged in a zigzag pattern. The first amorphous semiconductor film 7c and the second amorphous semiconductor film 9c are not necessarily arranged in a zigzag pattern, and neither are the first electrodes lie and the second electrodes 13c.

An exemplary method of manufacturing the photovoltaic device 1c in accordance with the present embodiment basically includes the same steps and achieves the same effects as the method of manufacturing the photovoltaic device 1a in accordance with Embodiment 2, and differs in the pattern of a second opening 27c of a second mask 26c and the pattern of a third opening 32c of the third mask 31c. The first amorphous semiconductor film 7c is formed using the first mask 21a shown in FIG. 16(A). The second amorphous semiconductor film 9c is formed using the second mask 26c shown in FIG. 20(A). The first electrodes 11c and the second electrodes 13c are formed using the third mask 31c shown in FIG. 20(B).

Referring to FIG. 20(A), the second opening 27c of the second mask 26c has a pattern in which the second opening 27a of the second mask 26a of Embodiment 2 is shifted by half a cycle in the second direction. The second opening 27c is divided into a plurality of sections that is separated in the first direction by a third bridge section 28c and in the second direction by a fourth bridge section 29c. Referring to FIG. 20(B), that third opening 32c of the third mask 31c which corresponds to the second electrodes 13c has a pattern in which that third opening 32a of the third mask 31a which corresponds to the second electrodes 13a of Embodiment 2 is shifted by half a cycle in the second direction. The third opening 32c is divided into a plurality of sections that is separated in the first direction by a fifth bridge section 33c and in the second direction by a sixth bridge section 34c.

The photovoltaic device 1c in accordance with the present embodiment enables the first amorphous semiconductor film 7c and the second amorphous semiconductor film 9c, as well as the first electrodes 11c and the second electrodes 13c, to be arranged in a zigzag or any other pattern as viewed from the second face 2b side of the semiconductor substrate 2. The photovoltaic device 1c in accordance with the present embodiment thus allows for greater freedom in design.

The method of manufacturing the photovoltaic device 1c in accordance with the present embodiment enables the first amorphous semiconductor film 7c and the second amorphous semiconductor film 9c, as well as the first electrodes 11c and the second electrodes 13c, to be arranged in a zigzag or any other pattern as viewed from the second face 2b side of the semiconductor substrate 2. The method of manufacturing the photovoltaic device 1c in accordance with the present embodiment thus allows for greater freedom in the design of the photovoltaic device 1c.

Embodiment 5

A photovoltaic device 1d and a method of manufacturing the photovoltaic device 1d will be described in accordance with Embodiment 5 in reference to FIGS. 21(A) to 22(C). The photovoltaic device 1d in accordance with the present embodiment basically has the same configuration and achieves the same effects as the photovoltaic device 1 in accordance with Embodiment 1 shown in FIGS. 1 to 3, but a first amorphous semiconductor film 7d, a second amorphous semiconductor film 9d, first electrodes 11d, and second electrodes 13d of the present embodiment differ in shape and arrangement pattern from the first amorphous semiconductor film 7, the second amorphous semiconductor film 9, the first electrodes 11, and the second electrodes 13 of Embodiment 1.

The first amorphous semiconductor film 7d is divided into a plurality of sections in the first direction and the second direction when viewed from the second face 2b side of the semiconductor substrate 2. In the present embodiment, each section of the first amorphous semiconductor film 7d may, when viewed from the second face 2b side of the semiconductor substrate 2, be shaped like a circle (see FIG. 21(B)) and alternatively like a polygon or a polygon with first rounded corners. These circles and first rounded corners may have a radius of curvature of from 1 µm to 1 mm inclusive, preferably from 10 µm to 1 mm inclusive.

Those sections of the first amorphous semiconductor film 7d which are adjacent in the first direction are separated by a distance $g_{1x}$ that may be from 30 µm to 1 mm inclusive. Those sections of the first amorphous semiconductor film 7d which are adjacent in the second direction are separated by a distance $g_{1y}$ that may be from 30 µm to 1 mm inclusive. The distance $g_{1x}$ separating these first-direction-wise adjacent sections of the first amorphous semiconductor film 7d may be from one thousandth to one tenth inclusive, of the first-direction length, $w_{1x}$, of each section of the first amorphous semiconductor film 7d. The distance $g_{1y}$ separating these second-direction-wise adjacent sections of the first amorphous semiconductor film 7d may be from one thousandth to one tenth inclusive, of the second-direction length, $w_{1y}$, of each section of the first amorphous semiconductor film 7d.

The regions between the sections of the first amorphous semiconductor film 7d do not contribute to collection of carriers by the first amorphous semiconductor film 7d. The distance $g_{1x}$ separating those sections of the first amorphous semiconductor film 7d which are adjacent in the first direction may be less than or equal to the diffusion length in the semiconductor substrate 2 of minority carriers generated in the semiconductor substrate 2 by the light incident on the first face 2a side of the semiconductor substrate 2. The distance $g_{1y}$ separating those sections of the first amorphous semiconductor film 7d which are adjacent in the second direction may be less than or equal to the diffusion length in the semiconductor substrate 2 of minority carriers generated in the semiconductor substrate 2 by the light incident on the first face 2a side of the semiconductor substrate 2.

The sections of the first amorphous semiconductor film 7d in the present embodiment are arranged cyclically in the first direction and the second direction. The sections of the first amorphous semiconductor film 7d may be arranged non-cyclically in either one of the first direction and the second direction or in both. The sections of the first amorphous semiconductor film 7d in the present embodiment are arranged in a lattice pattern on the second face 2b of the semiconductor substrate 2 and may alternatively be arranged in a triangular lattice pattern or a non-cyclic pattern.

The second amorphous semiconductor film 9d is divided into a plurality of sections in the first direction and the second direction when viewed from the second face 2b side of the semiconductor substrate 2. Each section of the second amorphous semiconductor film 9d in the present embodiment may, when viewed from the second face 2b side of the semiconductor substrate 2, have a square shape with second rounded corners (see FIG. 21(B)) and alternatively be shaped like a circle, a polygon, or a polygon with second rounded corners. These circles and second rounded corners may have a radius of curvature of from 1 µm to 10 mm inclusive, preferably from 10 µm to 1 mm inclusive.

Those sections of the second amorphous semiconductor film 9d which are adjacent in the first direction are separated by a distance $g_{2x}$ that may be from 30 µm to 1 mm inclusive.

Those sections of the second amorphous semiconductor film 9$d$ which are adjacent in the second direction are separated by a distance $g_{2y}$ that may be from 30 μm to 1 mm inclusive. The distance $g_{2x}$ separating these first-direction-wise adjacent sections of the second amorphous semiconductor film 9$d$ may be from one thousandth to one tenth inclusive, of the first-direction length, $w_{2x}$, of each section of the second amorphous semiconductor film 9$d$. The distance $g_{2y}$ separating these second-direction-wise adjacent sections of the second amorphous semiconductor film 9$d$ may be from one thousandth to one tenth inclusive, of the second-direction length, $w_{2y}$, of each section of the second amorphous semiconductor film 9$d$.

The regions between the sections of the second amorphous semiconductor film 9$d$ do not contribute to collection of carriers by the second amorphous semiconductor film 9$d$. The distance $g_{2x}$ separating those sections of the second amorphous semiconductor film 9$d$ which are adjacent in the first direction may be less than or equal to the diffusion length in the semiconductor substrate 2 of minority carriers generated in the semiconductor substrate 2 by the light incident on the first face 2$a$ side of the semiconductor substrate 2. The distance $g_{2y}$ separating those sections of the second amorphous semiconductor film 9$d$ which are adjacent in the second direction may be less than or equal to the diffusion length in the semiconductor substrate 2 of minority carriers generated in the semiconductor substrate 2 by the light incident on the first face 2$a$ side of the semiconductor substrate 2.

The sections of the second amorphous semiconductor film 9$d$ in the present embodiment are arranged cyclically in the first direction and the second direction. The sections of the second amorphous semiconductor film 9$d$ may be arranged non-cyclically in either one of the first direction and the second direction or in both. The sections of the second amorphous semiconductor film 9$d$ in the present embodiment are arranged in a lattice pattern on the second face 2$b$ of the semiconductor substrate 2 and may alternatively be arranged in a triangular lattice pattern or a non-cyclic pattern.

The first amorphous semiconductor film 7$d$ has a larger area than the second amorphous semiconductor film 9$d$ when the photovoltaic device 1$d$ in accordance with the present embodiment is viewed from the second face 2$b$ side of the semiconductor substrate 2. Specifically, the sections of the first amorphous semiconductor film 7$d$ have a larger area than the sections of the second amorphous semiconductor film 9$d$ when viewed from the second face 2$b$ side of the semiconductor substrate 2. In the photovoltaic device 1$d$ in accordance with the present embodiment, the sections of the first amorphous semiconductor film 7$d$ are arranged in such a manner as to enclose each section of the second amorphous semiconductor film 9$d$. In the photovoltaic device 1$d$ in accordance with the present embodiment, the sections of the second amorphous semiconductor film 9$d$ are arranged in such a manner as to enclose each section of the first amorphous semiconductor film 7$d$.

The first electrodes 11$d$ are disposed respectively on the sections of the first amorphous semiconductor film 7$d$. Each first electrode 11$d$ in the present embodiment may, when viewed from the second face 2$b$ side of the semiconductor substrate 2, be shaped like a circle (see FIG. 21(A)) and alternatively like a polygon or a polygon with third rounded corners. These circles and third rounded corners may have a radius of curvature of from 1 μm to 10 mm inclusive, preferably from 10 μm to 1 mm inclusive. The first electrodes 11$d$ in the present embodiment are arranged in a lattice pattern on the second face 2$b$ of the semiconductor substrate 2 (see FIG. 21(A)) and may alternatively be arranged in a triangular lattice pattern or a non-cyclic pattern.

The second electrodes 13$d$ are disposed respectively on the sections of the second amorphous semiconductor film 9$d$. Each second electrode 13 in the present embodiment may, when viewed from the second face 2$b$ side of the semiconductor substrate 2, have a square shape with fourth rounded corner portions (see FIG. 21(A)) and alternatively be shaped like a circle, a polygon, or a polygon with fourth rounded corners. These circles and fourth rounded corners may have a radius of curvature of from 1 μm to 10 mm inclusive, preferably from 10 μm to 1 mm inclusive. The second electrodes 13$d$ in the present embodiment are arranged in a lattice pattern on the second face 2$b$ of the semiconductor substrate 2 (see FIG. 21(A)) and may alternatively be arranged in a triangular lattice pattern or a non-cyclic pattern.

An exemplary method of manufacturing the photovoltaic device 1$d$ in accordance with the present embodiment basically includes the same steps and achieves the same effects as the method of manufacturing the photovoltaic device 1 in accordance with Embodiment 1, and differs in the shape of a first opening 22$d$ of a first mask 21$d$, the shape of a second opening 27$d$ of a second mask 26$d$, and the shape of a third opening 32$d$ of a third mask 31$d$. The first amorphous semiconductor film 7$d$ is formed using the first mask 21$d$ shown in FIG. 22(A). The second amorphous semiconductor film 9$d$ is formed using the second mask 26$d$ shown in FIG. 22(B). The first electrodes 11$d$ and the second electrodes 13$d$ are formed using the third mask 31$d$ shown in FIG. 22(C).

Referring to FIG. 22(A), the first mask 21$d$ has the first opening 22$d$. The first opening 22$d$ of the first mask 21$d$ is divided into a plurality of sections in the first direction and the second direction that intersects the first direction.

The sections of the first opening 22$d$ of the first mask 21$d$ are separated in the first direction by a first bridge section 23$d$ of the first mask 21$d$. Those sections of the first opening 22$d$ of the first mask 21$d$ which are adjacent in the first direction are separated by a distance $d_{3x}$ that is equal to the first-direction width of the first bridge section 23$d$ of the first mask 21$d$. The distance $d_{3x}$ separating these first-direction-wise adjacent sections of the first opening 22$d$ of the first mask 21$d$ may be, for example, from 30 μm to 1 mm inclusive. The first-direction width of the first bridge section 23$d$ of the first mask 21$d$ may be, for example, from 30 μm to 1 mm inclusive. The use of the first mask 21$d$ enables the first-direction-wise adjacent sections of the first amorphous semiconductor film 7$d$ to be separated by the distance $g_{1x}$ that is from 30 μm to 1 mm inclusive.

The sections of the first opening 22$d$ of the first mask 21$d$ are separated in the second direction by a second bridge section 24$d$ of the first mask 21$d$. Those sections of the first opening 22$d$ of the first mask 21$d$ which are adjacent in the second direction are separated by a distance $d_{3y}$ that is equal to the second-direction width of the second bridge section 24$d$ of the first mask 21$d$. The distance $d_{3y}$ separating these second-direction-wise adjacent sections of the first opening 22$d$ of the first mask 21$d$ may be, for example, from 30 μm to 1 mm inclusive. The second-direction width of the second bridge section 24$d$ of the first mask 21$d$ may be, for example, from 30 μm to 1 mm inclusive. The use of the first mask 21$d$ enables the second-direction-wise adjacent sections of the first amorphous semiconductor film 7$d$ to be separated by the distance $g_{1y}$ that is from 30 μm to 1 mm inclusive.

The distance $d_{3x}$ separating the first-direction-wise adjacent sections of the first opening 22d of the first mask 21d in the present embodiment may be from one thousandth to one tenth inclusive, of the first-direction length, $w_{3x}$, of each section of the first opening 22d of the first mask 21d. The width of the first bridge section 23d of the first mask 21d may be from one thousandth to one tenth inclusive, of the first-direction length, $w_{3x}$, of each section of the first opening 22d of the first mask 21d. The use of the first mask 21d enables the first-direction-wise adjacent sections of the first amorphous semiconductor film 7d to be separated by the distance $g_{1x}$ that is from one thousandth to one tenth inclusive, of the first-direction length, $w_{1x}$, of each section of the first amorphous semiconductor film 7d.

The distance $d_{3y}$ separating the second-direction-wise adjacent sections of the first opening 22d of the first mask 21d in the present embodiment may be from one thousandth to one tenth inclusive, of the second-direction length, $w_{3y}$, of each section of the first opening 22d of the first mask 21d. The width of the second bridge section 24d of the first mask 21d may be from one thousandth to one tenth inclusive, of the second-direction length, $w_{3y}$, of each section of the first opening 22d of the first mask 21d. The use of the first mask 21d enables the second-direction-wise adjacent sections of the first amorphous semiconductor film 7d to be separated by the distance $g_{1y}$ that is from one thousandth to one tenth inclusive, of the second-direction length, $w_{1y}$, of each section of the first amorphous semiconductor film 7d.

The distance $d_{3x}$ separating the first-direction-wise adjacent sections of the first opening 22d of the first mask 21d may be less than or equal to the diffusion length in the semiconductor substrate 2 of minority carriers generated in the semiconductor substrate 2 by the light incident on the first face 2a side of the semiconductor substrate 2. The first-direction width of the first bridge section 23d of the first mask 21d may be less than or equal to the diffusion length in the semiconductor substrate 2 of minority carriers generated in the semiconductor substrate 2 by the light incident on the first face 2a side of the semiconductor substrate 2. The use of the first mask 21d enables the first-direction-wise adjacent sections of the first amorphous semiconductor film 7d to be separated by the distance $g_{1x}$ that is less than or equal to the diffusion length in the semiconductor substrate 2 of minority carriers generated in the semiconductor substrate 2 by the light incident on the first face 2a side of the semiconductor substrate 2.

The distance $d_{3y}$ separating the second-direction-wise adjacent sections of the first opening 22d of the first mask 21d may be less than or equal to the diffusion length in the semiconductor substrate 2 of minority carriers generated in the semiconductor substrate 2 by the light incident on the first face 2a side of the semiconductor substrate 2. The second-direction width of the second bridge section 24d of the first mask 21d may be less than or equal to the diffusion length in the semiconductor substrate 2 of minority earners generated in the semiconductor substrate 2 by the light incident on the first face 2a side of the semiconductor substrate 2. The use of the first mask 21d enables the second-direction-wise adjacent sections of the first amorphous semiconductor film 7d to be separated by the distance $g_{1y}$ that is less than or equal to the diffusion length in the semiconductor substrate 2 of minority carriers generated in the semiconductor substrate 2 by the light incident on the first face 2a side of the semiconductor substrate 2.

The sections of the first opening 22d of the first mask 21d in the present embodiment are arranged in a lattice pattern and may alternatively be arranged in another pattern. Each section of the first opening 22d of the first mask 21d may be shaped like a circle. Each section of the first opening 22 of the first mask 21 may be shaped like a polygon or a polygon with first rounded corners. These circles and first rounded corners may have a radius of curvature of from 1 μm to 10 mm inclusive, preferably from 10 μm to 1 mm inclusive.

Referring to FIG. 22(B), the second mask 26d has the second opening 27d. The second opening 27d of the second mask 26d is divided into a plurality of sections in the first direction and the second direction.

The sections of the second opening 27d of the second mask 26d are separated in the first direction by a third bridge section 28d of the second mask 26d. Those sections of the second opening 27d of the second mask 26d which are adjacent in the first direction are separated by a distance $d_{4x}$ that is equal to the first-direction width of the third bridge section 28d of the second mask 26d. The distance $d_{4x}$ separating these first-direction-wise adjacent sections of the second opening 27d of the second mask 26d may be, for example, from 30 μm to 1 mm inclusive. The second-direction width of a fourth bridge section 29d of the second mask 26d may be, for example, from 30 μm to 1 mm inclusive. The use of the second mask 26d enables the first-direction-wise adjacent sections of the second amorphous semiconductor film 9 to be separated by the distance $g_{2x}$ that is from 30 μm to 1 mm inclusive.

The sections of the second opening 27d of the second mask 26d are separated in the second direction by the fourth bridge section 29d of the second mask 26d. Those sections of the second opening 27d of the second mask 26d which are adjacent in the second direction are separated by a distance $d_{4y}$ that is equal to the second-direction width of the fourth bridge section 29d of the second mask 26d. The distance $d_{3y}$ separating these second-direction-wise adjacent sections of the second opening 27d of the second mask 26d may be, for example, from 30 μm to 1 mm inclusive. The second-direction width of the fourth bridge section 29d of the second mask 26d may be, for example, from 30 μm to 1 mm inclusive. The use of the second mask 26d enables the second-direction-wise adjacent sections of the second amorphous semiconductor film 9d to be separated by the distance $g_{2y}$ that is from 30 μm to 1 mm inclusive.

In the present embodiment, the distance $d_{4x}$ separating the first-direction-wise adjacent sections of the second opening 27d of the second mask 26d may be from one thousandth to one tenth inclusive, of the first-direction length, $w_{4x}$, of each section of the second opening 27d of the second mask 26d. The width of the third bridge section 28d of the second mask 26d may be from one thousandth to one tenth inclusive, of the first-direction length, $w_{4x}$, of each section of the second opening 27d of the second mask 26d. The use of the second mask 26d enables the first-direction-wise adjacent sections of the second amorphous semiconductor film 9d to be separated by the distance $g_{2x}$ that is from one thousandth to one tenth inclusive, of the first-direction length, $w_{2x}$, of each section of the second amorphous semiconductor film 9d.

In the present embodiment, the distance $d_{4y}$ separating the second-direction-wise adjacent sections of the second opening 27d of the second mask 26d may be from one thousandth to one tenth inclusive, of the second-direction length, $w_{4y}$, of each section of the second opening 27d of the second mask 26d. The width of the fourth bridge section 29d of the second mask 26d may be from one thousandth to one tenth inclusive, of the second-direction length, $w_{4y}$, of each section of the second opening 27d of the second mask 26d. The use of the second mask 26d enables the second-direction-wise adjacent sections of the second amorphous semiconductor film 9d to be separated by the distance $g_{2y}$ that is from one thousandth to one tenth inclusive, of the second-direction length, $w_{2y}$, of each section of the second amorphous semiconductor film 9d.

The distance $d_{4x}$ separating the first-direction-wise adjacent sections of the second opening 27d of the second mask 26d may be less than or equal to the diffusion length in the semiconductor substrate 2 of minority carriers generated in the semiconductor substrate 2 by the light incident on the first face 2a side of the semiconductor substrate 2. The first-direction width of the third bridge section 28d of the second mask 26d may be less than or equal to the diffusion length in the semiconductor substrate 2 of minority carriers generated in the semiconductor substrate 2 by the light incident on the first face 2a side of the semiconductor substrate 2. The use of the second mask 26d enables the first-direction-wise adjacent sections of the second amorphous semiconductor film 9d to be separated by the distance $g_{2x}$ that is less than or equal to the diffusion length in the semiconductor substrate 2 of minority carriers generated in the semiconductor substrate 2 by the light incident on the first face 2a side of the semiconductor substrate 2.

The distance $d_{4y}$ separating the second-direction-wise adjacent sections of the second opening 27d of the second mask 26d may be less than or equal to the diffusion length in the semiconductor substrate 2 of minority carriers generated in the semiconductor substrate 2 by the light incident on the first face 2a side of the semiconductor substrate 2. The second-direction width of the fourth bridge section 29d of the second mask 26d may be less than or equal to the diffusion length in the semiconductor substrate 2 of minority carriers generated in the semiconductor substrate 2 by the light incident on the first face 2a side of the semiconductor substrate 2. The use of the second mask 26d enables the second-direction-wise adjacent sections of the second amorphous semiconductor film 9d to be separated by the distance $g_{2y}$ that is less than or equal to the diffusion length in the semiconductor substrate 2 of minority carriers generated in the semiconductor substrate 2 by the light incident on the first face 2a side of the semiconductor substrate 2.

The sections of the second opening 27d of the second mask 26d in the present embodiment are arranged in a lattice pattern and may alternatively be arranged in another pattern. Each section of the second opening 27d of the second mask 26d may have a square shape with second rounded corners and may alternatively be shaped like a circle, a polygon, or a polygon with second rounded corners. These circles and second rounded corners may have a radius of curvature of from 1 μm to 10 mm inclusive, preferably from 10 μm to 1 mm inclusive.

The third opening 32d of the third mask 31d is divided into a plurality of sections in the first direction and the second direction. These sections of the third opening 32d of the third mask 31d in the present embodiment include first sections and second sections. The first sections of the third opening 32d of the third mask 31d correspond to the first electrodes 11d. Each first section of the third opening 32d of the third mask 31d may be shaped like a circle. The first sections of the third opening 32d of the third mask 31d are arranged in a lattice pattern. The second sections of the third opening 32d of the third mask 31d correspond to the second electrodes 13d. Each second section of the third opening 32d of the third mask 31d may have a square shape with fourth rounded corners. The second sections of the third opening 32d of the third mask 31d are arranged in a lattice pattern. These circles and fourth rounded corners may have a radius of curvature of from 1 μm to 10 mm inclusive, preferably from 10 μm to 1 mm inclusive.

The photovoltaic device 1d in accordance with the present embodiment achieves the following effects in addition to those achieved by the photovoltaic device 1 in accordance with Embodiment 1.

In the photovoltaic device 1d in accordance with the present embodiment, at least one of the sections of the first amorphous semiconductor film 7d and the sections of the second amorphous semiconductor film 9d may be shaped like a circle, a polygon, or a polygon with first rounded corners, when viewed from the second face 2b side of the semiconductor substrate 2. This structure can restrain the carriers from accumulating in a particular part of the first amorphous semiconductor film 7d or the second amorphous semiconductor film 9d, thereby suppressing temperature rises in this particular part. That can in turn restrain the first amorphous semiconductor film 7d and the second amorphous semiconductor film 9d from being degraded or coming off the semiconductor substrate 2 due to a temperature rise in the first amorphous semiconductor film 7d or the second amorphous semiconductor film 9d.

In the photovoltaic device 1d in accordance with the present embodiment, these circles and first rounded corners may have a radius of curvature of from 1 μm to 10 mm inclusive. This structure can restrain the carriers (electrons or holes) generated in the semiconductor substrate 2 by the light incident on the first face 2a side of the semiconductor substrate 2 from accumulating in a particular part of the first amorphous semiconductor film 7d or the second amorphous semiconductor film 9d, thereby further suppressing temperature rises in this particular part. That can in turn further restrain the first amorphous semiconductor film 7d and the second amorphous semiconductor film 9d from being degraded or coming off the semiconductor substrate 2 due to a temperature rise in the first amorphous semiconductor film 7d or the second amorphous semiconductor film 9d.

In the photovoltaic device 1d in accordance with the present embodiment, at least one of the distance $g_{1x}$ separating the first-direction-wise adjacent sections of the first amorphous semiconductor film 7, the distance $g_{2x}$ separating the first-direction-wise adjacent sections of the second amorphous semiconductor film 9d, the distance $g_{1y}$ separating the second-direction-wise adjacent sections of the first amorphous semiconductor film 7d, and the distance $g_{2y}$ separating the second-direction-wise adjacent sections of the second amorphous semiconductor film 9d may be less than or equal to the diffusion length in the semiconductor substrate 2 of minority carriers generated in the semiconductor substrate 2 by the light incident on the first face 2a side of the semiconductor substrate 2. In this structure, the minority carriers can be efficiently collected through either the first amorphous semiconductor film 7d and the first electrodes 11d or the second amorphous semiconductor film 9d and the second electrodes 13d.

In the photovoltaic device 1d in accordance with the present embodiment, in the photovoltaic device 1 in accordance with the present embodiment, at least one of the distance $g_{1x}$ separating the first-direction-wise adjacent sections of the first amorphous semiconductor film 7d, the distance $g_{2x}$ separating the first-direction-wise adjacent sections of the second amorphous semiconductor film 9d, the distance $g_{1y}$ separating the second-direction-wise adjacent sections of the first amorphous semiconductor film 7d, and the distance $g_{2y}$ separating the second-direction-wise adjacent sections of the second amorphous semiconductor film 9d may be from 30 μm to 1 mm inclusive. At least one of the distance $g_{1x}$ separating the first-direction-wise adjacent sections of the first amorphous semiconductor film 7d, the distance $g_{2x}$ separating the first-direction-wise adjacent sections of the second amorphous semiconductor film 9d, the distance $g_{1y}$ separating the second-direction-wise adjacent sections of the first amorphous semiconductor film 7d, and the distance $g_{2y}$ separating the second-direction-wise adjacent sections of the second amorphous semiconductor film 9d is not smaller than 30 μm. This structure can reduce the area of at least one of the poorly heat resistant, first amorphous semiconductor film 7d of the first conductivity type and the poorly heat resistant, second amorphous semiconductor film 9d of the second conductivity type. The photovoltaic device 1d in accordance with the present embodiment hence exhibits a further improved heat resistance. At least one of the distance $g_{1x}$ separating the first-direction-wise adjacent sections of the first amorphous semiconductor film 7d, the distance $g_{2x}$ separating the first-direction-wise adjacent sections of the second amorphous semiconductor film 9d, the distance $g_{1y}$ separating the second-direction-wise adjacent sections of the first amorphous semiconductor film 7d, and the distance $g_{2y}$ separating the second-direction-wise adjacent sections of the second amorphous semiconductor film 9d is not larger than 1 mm. This structure can prevent excess drop in light-energy-to-electric-energy conversion efficiency in the photovoltaic device 1d.

In the photovoltaic device 1d in accordance with the present embodiment, the distance $g_{1y}$ separating the second-direction-wise adjacent sections of the first amorphous semiconductor film 7d may be from one thousandth to one tenth inclusive, of the second-direction length, $w_{1y}$, of each section of the first amorphous semiconductor film 7d. The distance $g_{1y}$ separating the second-direction-wise adjacent sections of the first amorphous semiconductor film 7d is not smaller than one thousandth of the second-direction length, $w_{1y}$, of each section of the first amorphous semiconductor film 7d. This structure can reduce the area of the poorly heat resistant, first amorphous semiconductor film 7 of the first conductivity type. The photovoltaic device 1d in accordance with the present embodiment hence exhibits a further improved heat resistance. The distance $g_{1y}$ separating the second-direction-wise adjacent sections of the first amorphous semiconductor film 7d is not larger than one tenth of the second-direction length, $w_{1y}$, of each section of the first amorphous semiconductor film 7d. This structure can prevent excess drop in light-energy-to-electric-energy conversion efficiency in the photovoltaic device 1d.

In the photovoltaic device 1d in accordance with the present embodiment, the distance $g_{2y}$ separating the second-direction-wise adjacent sections of the second amorphous semiconductor film 9d may be from one thousandth to one tenth inclusive, of the second-direction length, $w_{2y}$, of each section of the second amorphous semiconductor film 9d. The distance $g_{2y}$ separating the second-direction-wise adjacent sections of the second amorphous semiconductor film 9d is not smaller than one thousandth of the second-direction length, $w_{2y}$, of each section of the second amorphous semiconductor film 9d. This structure can reduce the area of the poorly heat resistant, second amorphous semiconductor film 9d of the second conductivity type of the first conductivity type. The photovoltaic device 1d in accordance with the present embodiment hence exhibits a further improved heat resistance. The distance $g_{2y}$ separating the second-direction-wise adjacent sections of the second amorphous semiconductor film 9d is not larger than one tenth of the second-direction length, $w_{2y}$, of each section of the second amorphous semiconductor film 9d. This structure can prevent excess drop in light-energy-to-electric-energy conversion efficiency in the photovoltaic device 1d.

The photovoltaic device 1d in accordance with the present embodiment allows the area ratio of the first amorphous semiconductor film 7d to the semiconductor substrate 2 and the area ratio of the second amorphous semiconductor film 9d to the semiconductor substrate 2 to be freely altered. As an example, electric current collection in the photovoltaic device 1d can be improved by increasing the proportion of the area of the first amorphous semiconductor film 7d which is composed of a p-type amorphous silicon film to the area of the semiconductor substrate 2 which is composed of an n-type monocrystal semiconductor substrate, as viewed from the second face 2b side of the semiconductor substrate 2. On the other hand, passivation characteristics in the photovoltaic device 1a can be improved by increasing the proportion of the area of the second amorphous semiconductor film 9d which is composed of an n-type amorphous silicon film to the area of the semiconductor substrate 2 which is composed of an n-type monocrystal semiconductor substrate, as viewed from the second face 2b side of the semiconductor substrate 2. The photovoltaic device 1d in accordance with the present embodiment thus allows for greater freedom in design.

The photovoltaic device 1d in accordance with the present embodiment allows the shapes and patterns of the first amorphous semiconductor film 7d, the second amorphous semiconductor film 9d, the first electrodes 11d, and the second electrodes 13d to be freely altered, as viewed from the second face 2b side of the semiconductor substrate 2. The photovoltaic device 1d in accordance with the present embodiment thus allows for greater freedom in design.

The method of manufacturing the photovoltaic device 1d in accordance with the present embodiment achieves the following effects in addition to those achieved by the method of manufacturing the photovoltaic device 1 in accordance with Embodiment 1.

In the method of manufacturing the photovoltaic device 1d in accordance with the present embodiment, at least one of the sections of the first opening 22d of the first mask 21d and the sections of the second opening 27d of the second mask 26d may be shaped like a circle, a polygon, or a polygon with rounded corners. According to the method of manufacturing the photovoltaic device 1 in accordance with the present embodiment, the resultant photovoltaic device 1d includes the first amorphous semiconductor film 7d and the second amorphous semiconductor film 9d in which at least one of the sections of the first amorphous semiconductor film 7d and the sections of the second amorphous semiconductor film 9d is shaped like a circle, a polygon, or a polygon with rounded corners when viewed from the second face 2b side of the semiconductor substrate 2. At least one of the sections of the first amorphous semiconductor film 7d and the sections of the second amorphous semiconductor film 9d is shaped like a circle, a polygon, or a polygon with rounded corners when viewed from the second face 2b side of the semiconductor substrate 2. This structure can restrain the carriers from accumulating in a particular part of the first amorphous semiconductor film 7d or the second amorphous semiconductor film 9d, thereby suppressing temperature rises in this particular part. That can in turn restrain the first amorphous semiconductor film 7d and the second amorphous semiconductor film 9d from being degraded or coming off the semiconductor substrate 2 due to a temperature rise in the first amorphous semiconductor film 7d or the second amorphous semiconductor film 9d.

In the method of manufacturing the photovoltaic device 1*d* in accordance with the present embodiment, these circles and rounded corners may have a radius of curvature of from 1 µm to 10 mm inclusive. This structure can restrain the carriers (electrons or holes) generated in the semiconductor substrate 2 by the light incident on the first face 2*a* side of the semiconductor substrate 2 from accumulating in a particular part of the first amorphous semiconductor film 7*d* or the second amorphous semiconductor film 9*d*, thereby further suppressing temperature rises in this particular part. That can in turn further restrain the first amorphous semiconductor film 7*d* and the second amorphous semiconductor film 9*d* from being degraded or coming off the semiconductor substrate 2 due to a temperature rise in the first amorphous semiconductor film 7*d* or the second amorphous semiconductor film 9*d*.

In the method of manufacturing the photovoltaic device 1*d* in accordance with the present embodiment, at least one of the first-direction width of the first bridge section 23*d* of the first mask 21*d*, the first-direction width of the third bridge section 28*d* of the second mask 26*d*, the second-direction width of the second bridge section 24*d* of the first mask 21*d*, and the second-direction width of the fourth bridge section 29*d* of the second mask 26*d* may be less than or equal to the diffusion length in the semiconductor substrate 2 of minority carriers generated in the semiconductor substrate 2 by the light incident on the first face 2*a* side of the semiconductor substrate 2. By using at least one of the first mask 21*d* and the second mask 26*d*, at least one of the distance $g_{1y}$ separating the second-direction-wise adjacent sections of the first amorphous semiconductor film 7*d* and the distance $g_{2y}$ separating the second-direction-wise adjacent sections of the second amorphous semiconductor film 9*d* can be rendered less than or equal to the diffusion length in the semiconductor substrate 2 of minority carriers generated in the semiconductor substrate 2 by the light incident on the first face 2*a* side of the semiconductor substrate 2. According to the method of manufacturing the photovoltaic device 1*d* in accordance with the present embodiment, the minority carriers can hence be efficiently collected through either the first amorphous semiconductor film 7*d* and the first electrodes 11*d* or the second amorphous semiconductor film 9*d* and the second electrodes 13*d*.

In the method of manufacturing the photovoltaic device 1*d* in accordance with the present embodiment, at least one of the first-direction width of the first bridge section 23*d* of the first mask 21*d*, the first-direction width of the third bridge section 28*d* of the second mask 26*d*, the second-direction width of the second bridge section 24*d* of the first mask 21*d*, and the second-direction width of the fourth bridge section 29*d* of the second mask 26*d* may be from 30 µm to 1 mm inclusive. By using at least one of the first mask 21*d* and the second mask 26*d*, at least one of the distance $g_{1y}$ separating the second-direction-wise adjacent sections of the first amorphous semiconductor film 7*d* and the distance $g_{2y}$ separating the second-direction-wise adjacent sections of the second amorphous semiconductor film 9*d* can be rendered not smaller than 30 µm. This structure can reduce the area of at least one of the poorly heat resistant, first amorphous semiconductor film 7*d* of the first conductivity type and the poorly heat resistant, second amorphous semiconductor film 9*d* of the second conductivity type. According to the method of manufacturing the photovoltaic device 1*d* in accordance with the present embodiment, the resultant photovoltaic device 1*d* hence exhibits a further improved heat resistance. In addition, at least one of the first-direction width of the first bridge section 23*d* of the first mask 21*d*, the first-direction width of the third bridge section 28*d* of the second mask 26*d*, the second-direction width of the second bridge section 24*d* of the first mask 21*d*, and the second-direction width of the fourth bridge section 29*d* of the second mask 26*d* is not smaller than 30 µm. This structure can restrain at least one of the first mask 21*d* and the second mask 26*d* from warping, thereby rendering at least one of the first opening 22*d* and the second opening 27*d* less likely to deform, when at least one of the first amorphous semiconductor film 7*d* and the second amorphous semiconductor film 9*d* is formed using at least one of the first mask 21*d* and the second mask 26*d*. At least one of the first amorphous semiconductor film 7*d* and the second amorphous semiconductor film 9*d* can hence be formed in a more accurate pattern. Furthermore, by using at least one of the first mask 21*d* and the second mask 26*d*, at least one of the distance $g_{1y}$ separating the second-direction-wise adjacent sections of the first amorphous semiconductor film 7*d* and the distance $g_{2y}$ separating the second-direction-wise adjacent sections of the second amorphous semiconductor film 9*d* can be rendered not larger than 1 mm. The method of manufacturing the photovoltaic device 1*d* in accordance with the present embodiment can hence prevent excess drop in light-energy-to-electric-energy conversion efficiency in the photovoltaic device 1*d*.

In the method of manufacturing the photovoltaic device 1*d* in accordance with the present embodiment, the second-direction width of the second bridge section 24*d* of the first mask 21*d* may be from one thousandth to one tenth inclusive, of the second-direction length, $w_{3y}$, of each section of the first opening 22*d* of the first mask 21*d*. By using the first mask 21*d*, the distance $g_{1y}$ separating the second-direction-wise adjacent sections of the first amorphous semiconductor film 7*d* can be rendered not smaller than one thousandth of the second-direction length, $w_{1y}$, of each section of the first amorphous semiconductor film 7*d*. This structure can reduce the area of the poorly heat resistant, first amorphous semiconductor film 7*d* of the first conductivity type. According to the method of manufacturing the photovoltaic device 1*d* in accordance with the present embodiment, the resultant photovoltaic device 1*d* hence exhibits a further improved heat resistance. Additionally the second-direction width of the second bridge section 24*d* of the first mask 21*d* is not smaller than one thousandth of the second-direction length, $w_{3y}$, of each section of the first opening 22*d* of the first mask 21*d*. The second bridge section 24*d* can thus impart improved mechanical strength to the first mask 21*d*. This structure can restrain the first mask 21*d* from warping, thereby rendering the first opening 22*d* less likely to deform, when the first amorphous semiconductor film 7*d* is formed using the first mask 21*d*. According to the method of manufacturing the photovoltaic device 1*d* in accordance with the present embodiment, the first amorphous semiconductor film 7*d* can hence be formed in a more accurate pattern. Additionally, by using the first mask 21*d*, the distance $g_{1y}$ separating the second-direction-wise adjacent sections of the first amorphous semiconductor film 7*d* can be rendered not larger than one tenth of the second-direction length, $w_{1y}$, of each section of the first amorphous semiconductor film 7*d*. The method of manufacturing the photovoltaic device 1*d* in accordance with the present embodiment can hence prevent excess drop in light-energy-to-electric-energy conversion efficiency in the photovoltaic device 1*d*.

In the method of manufacturing the photovoltaic device 1*d* in accordance with the present embodiment, the second-direction width of the fourth bridge section 29*d* of the second mask 26*d* may be from one thousandth to one tenth inclusive, of the second-direction length, $w_{4y}$, of each section of the second opening 27d of the second mask 26d. By using the second mask 26d, the distance $g_{2y}$ separating the second-direction-wise adjacent sections of the second amorphous semiconductor film 9d can be rendered not smaller than one thousandth of the second-direction length, $w_{2y}$, of each section of the second amorphous semiconductor film 9d. This structure can reduce the area of the poorly heat resistant, second amorphous semiconductor film 9d of the second conductivity type. According to the method of manufacturing the photovoltaic device 1d in accordance with the present embodiment, the resultant photovoltaic device 1d hence exhibits a further improved heat resistance. In addition, the second-direction width of the fourth bridge section 29d of the second mask 26d is not smaller than one thousandth of the second-direction length, $w_{4y}$, of each section of the second opening 27d of the second mask 26d. The fourth bridge section 29d can thus impart improved mechanical strength to the second mask 26d. This structure can restrain the second mask 26d from warping, thereby rendering the second opening 27d less likely to deform, when the second amorphous semiconductor film 9d is formed using the second mask 26d. According to the method of manufacturing the photovoltaic device 1d in accordance with the present embodiment, the second amorphous semiconductor film 9d can hence be formed in a more accurate pattern. Additionally, by using the second mask 26, the distance $g_{2y}$ separating the second-direction-wise adjacent sections of the second amorphous semiconductor film 9d can be rendered not larger than one tenth of the second-direction length, $w_{2y}$, of each section of the second amorphous semiconductor film 9d. The method of manufacturing the photovoltaic device 1d in accordance with the present embodiment can hence prevent excess drop in light-energy-to-electric-energy conversion efficiency in the photovoltaic device 1d.

Embodiment 6

Figure 23:
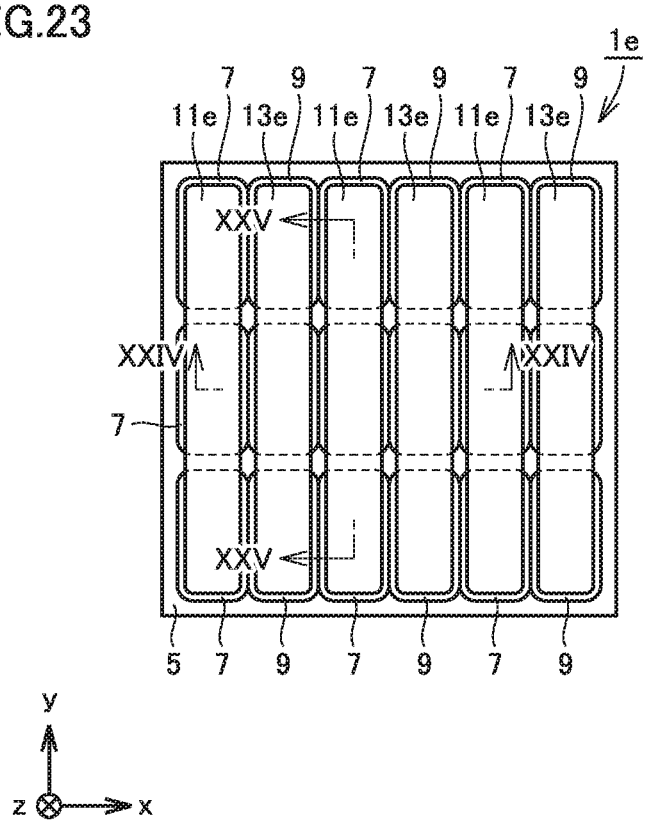
FIG. 23 is a schematic plan view of a photovoltaic device in accordance with Embodiment 6 as viewed from a second face side of a semiconductor substrate.
Figure 24:
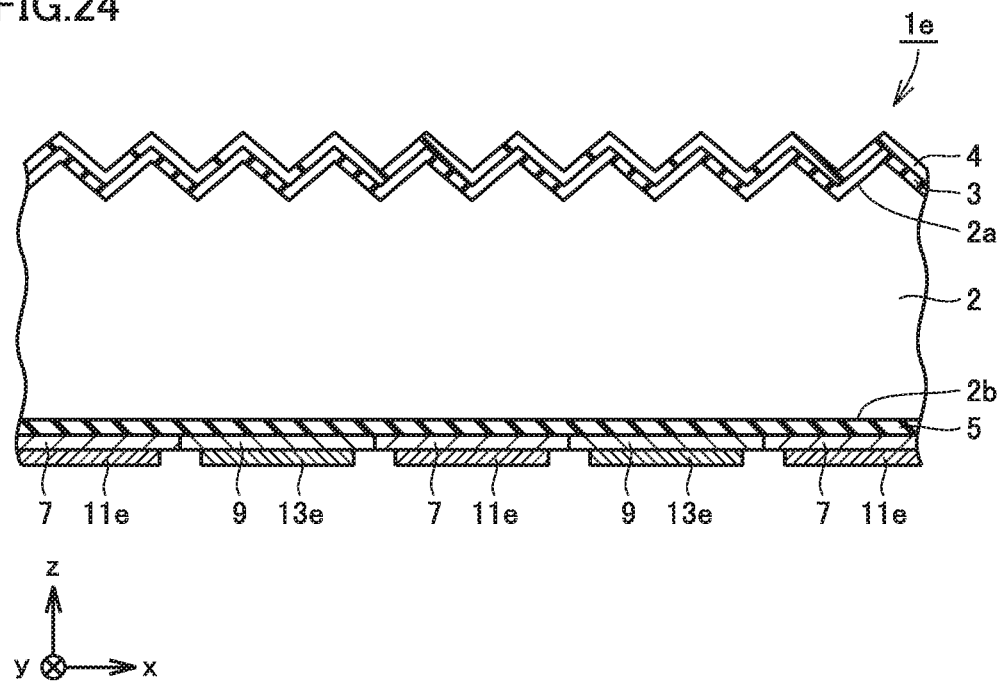
FIG. 24 is a schematic cross-sectional view of the photovoltaic device in accordance with Embodiment 6, taken along cross-sectional line XXIV-XXIV in FIG. 23.
Figure 25:
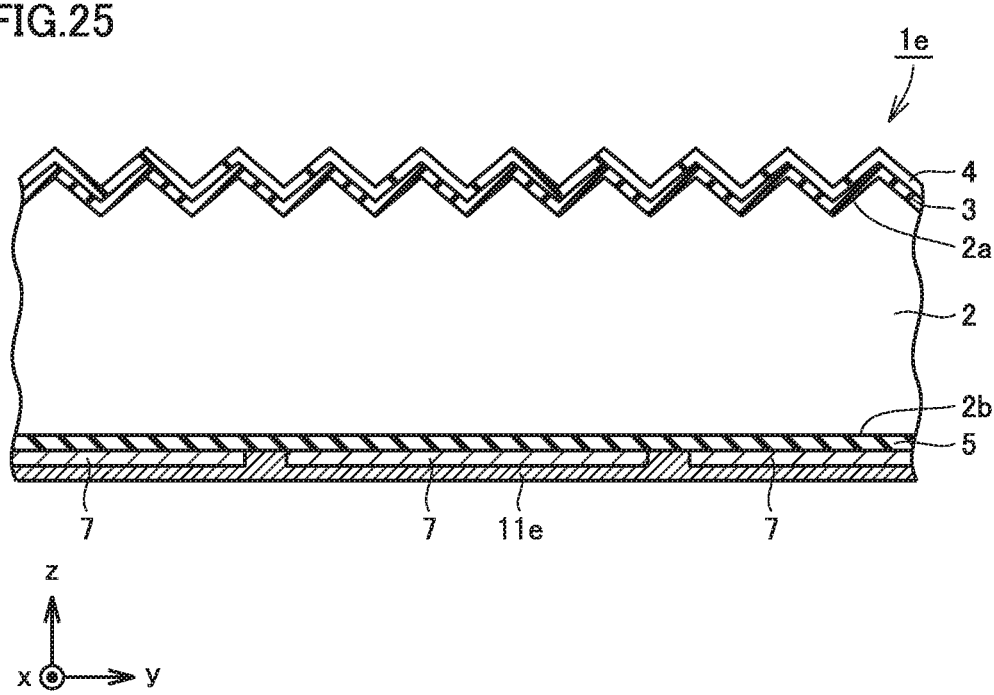
FIG. 25 is a schematic cross-sectional view of the photovoltaic device in accordance with Embodiment 6, taken along cross-sectional line XXV-XXV in FIG. 23.

A photovoltaic device 1e and a method of manufacturing the photovoltaic device 1e will be described in accordance with Embodiment 6 in reference to FIGS. 23 to 25. The photovoltaic device 1e in accordance with the present embodiment basically has the same configuration and achieves the same effects as the photovoltaic device 1 in accordance with Embodiment 1 shown in FIGS. 1 to 3, and differs in the shape of first electrodes 11e and the shape of second electrodes 13e.

The first electrodes 11e in the photovoltaic device 1e in accordance with the present embodiment are formed contiguously (i.e., not divided) in the second direction. In the present embodiment, a plurality of sections into which a first amorphous semiconductor film 7e is divided is lined up in the second direction. The i-type amorphous semiconductor film 5 is present on the second face 2b of the semiconductor substrate 2 between the sections of the first amorphous semiconductor film 7e which are lined up in the second direction. Since the i-type amorphous semiconductor film 5 is present between the first electrodes 11e and the semiconductor substrate 2, the first electrodes 11e formed contiguously in the second direction do not substantially degrade the characteristics of the photovoltaic device 1e.

The second electrodes 13e in the photovoltaic device 1e in accordance with the present embodiment are formed contiguously (i.e., not divided) in the second direction. In the present embodiment, a plurality of sections into which a second amorphous semiconductor film 9e is divided is lined up in the second direction. The i-type amorphous semiconductor film 5 is present on the second face 2b of the semiconductor substrate 2 between the sections of the second amorphous semiconductor film 9e which are lined up in the second direction. Since the i-type amorphous semiconductor film 5 is present between the second electrodes 13e and the semiconductor substrate 2, the second electrodes 13e formed contiguously in the second direction do not substantially degrade the characteristics of the photovoltaic device 1e.

Figure 26:
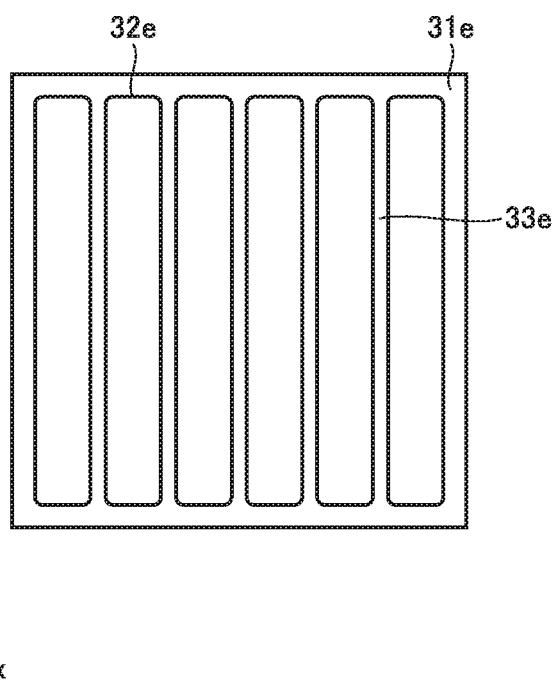
FIG. 26 is a schematic plan view of a third mask used in a method of manufacturing the photovoltaic device in accordance with Embodiment 6.
Figure 27:
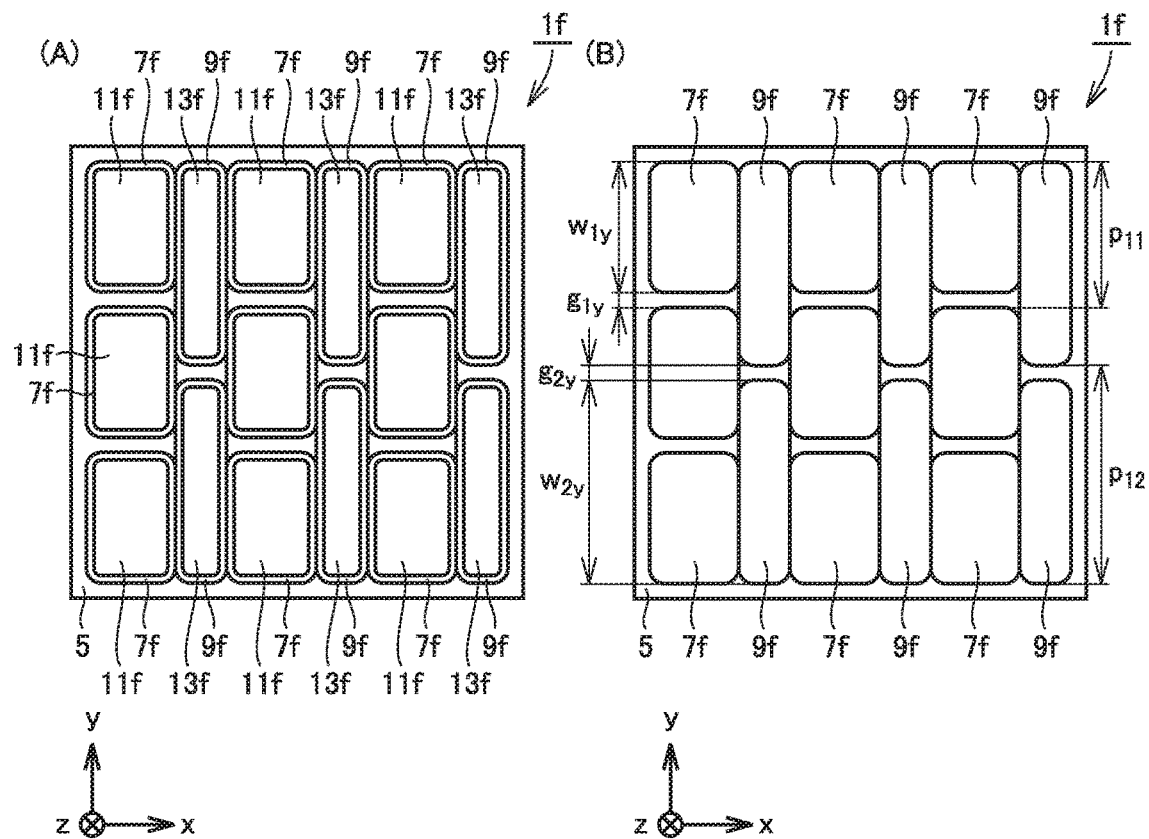
FIG. 27(A) is a schematic plan view of a photovoltaic device in accordance with Embodiment 7 as viewed from a second face side of a semiconductor substrate.
FIG. 27(B) is a schematic plan view of the photovoltaic device in accordance with Embodiment 7 as viewed from the second face side of the semiconductor substrate with first electrodes and second electrodes being omitted.
Figure 28:
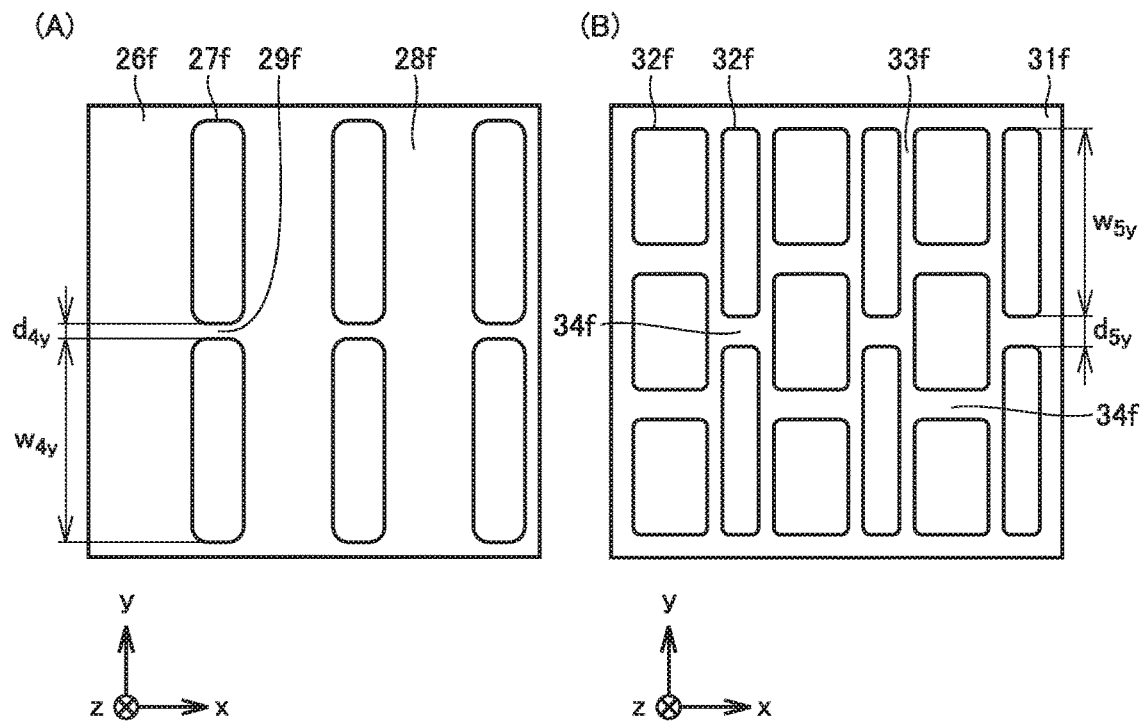
FIG. 28(A) is a schematic plan view of a second mask used in a method of manufacturing the photovoltaic device in accordance with Embodiment 7.
FIG. 28(B) is a schematic plan view of a third mask used in the method of manufacturing the photovoltaic device in accordance with Embodiment 7.
Figure 29:
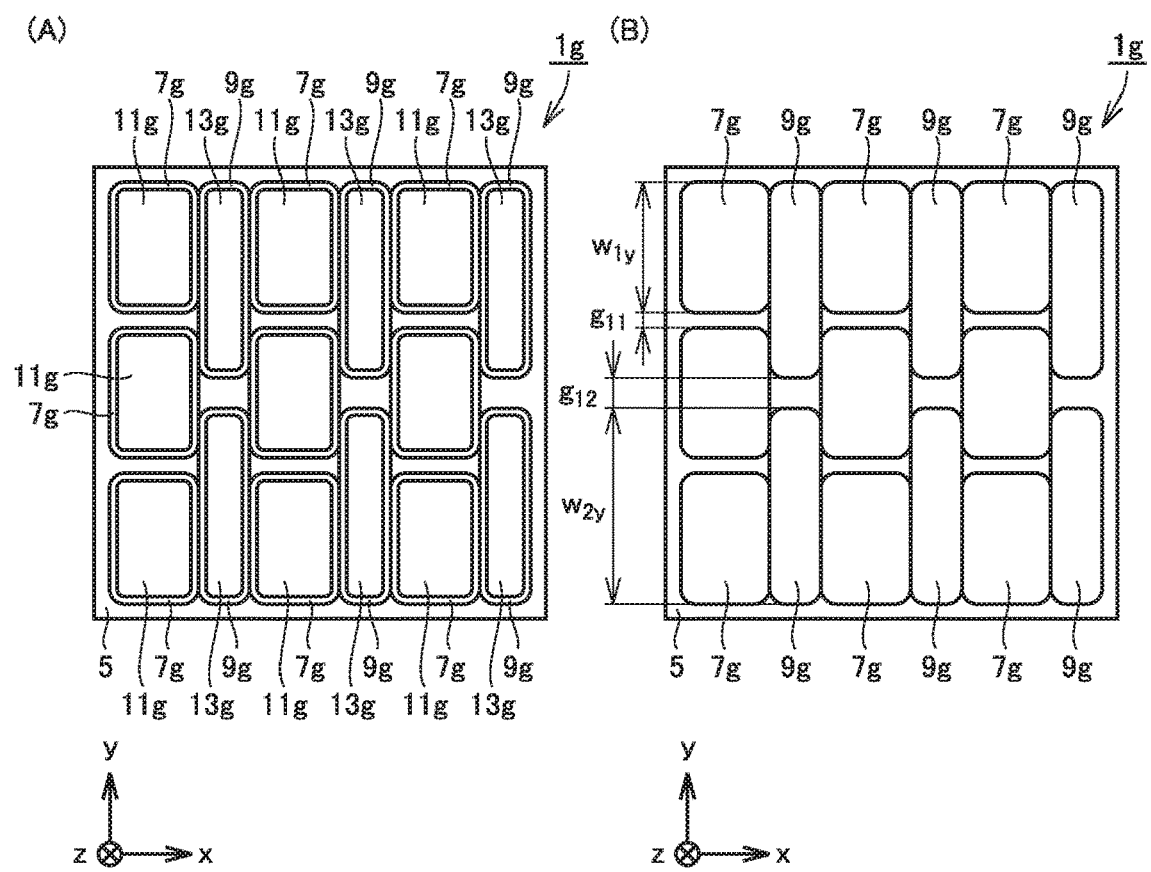
FIG. 29(A) is a schematic plan view of a photovoltaic device in accordance with Embodiment 8 as viewed from a second face side of a semiconductor substrate.
FIG. 29(B) is a schematic plan view of the photovoltaic device in accordance with Embodiment 8 as viewed from the second face side of the semiconductor substrate with first electrodes and second electrodes being omitted.
Figure 30:
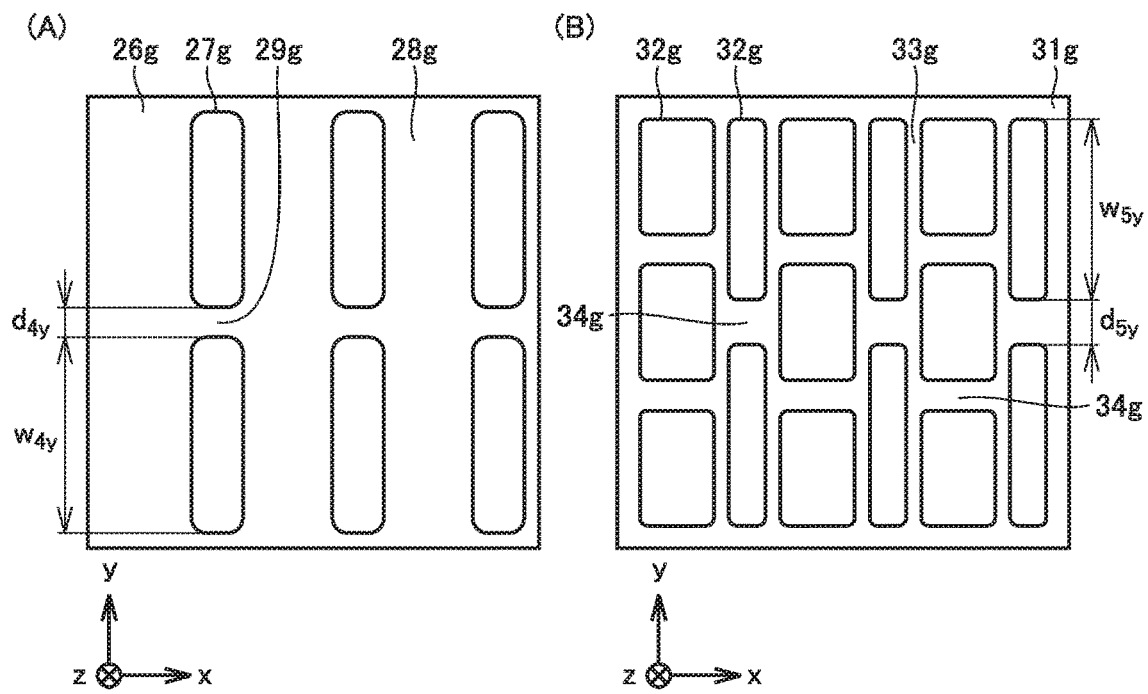
FIG. 30(A) is a schematic plan view of a second mask used in a method of manufacturing the photovoltaic device in accordance with Embodiment 8.
FIG. 30(B) is a schematic plan view of a third mask used in the method of manufacturing the photovoltaic device in accordance with Embodiment 8.

An exemplary method of manufacturing the photovoltaic device 1e in accordance with the present embodiment basically includes the same steps and achieves the same effects as the method of manufacturing the photovoltaic device 1 in accordance with Embodiment 1 shown in FIGS. 4 to 14, and differs in the shape of a third opening 32 of a third mask 31e. The first electrodes 11e and the second electrodes 13e in the present embodiment are formed using the third mask 31e shown in FIG. 26.

The third mask 31e has the third opening 32e. The third opening 32e of the third mask 31e is divided into a plurality of sections in the first direction. More specifically, the sections of the third opening 32e of the third mask 31e are separated in the first direction by a fifth bridge section 33e of the third mask 31e.

Each section of the third opening 32e of the third mask 31e may have a rectangular shape with third rounded corners that is elongate in the second direction. These third rounded corners may have a radius of curvature of from 1 μm to 10 mm inclusive, preferably from 10 μm to 1 mm inclusive.

Embodiment 7

A photovoltaic device 1f and a method of manufacturing the photovoltaic device 1f will be described in accordance with Embodiment 7 in reference to FIGS. 16(A) and 27(A) to 28(B). The photovoltaic device 1f in accordance with the present embodiment basically has the same configuration and achieves the same effects as the photovoltaic device 1a in accordance with Embodiment 2 shown in FIGS. 15(A) to 16(C), and differs in the arrangement patterns of a second amorphous semiconductor film 9f and second electrodes 13f.

Referring to FIGS. 27(A) and 27(B), a plurality of sections into which a first amorphous semiconductor film 7f is divided has a cycle $p_{11}$ in the second direction, and a plurality of sections into which the second amorphous semiconductor film 9f is divided has a cycle $p_{12}$ in the second direction, the cycle $p_{11}$ being shorter than the cycle $p_{12}$. Each section of the first amorphous semiconductor film 7f has a second-direction length $w_{1y}$, and each section of the second amorphous semiconductor film 9f has a second-direction length $w_{1y}$, the length $w_{1y}$ being smaller than the length $w_{2y}$. First electrodes 11f have a shorter cycle in the second direction than do the second electrodes 13f. Each first electrode 11f has a smaller second-direction length than does each second electrode 13f.

An exemplary method of manufacturing the photovoltaic device 1f in accordance with the present embodiment basically includes the same steps and achieves the same effects as the method of manufacturing the photovoltaic device 1a in accordance with Embodiment 2, and differs in a second opening 27f of a second mask 26f and a third opening 32f of a third mask 31f. The first amorphous semiconductor film 7f is formed using the first mask 21a shown in FIG. 16(A). The second amorphous semiconductor film 9f is formed using the second mask 26f shown in FIG. 28(A). The first electrodes 11f and the second electrodes 13f are formed using the third mask 31f shown in FIG. 28(B).

Referring to FIGS. 16(A) and 28(A), a plurality of sections into which the first opening 22a of the first mask 21a is divided has a shorter cycle in the second direction than does a plurality of sections into which the second opening 27f of the second mask 26f is divided. The sections of the first opening 22a of the first mask 21a have a second-direction length $w_{3y}$, and the sections of the second opening 27f of the second mask 26f have a second-direction length $w_{4y}$, the length $w_{3y}$ being smaller than the length $w_{4y}$. The sections of the second opening 27f are separated in the first direction by a third bridge section 28f and in the second direction by a fourth bridge section 29f. Referring to FIG. 28(B), those sections of the third opening 32f of the third mask 31f which correspond to the first electrodes 11f have a shorter cycle than do those sections of the third opening 32f of the third mask 31f which correspond to the second electrodes 13f. Those sections of the third opening 32f of the third mask 31f which correspond to the first electrodes 11f have a second-direction length that is smaller than the second-direction length $w_{5y}$ of those sections of the third opening 32f of the third mask 31f which correspond to the second electrodes 13f. The sections of the third opening 32f are separated in the first direction by a fifth bridge section 33f and in the second direction by a sixth bridge section 34f.

Effects of the photovoltaic device 1f and the method of manufacturing the photovoltaic device 1f in accordance with the present embodiment will be described. In the photovoltaic device 1f in accordance with the present embodiment, the cycle pit of the sections of the first amorphous semiconductor film 7f in the second direction is shorter than the cycle $p_{12}$ of the sections of the second amorphous semiconductor film 9f in the second direction. For example, if the first amorphous semiconductor film 7f is a p-type amorphous semiconductor film and the second amorphous semiconductor film 9f is an n-type amorphous semiconductor film, the first amorphous semiconductor film 7f has a lower heat resistance than the second amorphous semiconductor film 9f, and the second amorphous semiconductor film 9f exhibits better passivation characteristics than the first amorphous semiconductor film 7f. The photovoltaic device 1f and the method of manufacturing the photovoltaic device 1f in accordance with the present embodiment can further reduce the area of the poorly heat resistant, first amorphous semiconductor film 7f, and the photovoltaic device 1f exhibits a further improved heat resistance. The photovoltaic device 1f and the method of manufacturing the photovoltaic device 1f in accordance with the present embodiment can increase the area of the second amorphous semiconductor film 9f having improved passivation characteristics. The photovoltaic device 1f exhibits further improved passivation characteristics.

Embodiment 8

A photovoltaic device 1g and a method of manufacturing the photovoltaic device 1g will be described in accordance with Embodiment 8 in reference to FIGS. 16(A) and 29(A) to 30(B). The photovoltaic device 1g in accordance with the present embodiment basically has the same configuration and achieves the same effects as the photovoltaic device 1a in accordance with Embodiment 2 shown in FIGS. 15(A) to 16(C), and differs in the arrangement patterns of a second amorphous semiconductor film 9g and second electrodes 13g.

Referring to 29(A) and 29(B), a plurality of sections into which a first amorphous semiconductor film 7g is divided is separated in the second direction by a distance $g_{11}$, and a plurality of sections into which the second amorphous semiconductor film 9g is divided is separated in the second direction by a distance $g_{12}$, the distance $g_{11}$ being smaller than the distance $g_{12}$. First electrodes 11g are separated in the second direction by a distance that is smaller than the distance separating the second electrodes 13g in the second direction.

An exemplary method of manufacturing the photovoltaic device 1g in accordance with the present embodiment basically includes the same steps and achieves the same effects as the method of manufacturing the photovoltaic device 1a in accordance with Embodiment 2, and differs in a second opening 27g of a second mask 26g and a third opening 32g of a third mask 31g. The first amorphous semiconductor film 7g is formed using the first mask 21a shown in FIG. 16(A). The second amorphous semiconductor film 9g is formed using the second mask 26g shown in FIG. 30(A). The first electrodes 11g and the second electrodes 13g are formed using the third mask 31g shown in FIG. 30(B).

Referring to FIGS. 16(A) and 30(A), the first opening 22a of the first mask 21a is divided into a plurality of sections that is separated in the second direction by a distance $d_{3y}$, and the second opening 27g of the second mask 26g is divided into a plurality of sections that is separated in the second direction by a distance $d_{4y}$, the distance $d_{3y}$ being smaller than the distance $d_{4y}$. The sections of the second opening 27g are separated in the first direction by a third bridge section 28g and in the second direction by a fourth bridge section 29g. Referring to FIG. 30(B), those sections of the third opening 32g of the third mask 31g which correspond to the first electrodes 11g are separated by a distance that is smaller than the distance $d_{5y}$ separating those sections of the third opening 32g of the third mask 31g which correspond to the second electrodes 13g. The sections of the third opening 32g are separated in the first direction by a fifth bridge section 33g and in the second direction by a sixth bridge section 34g.

Effects of the photovoltaic device 1g and the method of manufacturing the photovoltaic device 1g in accordance with the present embodiment will be described. In the photovoltaic device 1g in accordance with the present embodiment, the distance gel separating the sections of the first amorphous semiconductor film 7g in the second direction is smaller than the distance $g_{12}$ separating the sections of the second amorphous semiconductor film 9g in the second direction. Therefore, the carriers generated in the semiconductor substrate 2 by the light incident on the first face 2a side of the semiconductor substrate 2 can be more efficiently collected through the first amorphous semiconductor film 7 and the first electrodes 11.

Embodiment 9

A photovoltaic module 51 in accordance with Embodiment 9 will be described in reference to FIGS. 31 to 34.

The photovoltaic module 51 in accordance with the present embodiment includes photovoltaic devices 1h and a wiring sheet 40.

Each photovoltaic device 1h in accordance with the present embodiment basically has the same configuration and achieves the same effects as the photovoltaic device 1 in accordance with Embodiment 1 shown in FIGS. 1(A) to 3, and differs in the arrangement patterns of a first amorphous semiconductor film 7h and a second amorphous semiconductor film 9h.

The first amorphous semiconductor film 7h is arranged in stripes extending in the second direction and divided into a plurality of sections in the first direction, when viewed from the second face 2b side of the semiconductor substrate 2. These sections of the first amorphous semiconductor film 7 are elongate in the second direction. The sections of the first amorphous semiconductor film 7h may or may not be arranged cyclically in the first direction.

The second amorphous semiconductor film 9h is arranged in stripes extending in the second direction and divided into a plurality of sections in the first direction, when viewed from the second face 2b side of the semiconductor substrate 2. These sections of the second amorphous semiconductor film 9 are elongate in the second direction. The sections of the second amorphous semiconductor film 9h may or may not be arranged cyclically in the first direction.

The first electrodes 11 are disposed on the first amorphous semiconductor film 7h. Alternatively, the first electrodes 11 may be disposed respectively on the sections of the first amorphous semiconductor film 7h. The first electrodes 11 are separated both in the first direction and in the second direction.

The second electrodes 13 are disposed on the second amorphous semiconductor film 9h. Alternatively, the second electrodes 13 may be disposed respectively on the sections of the second amorphous semiconductor film 9h. The second electrodes 13 are separated both in the first direction and in the second direction.

Figure 34:
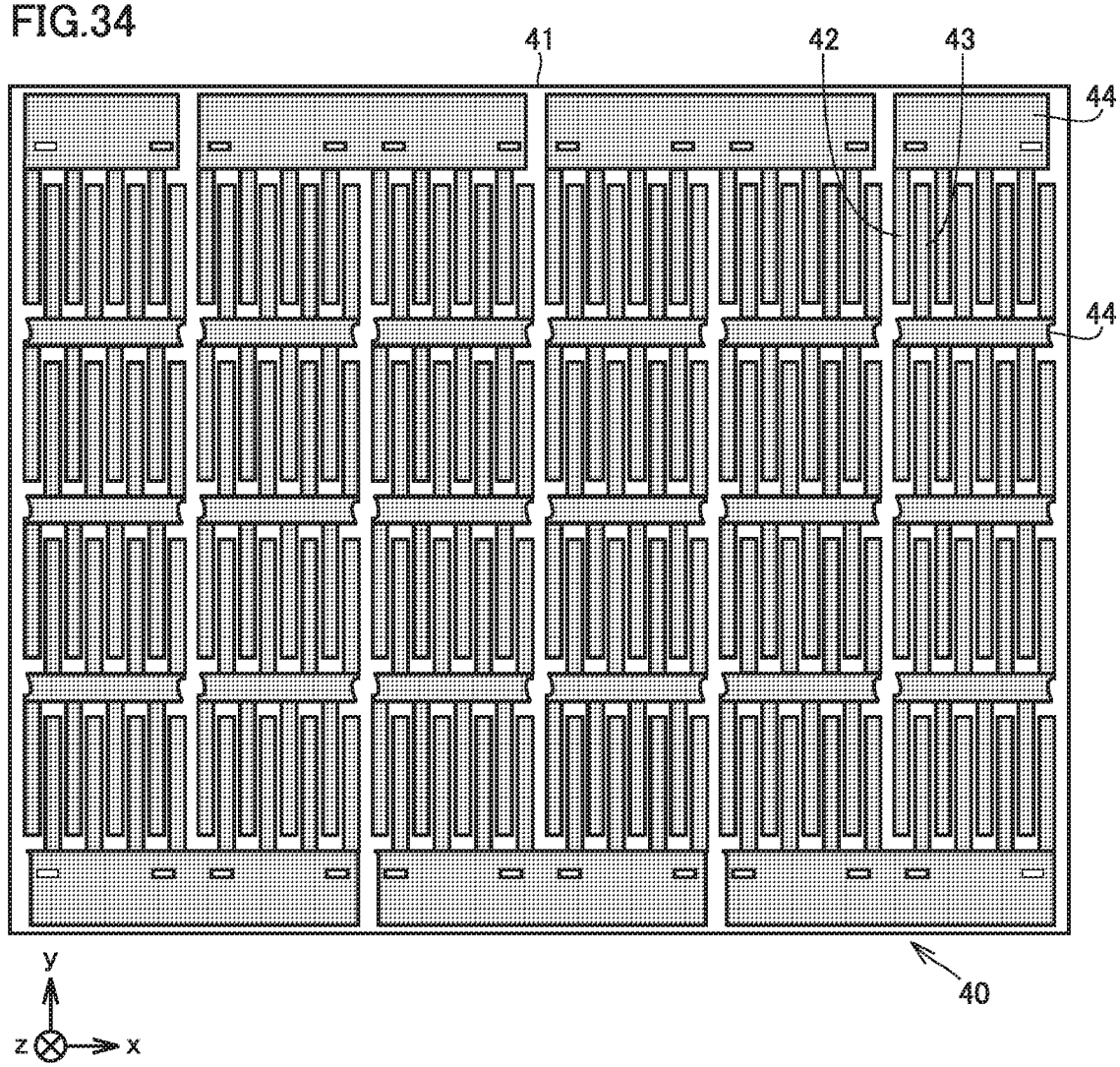
FIG. 34 is a schematic plan view of a wiring sheet.

Referring to FIG. 34, the wiring sheet 40 includes a base material 41 and a plurality of first wires 42 and a plurality of second wires 43 both disposed on the base material 41.

The base material 41 may be, for example, a polyester, polyethylene naphthalate, polyimide, or other electrically insulating film.

The first wires 42 and the second wires 43 are formed in bands. The lengthwise direction of the first wires 42 is the same as the lengthwise direction of the second wires 43. The first wires 42 and the second wires 43 are alternately arranged at intervals on the base material 41.

An end of each first wire 42 and an end of each second wire 43 are electrically connected to one of power collection wires 44 that are shaped like bands. The power collection wires 44 are disposed on the base material 41. The lengthwise direction of the power collection wires 44 intersects the lengthwise direction of the first wires 42 and the lengthwise direction of the second wires 43. The power collection wires 44 function to collect electric current from the first wires 42 or the second wires 43. The first wires 42, the second wires 43, and the power collection wires 44 may be made of an electrically conductive material. This conductive material may be, for example, copper or another like metal.

Figure 31:
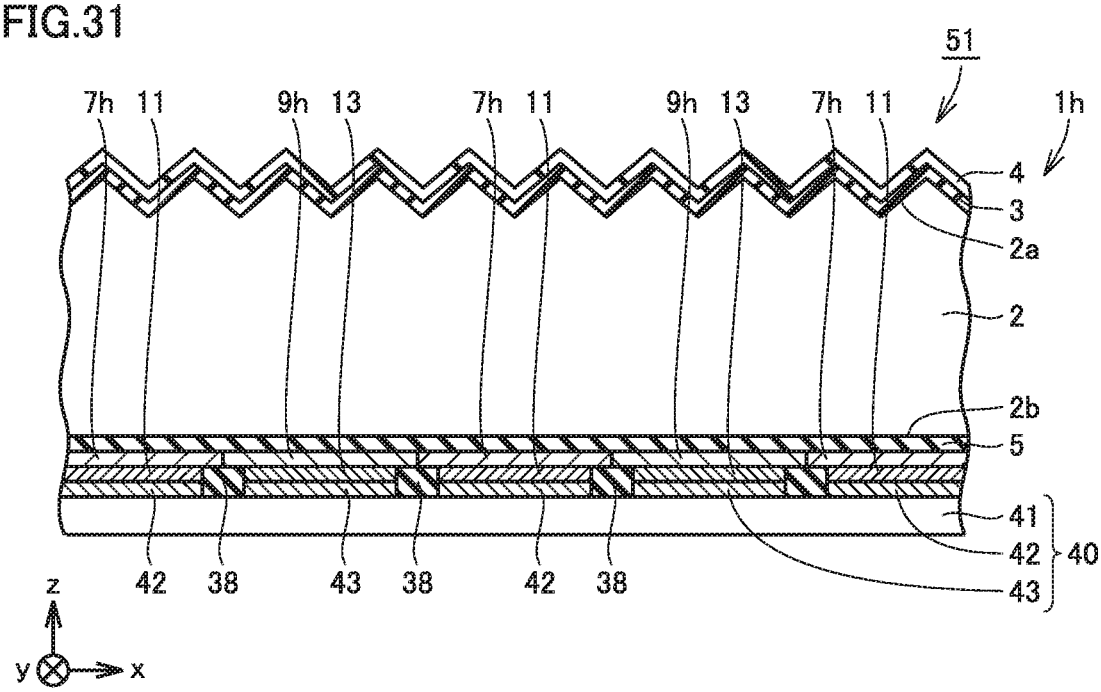
FIG. 31 is a schematic cross-sectional view of a photovoltaic module in accordance with Embodiment 9, taken along cross-sectional line XXXI-XXXI in FIG. 33(A).
Figure 32:
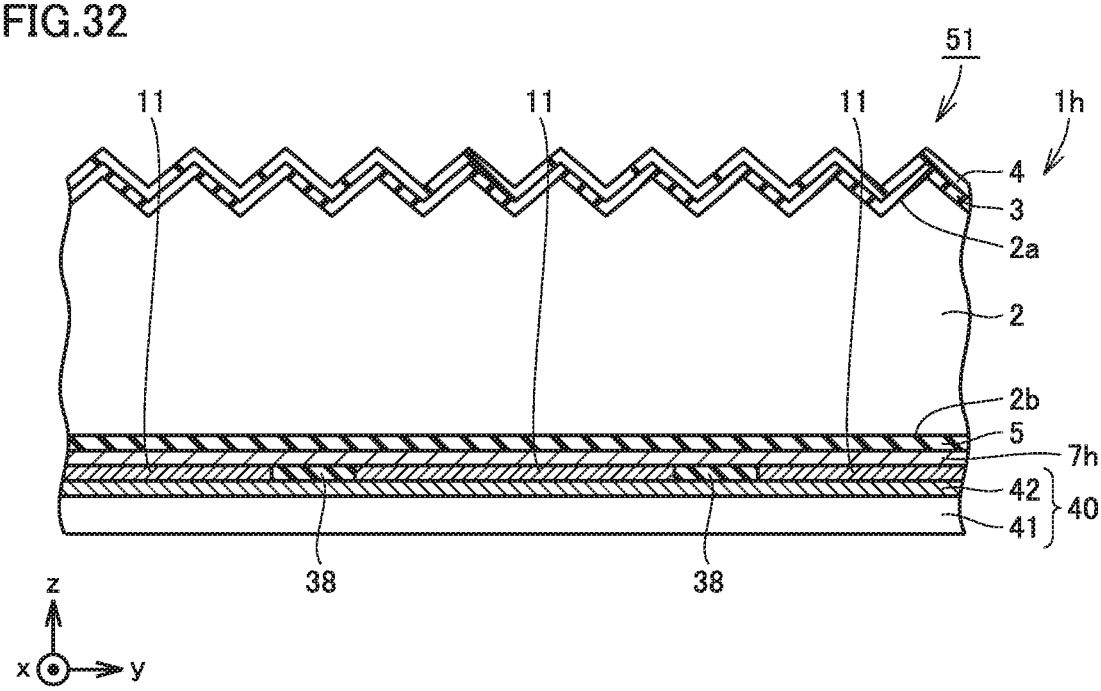
FIG. 32 is a schematic cross-sectional view of the photovoltaic module in accordance with Embodiment 9, taken along cross-sectional line XXXII-XXXII in FIG. 33(A).

Referring to FIGS. 31 and 32, the photovoltaic device 1h is mechanically connected to the wiring sheet 40 using a junction material 38. The "mechanical connection" of the photovoltaic device 1h to the wiring sheet 40, as examples, may be adhesion of the photovoltaic device 1h to the wiring sheet 40 using an electrically insulating and adhesive resin material and may be secure attachment of the photovoltaic device 1h to the wiring sheet 40 using a solder. The photovoltaic device 1h is also electrically connected to the wiring sheet 40. The first electrodes 11 of the photovoltaic device 1h are electrically connected to the first wires 42 of the wiring sheet 40, and the second electrodes 13 of the photovoltaic device 1h are electrically connected to the second wires 43 of the wiring sheet 40.

The junction material 38 in the present embodiment is disposed in each region surrounded by the wiring sheet 40 and a pair of those first and second electrodes 11 and 13 which are adjacent in the first direction (see FIG. 31). The junction material 38 in the present embodiment is also disposed in each region surrounded by the wiring sheet 40 and a pair of those first electrodes 11 which are adjacent in the second direction (see FIG. 32) and in each region surrounded by the wiring sheet 40 and a pair of those second electrodes 13 which are adjacent in the second direction. Alternatively, the junction material 38 may be disposed at least either in the regions surrounded by the wiring sheet 40 and those adjacent first electrodes 11 or in the regions surrounded by the wiring sheet 40 and those adjacent second electrodes 13. No junction material 38 may be disposed in the regions surrounded by the wiring sheet 40 and those adjacent first and second electrodes 11 and 13.

The junction material 38 in the present embodiment is an insulating junction material that may be, for example, an insulating resin adhesive. Alternatively, the junction material 38 may be a conductive junction material, provided that the first electrodes 11 and the second electrodes 13 are not short-circuited and also that the first wires 42 and the second wires 43 are not short-circuited. For example, even when such a conductive junction material is used, the short-circuiting of the first electrodes 11 and the second electrodes 13 and the short-circuiting of the first wires 42 and the second wires 43 are still preventable if there are provided electrically insulating partition watts between the first electrodes 11 and the second electrodes 13 and between the first wires 42 and the second wires 43. The conductive junction material may be, for example, solder, conductive adhesive, anisotropic conductive film (ACF), or anisotropic conductive paste (ACP). The junction material 38, if used also for the purpose of electrically connecting the photovoltaic device 1h to the wiring sheet 40, may be a combination of a conductive junction material and an insulating junction material.

There is provided a plurality of photovoltaic devices 1h on the wiring sheet 40 in the present embodiment. Alternatively, there may be provided only one photovoltaic device 1h on the wiring sheet 40.

An exemplary method of manufacturing the photovoltaic module 51 will be described in accordance with the present embodiment.

The photovoltaic device 1h is prepared by the manufacturing method described below as an example. The wiring sheet 40 is prepared. The wiring sheet 40 may be manufactured by the following method that is presented here for illustrative purposes only. A conductive film is formed across a face of the base material 41. The first wires 42, the second wires 43, and the power collection wires 44 of the wiring sheet 40 are formed on the base material 41 by patterning this conductive film. The wiring sheet 40 is then mechanically connected to the photovoltaic device 1h using the junction material 38. The photovoltaic device 1h is electrically connected to the wiring sheet 40.

The junction material 38 in the present embodiment is disposed between the first and second wires 42 and 43 of the wiring sheet 40. The junction material 38 only needs to be disposed at least either on the wiring sheet 40 or on the photovoltaic device 1h. For example, the junction material 38 may be disposed on the first and second wires 42 and 43 of the wiring sheet 40. The junction material 38 may be disposed between each pair of those first and second electrodes 11 and 13 which are adjacent in the first direction. The junction material 38 may be disposed between each pair of those first electrodes 11 which are adjacent in the second direction. The junction material 38 may be disposed between each pair of those second electrodes 13 which are adjacent in the second direction.

The junction material 38 connects the wiring sheet 40 mechanically to a face of the photovoltaic device 1h on which the first electrodes 11 and the second electrodes 13 are formed. The junction material 38 in the present embodiment is disposed not only in the regions surrounded by the wiring sheet 40 and the first-direction-wise adjacent first and second electrodes 11 and 13, but also in the regions surrounded by the wiring sheet 40 and the second-direction-wise adjacent first electrodes 11 (see FIG. 32) and in the regions surrounded by the wiring sheet 40 and the second-direction-wise adjacent second electrodes 13. In this structure, the wiring sheet 40 is mechanically connected to the photovoltaic device 1h with improved mechanical connection strength. Then, the first electrodes 11 are brought into contact with the first wires 42 to connect the first electrodes 11 electrically to the first wires 42, and the second electrodes 13 are brought into contact with the second wires 43 to connect the second electrodes 13 electrically to the second wires 43. That concludes manufacture of the photovoltaic module 51 in accordance with the present embodiment.

An exemplary method of manufacturing the photovoltaic device 1h included in the photovoltaic module 51 will be described in accordance with the present embodiment in reference to FIGS. 4 to 7, 14, and 35 to 39. The method of manufacturing the photovoltaic device 1h basically includes the same steps and achieves the same effects as the method of manufacturing the photovoltaic device 1 in accordance with Embodiment 1, and differs in the shape of a first opening 22h of a first mask 21h, the shape of a second opening 27h of a second mask 26h, the shape of the first amorphous semiconductor film 7h, and the arrangement pattern of the second amorphous semiconductor film 9h.

Irregularities are formed on the first face 2a of the semiconductor substrate 2 in the step shown in FIG. 4. The third amorphous semiconductor film 3 and the antireflection coat 4 are then formed on the first face 2a of the semiconductor substrate 2 in the steps shown in FIGS. 5 and 6. The i-type amorphous semiconductor film 5 is formed on the second face 2b of the semiconductor substrate 2 in the step shown in FIG. 7.

Figure 35:
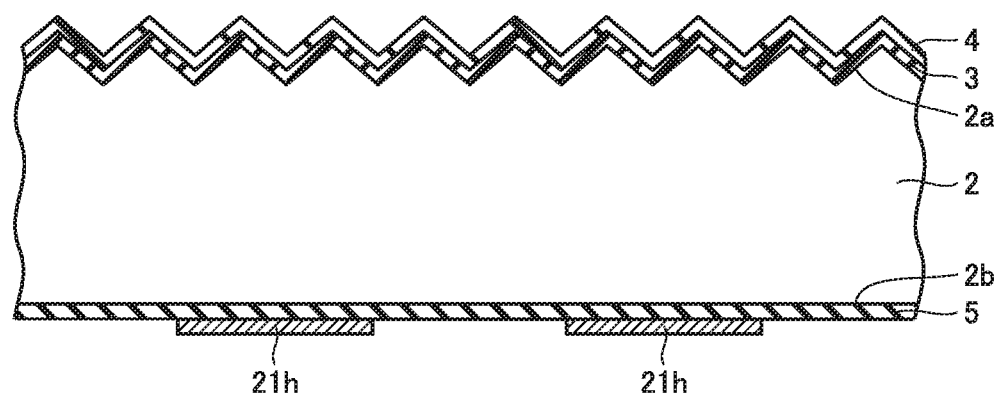
FIG. 35 is a schematic cross-sectional view taken along cross-sectional line XXXI-XXXI in FIG. 33(A), illustrating one of steps of a method of manufacturing the photovoltaic device included in the photovoltaic module in accordance with Embodiment 9.
Figure 36:
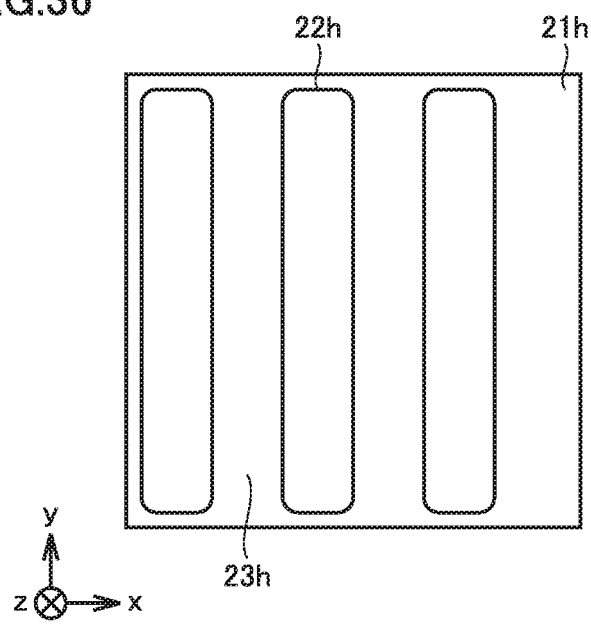
FIG. 36 is a schematic plan view of a first mask used in the step shown in FIG. 35 in the method of manufacturing the photovoltaic device included in the photovoltaic module in accordance with Embodiment 9.

Referring to FIGS. 35 and 36, the first mask 21h having the first opening 22h is placed on the i-type amorphous semiconductor film 5. The first opening 22h of the first mask 21h is arranged in stripes extending in the second direction. The first opening 22h of the first mask 21h is, in the first direction, divided into a plurality of sections by a first bridge section 23h. These sections of the first opening 22h of the first mask 21h are elongate in the second direction and separated in the first direction by the first bridge section 23h of the first mask 21h.

Each section of the first opening 22h of the first mask 21h may have a rectangular shape with first rounded corners (see FIG. 36) and may alternatively be shaped like a circle, a polygon, or a polygon with first rounded corners. These circles and first rounded corners may have a radius of curvature of from 1 µm to 10 mm inclusive, preferably from 10 µm to 1 mm inclusive. The first mask 21h may be, for example, a metal mask.

Figure 37:
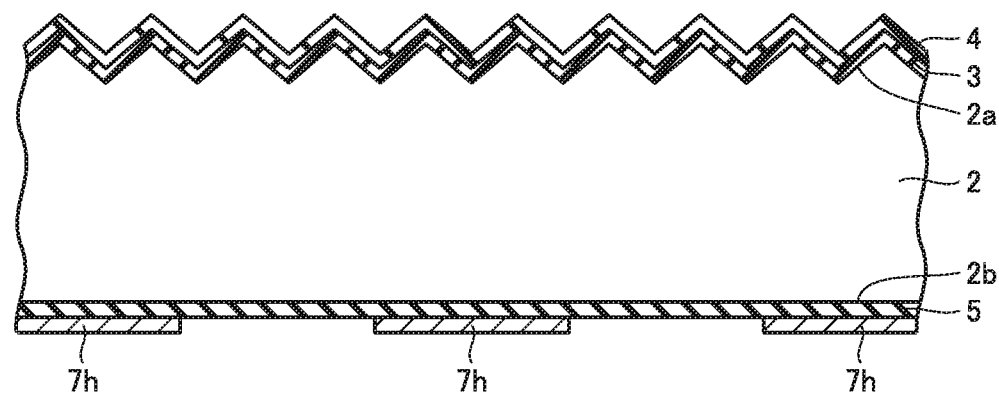
FIG. 37 is a schematic cross-sectional view illustrating a step carried out subsequent to the step shown in FIG. 35 in the method of manufacturing the photovoltaic device included in the photovoltaic module in accordance with Embodiment 9.

Referring to FIG. 37, the first amorphous semiconductor film 7h is formed on those regions of the second face 2b of the semiconductor substrate 2 where the first opening 22h of the first mask 21h resides. More specifically, the first amorphous semiconductor film 7h is formed on those regions of the i-type amorphous semiconductor film 5 where the first opening 22h of the first mask 21h resides. The first amorphous semiconductor film 7h is not necessarily formed by any particular method and may be formed, for example, by plasma-enhanced chemical vapor deposition (CVD). The first mask 21h is subsequently removed.

Figure 38:
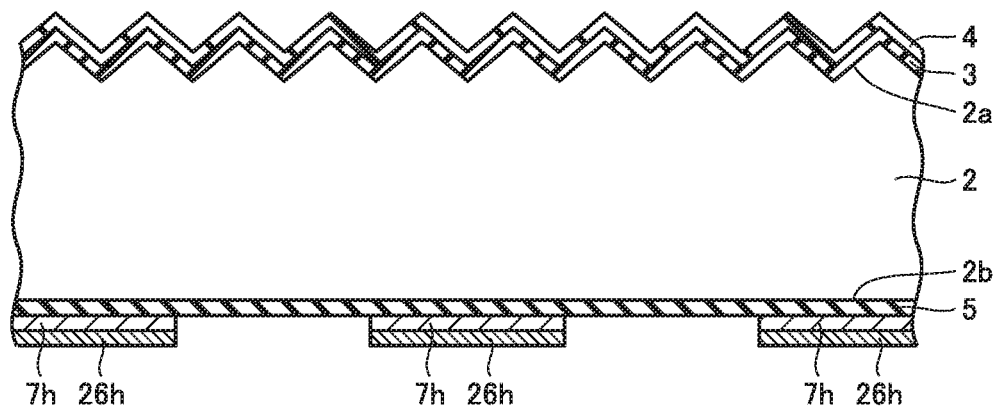
FIG. 38 is a schematic cross-sectional view illustrating a step carried out subsequent to the step shown in FIG. 37 in the method of manufacturing the photovoltaic device included in the photovoltaic module in accordance with Embodiment 9.
Figure 39:
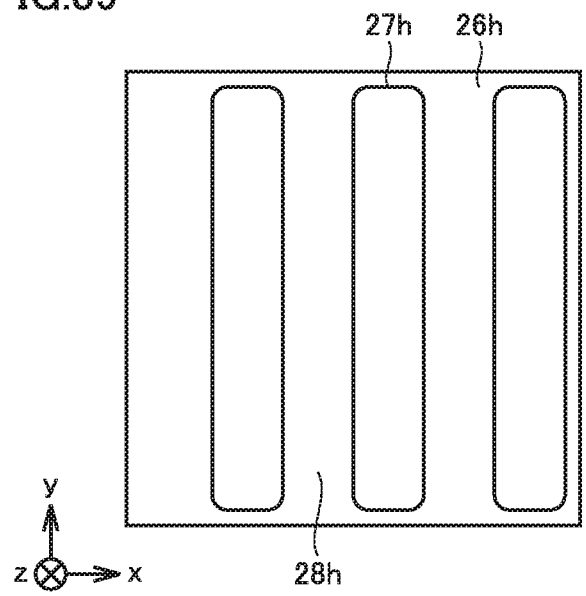
FIG. 39 is a schematic plan view of a second mask used in the step shown in FIG. 38 in the method of manufacturing the photovoltaic device included in the photovoltaic module in accordance with Embodiment 9.

Referring to FIGS. 38 and 39, the second mask 26h having the second opening 27h is placed on the first amorphous semiconductor film 7h. The second opening 27h of the second mask 26h is arranged in stripes extending in the second direction. The second opening 27h of the second mask 26h is, in the first direction, divided into a plurality of sections by a third bridge section 28h. These sections of the second opening 27h of the second mask 26h are elongate in the second direction and separated in the first direction by the third bridge section 28h of the second mask 26h.

Each section of the second opening 27h of the second mask 26h may have a rectangular shape with second rounded corners (see FIG. 39) and may alternatively be shaped like a circle, a polygon, or a polygon with second rounded corners. These circles and second rounded corners may have a radius of curvature of from 1 µm to 10 mm inclusive, preferably from 10 µm to 1 mm inclusive. The second mask 26h may be, for example, a metal mask.

Figure 40:
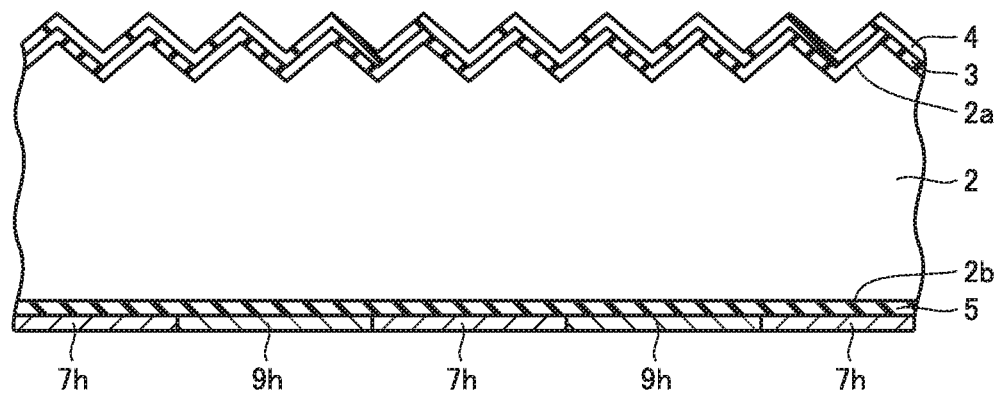
FIG. 40 is a schematic cross-sectional view illustrating a step carried out subsequent to the step shown in FIG. 38 in the method of manufacturing the photovoltaic device included in the photovoltaic module in accordance with Embodiment 9.

Referring to FIG. 40, the second amorphous semiconductor film 9h is formed on those regions of the second face 2b of the semiconductor substrate 2 where the second opening 27h of the second mask 26h resides. More specifically, the second amorphous semiconductor film 9h is formed on those regions of the i-type amorphous semiconductor film 5 where the second opening 27h of the second mask 26h resides. The second amorphous semiconductor film 9h is not necessarily formed by any particular method and may be formed, for example, by plasma-enhanced chemical vapor deposition (CVD). The second mask 26h is subsequently removed.

Figure 33:
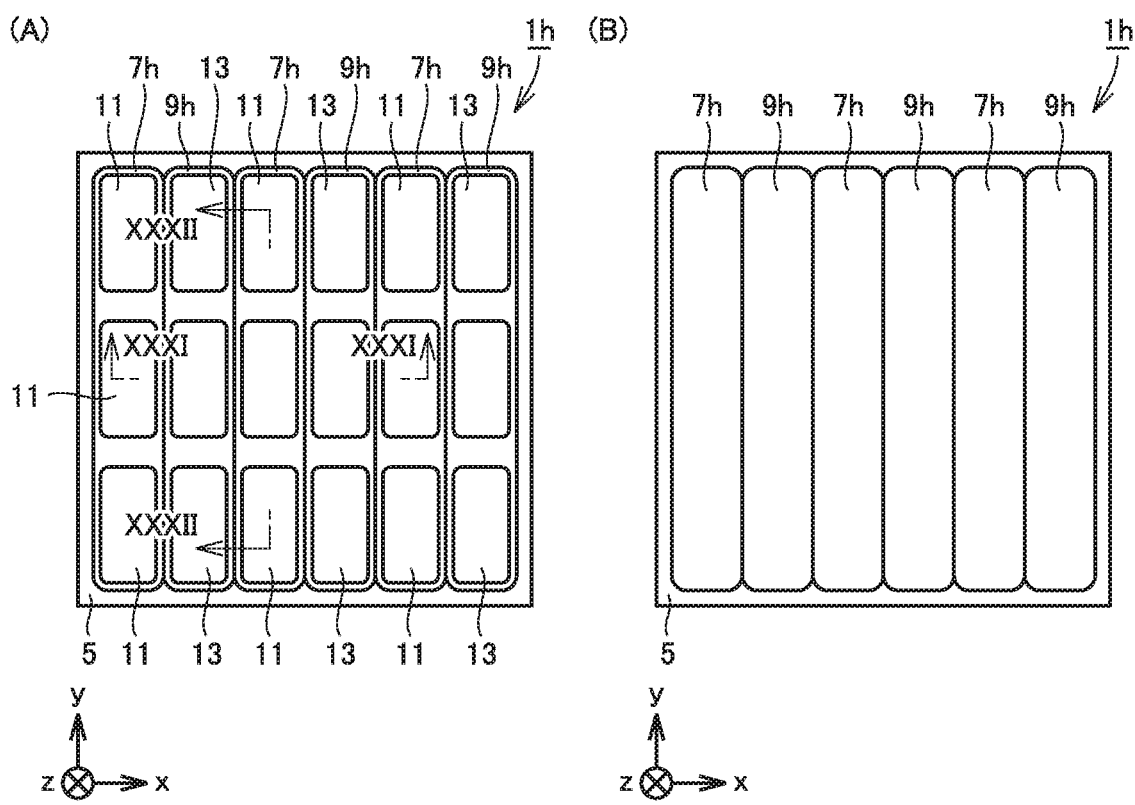
FIG. 33(A) is a schematic plan view of a photovoltaic device included in the photovoltaic module in accordance with Embodiment 9 as viewed from a second face side of a semiconductor substrate.
FIG. 33(B) is a schematic plan view of the photovoltaic device included in the photovoltaic module in accordance with Embodiment 9 as viewed from the second face side of the semiconductor substrate with first electrodes and second electrodes being omitted.

Next, the first electrodes 11 are formed on the first amorphous semiconductor film 7h. The first electrodes 11 may be formed respectively on the sections of the first amorphous semiconductor film 7. The second electrodes 13 are formed on the second amorphous semiconductor film 9. The second electrodes 13 may be formed respectively on the sections of the second amorphous semiconductor film 9. The third mask 31 having the third opening 32 shown in FIG. 14 may be used to form the first electrodes 11 on the first amorphous semiconductor film 7 and to form the second electrodes 13 on the second amorphous semiconductor film 9. The third mask 31 is subsequently removed. The photovoltaic device 1h in accordance with the present embodiment shown in FIGS. 31 to 33 is obtained in this manner.

Effects of the photovoltaic module 51 and the method of manufacturing the photovoltaic module 51 in accordance with the present embodiment will be described.

The photovoltaic module 51 in accordance with the present embodiment includes the photovoltaic device 1h and the wiring sheet 40. The photovoltaic device 1h includes the semiconductor substrate 2, the first amorphous semiconductor film 7h of the first conductivity type, the second amorphous semiconductor film 9h of the second conductivity type that differs from the first conductivity type, the first electrodes 11, and the second electrodes 13. The semiconductor substrate 2 has the first face 2a and the second face 2b opposite the first face 2a. The semiconductor substrate 2 is a monocrystal semiconductor substrate. The semiconductor substrate 2 stretches both in the first direction and in the second direction that intersects the first direction. The first amorphous semiconductor film 7h is disposed on the second face 2b of the semiconductor substrate 2. The second amorphous semiconductor film 9h is disposed on the second face 2b of the semiconductor substrate 2. The first electrodes 11 are separated in the first direction and the second direction. The second electrodes 13 are separated in the first direction and the second direction. The photovoltaic device 1*h* is mechanically connected to the wiring sheet 40 using the junction material 38. The junction material 38 is disposed at least either in the regions surrounded by the wiring sheet 40 and the adjacent first electrodes 11 or in the regions surrounded by the wiring sheet 40 and the adjacent second electrodes 13. The wiring sheet 40 includes the first wires 42 and the second wires 43. The first wires 42 are electrically connected to the first electrodes 11. The second wires 43 are electrically connected to the second electrodes 13.

In the photovoltaic 51 in accordance with the present embodiment, the junction material 38 is disposed at least either in the regions surrounded by the wiring sheet 40 and the adjacent first electrodes 11 or in the regions surrounded by the wiring sheet 40 and the adjacent second electrodes 13. Therefore, the junction material 38 provides an increased junction area for the photovoltaic device 1*h* and the wiring sheet 40. As a result, the photovoltaic module 51 in accordance with the present embodiment can impart improved mechanical connection strength to the photovoltaic device 1*h* and the wiring sheet 40.

In the photovoltaic module 51 in accordance with the present embodiment, the first electrodes 11 are separated not only in the first direction, but also in the second direction that intersects the first direction. Therefore, some of the first electrodes 11 could possibly come off the first amorphous semiconductor film 7*h*, but the other first electrodes 11 will not come off the first amorphous semiconductor film 7*h*. The photovoltaic module 51 in accordance with the present embodiment hence has a low defective rate. In the photovoltaic module 51 in accordance with the present embodiment, the second electrodes 13 are separated not only in the first direction, but also in the second direction that intersects the first direction. Therefore, some of the second electrodes 13 could possibly come off the second amorphous semiconductor film 9*h*, but the other second electrodes 13 will not come off the second amorphous semiconductor film 9*h*. The photovoltaic module 51 in accordance with the present embodiment hence has a low defective rate.

In the photovoltaic module 51 in accordance with the present embodiment, at least one of the first electrodes 11 and the second electrodes 13 may be shaped like a circle, a polygon, or a polygon with third rounded corners when viewed from the second face 2*b* side of the semiconductor substrate 2. The carriers (electrons or holes) generated in the semiconductor substrate 2 by the light incident on the first face 2*a* side of the semiconductor substrate 2 move to the first electrodes 11 or the second electrodes 13. At least one of the first electrodes 11 and the second electrodes 13 is shaped like a circle, a polygon, or a polygon with third rounded corners when viewed from the second face 2*b* side of the semiconductor substrate 2. This structure can restrain the carriers from accumulating in a particular part of the first electrodes 11 or the second electrodes 13, thereby suppressing temperature rises in this particular part. That can in turn restrain the first electrodes 11 and the second electrodes 13 from being degraded or coming off the semiconductor substrate 2 due to a temperature rise in the first electrodes 11 or the second electrodes 13.

In the photovoltaic module 51 in accordance with the present embodiment, these circles and third rounded corners may have a radius of curvature of from 1 μm to 10 mm inclusive. This structure can restrain the carriers (electrons or holes) generated in the semiconductor substrate 2 by the light incident on the first face 2*a* side of the semiconductor substrate 2 from accumulating in a particular part of the first electrodes 11 or the second electrodes 13, thereby further suppressing temperature rises in this particular part. That can in turn further restrain the first electrodes 11 and the second electrodes 13 from being degraded or coming off the semiconductor substrate 2 due to a temperature rise in the first electrodes 11 or the second electrodes 13.

In the photovoltaic module 51 in accordance with the present embodiment, at least one of the distance separating the second-direction-wise adjacent first electrodes 11 and the distance separating the second-direction-wise adjacent second electrodes 13 may be less than or equal to the diffusion length in the semiconductor substrate 2 of minority carriers generated in the semiconductor substrate 2 by the light incident on the first face 2*a* side of the semiconductor substrate 2. In this structure, the minority carriers can be efficiently collected through either the first electrodes 11 or the second electrodes 13.

In the photovoltaic module 51 in accordance with the present embodiment, at least one of the distance separating the second-direction-wise adjacent first electrodes 11 and the distance separating the second-direction-wise adjacent second electrodes 13 may be from 30 μm to 1 mm inclusive. At least one of the distance separating the second-direction-wise adjacent first electrodes 11 and the distance separating the second-direction-wise adjacent second electrodes 13 is not smaller than 30 μm. This structure can impart further improved mechanical connection strength to the photovoltaic device 1*h* and the wiring sheet 40. At least one of the distance separating the second-direction-wise adjacent first electrodes 11 and the distance separating the second-direction-wise adjacent second electrodes 13 is not larger than 1 mm. This structure can prevent excess drop in light-energy-to-electric-energy conversion efficiency in the photovoltaic module 51 in accordance with the present embodiment.

In the photovoltaic module 51 in accordance with the present embodiment, the distance separating the second-direction-wise adjacent first electrodes 11 may be from one thousandth to one tenth inclusive, of the second-direction length of each first electrode 11. The distance separating the second-direction-wise adjacent first electrodes 11 is not smaller than one thousandth of the second-direction length of each first electrode 11. This structure can impart further improved mechanical connection strength to the photovoltaic device 1*h* and the wiring sheet 40. The distance separating the second-direction-wise adjacent first electrodes 11 is not larger than one tenth of the second-direction length of each first electrode 11. This structure can prevent excess drop in light-energy-to-electric-energy conversion efficiency in the photovoltaic module 51 in accordance with the present embodiment.

In the photovoltaic module 51 in accordance with the present embodiment, the distance separating the second-direction-wise adjacent second electrodes 13 may be from one thousandth to one tenth inclusive, of the second-direction length of each second electrode 13. The distance separating the second-direction-wise adjacent second electrodes 13 is not smaller than one thousandth of the second-direction length of each second electrode 13. This structure can impart further improved mechanical connection strength to the photovoltaic device 1*h* and the wiring sheet 40. The distance separating the second-direction-wise adjacent second electrodes 13 is not larger than one tenth of the second-direction length of each second electrode 13. This structure can prevent excess drop in light-energy-to-electric-energy conversion efficiency in the photovoltaic module 51 in accordance with the present embodiment.

The photovoltaic module 51 in accordance with the present embodiment may further include the i-type amorphous semiconductor film 5 between the semiconductor substrate 2 and the first amorphous semiconductor film 7h and between the semiconductor substrate 2 and the second amorphous semiconductor film 9h. The i-type amorphous semiconductor film 5 can limit recombination of carriers (electrons or holes) generated in the semiconductor substrate 2 by the light incident on the first face 2a side of the semiconductor substrate 2. The photovoltaic module 51 in accordance with the present embodiment can hence further improve the light-energy-to-electric-energy conversion efficiency.

The method of manufacturing the photovoltaic module 51 in accordance with the present embodiment includes the following steps. The photovoltaic device 1h is prepared. The photovoltaic device 1h includes the semiconductor substrate 2, the first amorphous semiconductor film 7h of the first conductivity type, the second amorphous semiconductor film 9h of the second conductivity type that differs from the first conductivity type, the first electrodes 11, and the second electrodes 13. The semiconductor substrate 2 has the first face 2a and the second face 2b opposite the first face 2a. The semiconductor substrate 2 is a monocrystal semiconductor substrate. The semiconductor substrate 2 stretches both in the first direction and in the second direction that intersects the first direction. The first amorphous semiconductor film 7h is disposed on the second face 2b of the semiconductor substrate 2. The second amorphous semiconductor film 9h is disposed on the second face 2b of the semiconductor substrate 2. The first electrodes 11 are separated in the first direction and the second direction. The second electrodes 13 are separated in the first direction and the second direction. The wiring sheet 40, including the first wires 42 and the second wires 43, is prepared. The junction material 38 is provided on at least one of the wiring sheet 40 and the photovoltaic device 1h. The photovoltaic device 1h is mechanically connected to the wiring sheet 40 using the junction material 38. The junction material 38 is disposed at least either in the regions surrounded by the wiring sheet 40 and the adjacent first electrodes 11 or in the regions surrounded by the wiring sheet 40 and the adjacent second electrodes 13. The first wires 42 are electrically connected to the first electrodes 11. The second wires 43 are electrically connected to the second electrodes 13.

According to the method of manufacturing the photovoltaic module 51 in accordance with the present embodiment, the junction material 38 is disposed at least either in the regions surrounded by the wiring sheet 40 and the adjacent first electrodes 11 or in the regions surrounded by the wiring sheet 40 and the adjacent second electrodes 13. Therefore, the junction material 38 provides an increased junction area for the photovoltaic device 1h and the wiring sheet 40. As a result, the method of manufacturing the photovoltaic module 51 in accordance with the present embodiment can impart improved mechanical connection strength to the photovoltaic device 1h and the wiring sheet 40.

According to the method of manufacturing the photovoltaic module 51 in accordance with the present embodiment, the first electrodes 11 are separated not only in the first direction, but also in the second direction that intersects the first direction. Therefore, some of the first electrodes 11 could possibly come off the first amorphous semiconductor film 7h, but the other first electrodes 11 will not come off the first amorphous semiconductor film 7h. As a result, the photovoltaic module 51 can be manufactured at an improved non-defective product rate. According to the photovoltaic module 51 in accordance with the present embodiment, the second electrodes 13 are separated not only in the first direction, but also in the second direction that intersects the first direction. Therefore, some of the second electrodes 13 could possibly come off the second amorphous semiconductor film 9h, but the other second electrodes 13 will not come off the second amorphous semiconductor film 9h. According to the method of manufacturing the photovoltaic module 51 in accordance with the present embodiment, the photovoltaic module 51 can hence be manufactured at an improved non-defective product rate.

In the method of manufacturing the photovoltaic module 51 in accordance with the present embodiment, the preparation of the photovoltaic device 1h may involve forming the first electrodes 11 and the second electrodes 13 using the third mask 31 having the fifth bridge section 33, the sixth bridge section 34, and the third opening 32. The third opening 32 may be divided into a plurality of sections in the first direction by the fifth bridge section 33 and in the second direction by the sixth bridge section 34. The third mask 31 has the sixth bridge section 34 as well as the fifth bridge section 33, and both the sixth bridge section 34 and the fifth bridge section 33 can impart improved mechanical strength to the third mask 31. This structure can restrain the third mask 31 from warping, thereby rendering the third opening less likely to deform, when the first electrodes 11 and the second electrodes 13 are formed using the third mask 31. According to the method of manufacturing the photovoltaic module 51 in accordance with the present embodiment, the first electrodes 11 and the second electrodes 13 can hence be formed in a more accurate pattern.

In the method of manufacturing the photovoltaic module 51 in accordance with the present embodiment, each section of the third opening 32 of the third mask 31 may be shaped like a circle, a polygon, or a polygon with third rounded corners. The carriers (electrons or holes) generated in the semiconductor substrate 2 by the light incident on the first face 2a side of the semiconductor substrate 2 move to the first electrodes 11 or the second electrodes 13 formed on the second face 2b of the semiconductor substrate 2. According to the method of manufacturing the photovoltaic module 51 in accordance with the present embodiment, at least one of the first electrodes 11 and the second electrodes 13 is shaped like a circle, a polygon, or a polygon with third rounded corners when viewed from the second face 2b side of the semiconductor substrate 2. This structure can restrain the carriers from accumulating in a particular part of the first electrodes 11 or the second electrodes 13, thereby suppressing temperature rises in this particular part. That can in turn restrain the first electrodes 11 and the second electrodes 13 from being degraded or coming off the semiconductor substrate 2 due to a temperature rise in the first electrodes 11 or the second electrodes 13.

In the method of manufacturing the photovoltaic module 51 in accordance with the present embodiment, these circles and third rounded corners may have a radius of curvature of from 1 μm to 10 mm inclusive. This structure can restrain the carriers (electrons or holes) generated in the semiconductor substrate 2 by the light incident on the first face 2a side of the semiconductor substrate 2 from accumulating in a particular part of the first electrodes 11 or the second electrodes 13, thereby further suppressing temperature rises in this particular part. That can in turn further restrain the first electrodes 11 and the second electrodes 13 from being degraded or coming off the semiconductor substrate 2 due to a temperature rise in the first electrodes 11 or the second electrodes 13.

In the method of manufacturing the photovoltaic module 51 in accordance with the present embodiment, the width of the sixth bridge section 34 may be less than or equal to the diffusion length in the semiconductor substrate 2 of minority carriers generated in the semiconductor substrate 2 by the light incident on the first face 2a side of the semiconductor substrate 2. By using the third mask 31 having the sixth bridge section 34, the distance separating the second-direction-wise adjacent first electrodes 11 can be rendered less than or equal to the diffusion length in the semiconductor substrate 2 of minority carriers generated in the semiconductor substrate 2 by the light incident on the first face 2a side of the semiconductor substrate 2. By using the third mask 31, the distance separating the second-direction-wise adjacent second electrodes 13 can be rendered less than or equal to the diffusion length in the semiconductor substrate 2 of minority carriers generated in the semiconductor substrate 2 by the light incident on the first face 2a side of the semiconductor substrate 2. In this structure, the minority carriers can hence be efficiently collected through the first electrodes 11 or the second electrodes 13.

In the method of manufacturing the photovoltaic module 51 in accordance with the present embodiment, the width of the sixth bridge section 34 may be from 30 μm to 1 mm inclusive. By using the third mask 31 having the sixth bridge section 34, the distance separating the second-direction-wise adjacent first electrodes 11 can be rendered not smaller than 30 μm. By using the third mask 31 having the sixth bridge section 34, the distance separating the second-direction-wise adjacent second electrodes 13 can be rendered not smaller than 30 μm. This structure enlarges the regions surrounded by the wiring sheet 40 and the adjacent first electrodes 11 and the regions surrounded by the wiring sheet 40 and the adjacent second electrodes 13, thereby enabling the junction material 38 to provide a further increased junction area for the photovoltaic device 1h and the wiring sheet 40. That in turn imparts further improved mechanical connection strength to the photovoltaic device 1h and the wiring sheet 40. In addition, by using the third mask 31 having the sixth bridge section 34, the distance separating the second-direction-wise adjacent first electrodes 11 can be rendered not larger than 1 mm. By using the third mask 31 having the sixth bridge section 34, the distance separating the second-direction-wise adjacent second electrodes 13 can be rendered not larger than 1 mm. This structure can prevent excess drop in light-energy-to-electric-energy conversion efficiency in the photovoltaic module 51.

In the method of manufacturing the photovoltaic module 51 in accordance with the present embodiment, the width of the sixth bridge section 34 may be from one thousandth to one tenth inclusive, of the second-direction length of each section of the third opening 32 of the third mask 31. By using the third mask 31 having the sixth bridge section 34, the distance separating the second-direction-wise adjacent first electrodes 11 can be rendered not smaller than one thousandth of the second-direction length of each first electrode 11. By using the third mask 31, the distance separating the second-direction-wise adjacent second electrodes 13 can be rendered not smaller than one thousandth of the second-direction length of each second electrode 13. This structure enlarges the regions surrounded by the wiring sheet 40 and the adjacent first electrodes 11 and the regions surrounded by the wiring sheet 40 and the adjacent second electrodes 13, thereby enabling the junction material 38 to provide a further increased junction area for the photovoltaic device 1h and the wiring sheet 40. That in turn imparts further improved mechanical connection strength to the photovoltaic device 1h and the wiring sheet 40. In addition, by using the third mask 31 having the sixth bridge section 34, the distance separating the second-direction-wise adjacent first electrodes 11 can be rendered not larger than one tenth of the second-direction length of each first electrode 11. By using the third mask 31, the distance separating the second-direction-wise adjacent second electrodes 13 can be rendered not larger than one tenth of the second-direction length of each second electrode 13. This structure can prevent excess drop in light-energy-to-electric-energy conversion efficiency in the photovoltaic module 51.

In the method of manufacturing the photovoltaic module 51 in accordance with the present embodiment, the preparation of the photovoltaic device 1h may further involve forming the i-type amorphous semiconductor film 5 between the semiconductor substrate 2 and the first amorphous semiconductor film 7h and between the semiconductor substrate 2 and the second amorphous semiconductor film 9h. The i-type amorphous semiconductor film 5 can limit recombination of carriers (electrons or holes) generated in the semiconductor substrate 2 by the light incident on the first face 2a side of the semiconductor substrate 2. The method of manufacturing the photovoltaic module 51 in accordance with the present embodiment can hence further improve the light-energy-to-electric-energy conversion efficiency.

As a first variation example of the present embodiment, an n-type monocrystal silicon substrate, an n-type amorphous semiconductor film, and a p-type amorphous semiconductor film may be used respectively as the semiconductor substrate 2, the first amorphous semiconductor film 7h, and the second amorphous semiconductor film 9h. As a second variation example of the present embodiment, a p-type monocrystal silicon substrate, a p-type amorphous semiconductor film, and an n-type amorphous semiconductor film may be used respectively as the semiconductor substrate 2, the first amorphous semiconductor film 7h, and the second amorphous semiconductor film 9h. As a third variation example of the present embodiment, a p-type monocrystal silicon substrate, an n-type amorphous semiconductor film, and a p-type amorphous semiconductor film may be used respectively as the semiconductor substrate 2, the first amorphous semiconductor film 7h, and the second amorphous semiconductor film 9h.

Embodiment 10

Figure 41:
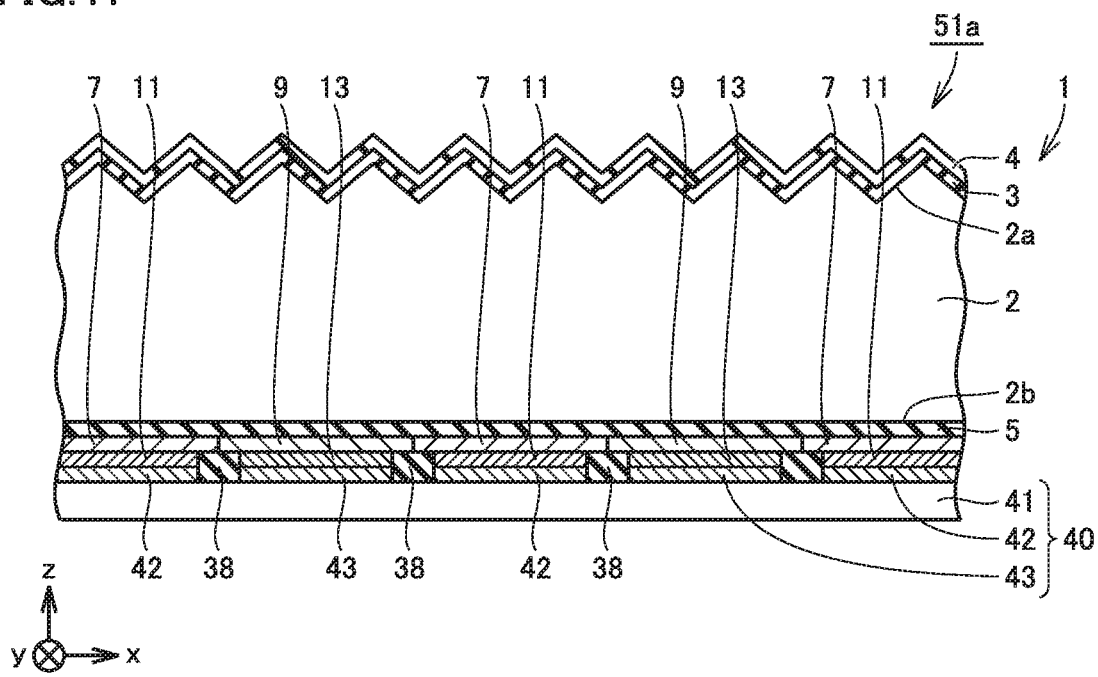
FIG. 41 is a schematic cross-sectional view of a photovoltaic module in accordance with Embodiment 10, taken along cross-sectional line XLI-XLI in FIG. 43(A).
Figure 42:
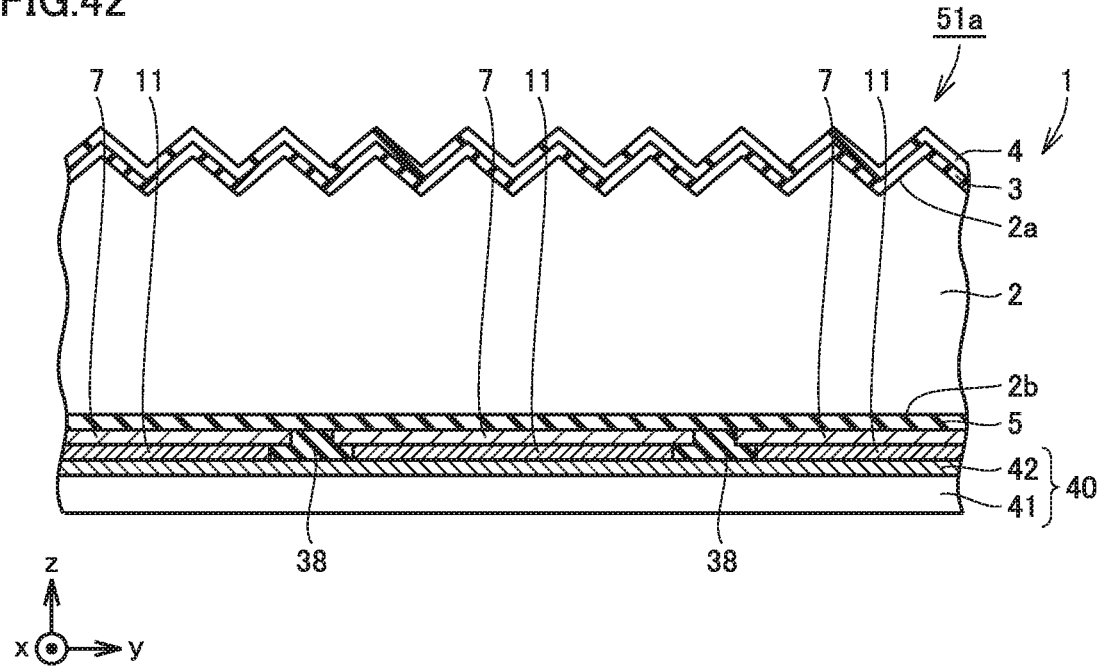
FIG. 42 is a schematic cross-sectional view of the photovoltaic module in accordance with Embodiment 10, taken along cross-sectional line XLII-XLII in FIG. 43(A).
Figure 43:
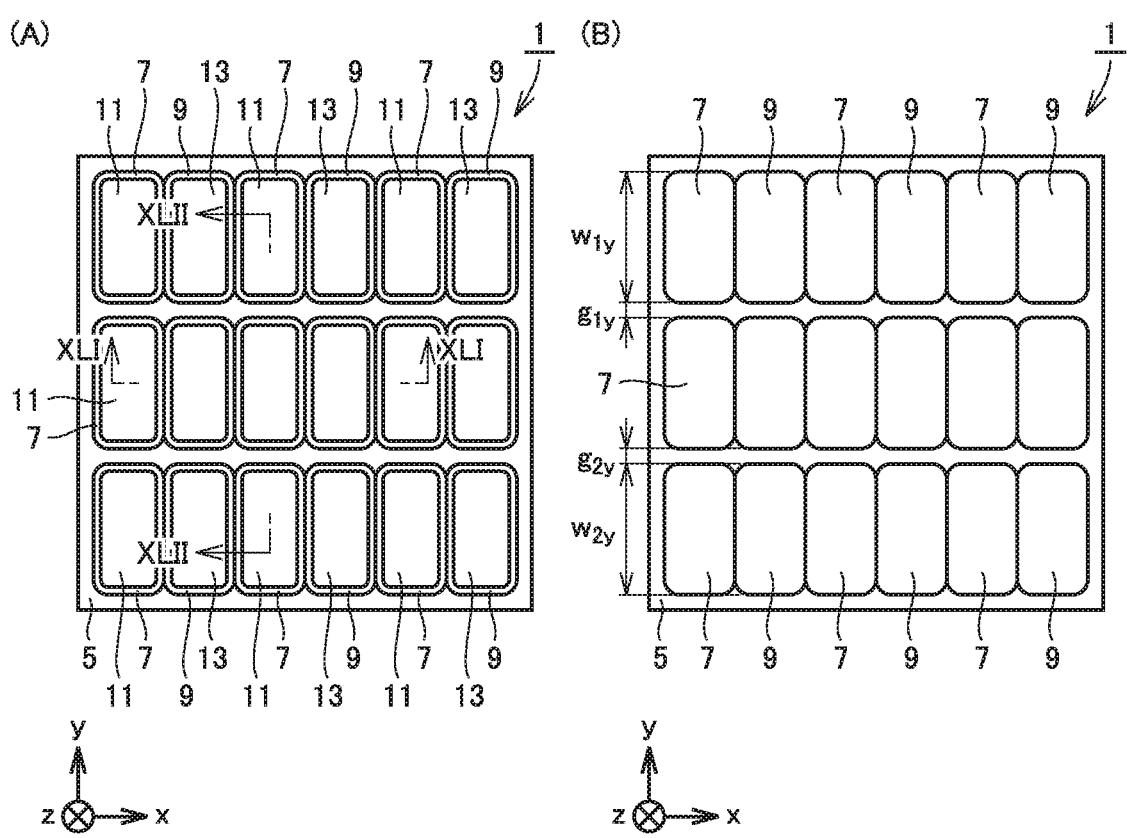
FIG. 43(A) is a schematic plan view of a photovoltaic device included in the photovoltaic module in accordance with Embodiment 10 as viewed from a second face side of a semiconductor substrate.
FIG. 43(B) is a schematic plan view of the photovoltaic device included in the photovoltaic module in accordance with Embodiment 10 as viewed from the second face side of the semiconductor substrate with first electrodes and second electrodes being omitted.
Figure 44:
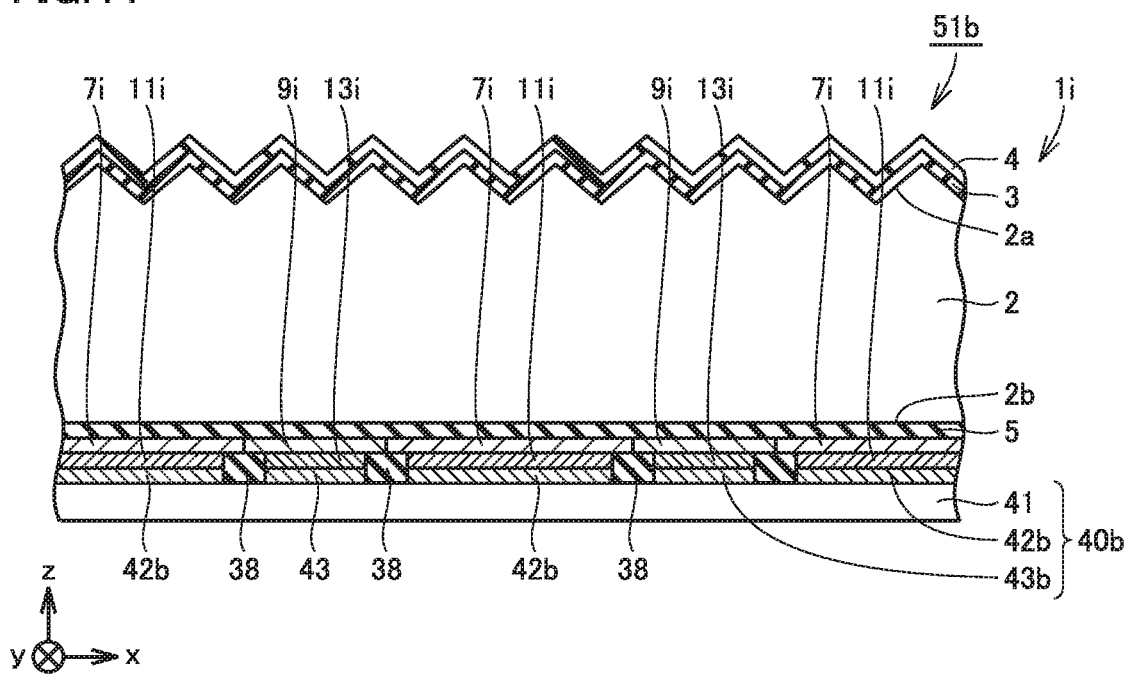
FIG. 44 is a schematic cross-sectional view of a photovoltaic module in accordance with Embodiment 11, taken along cross-sectional line XLIV-XLIV in FIG. 46(A).
Figure 45:
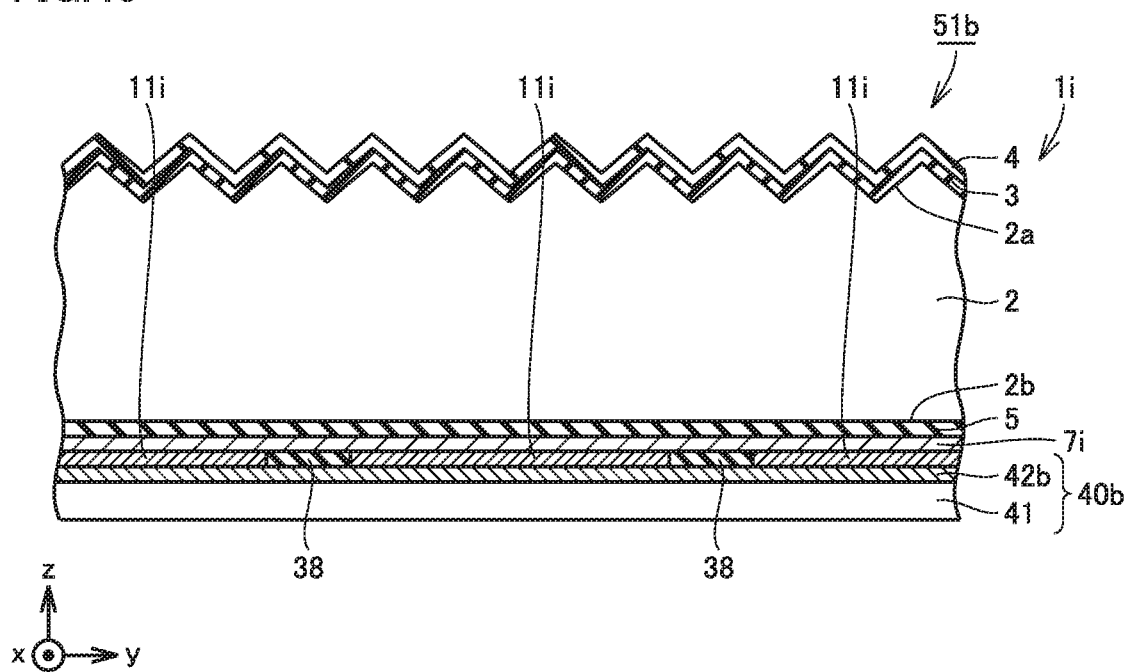
FIG. 45 is a schematic cross-sectional view of the photovoltaic module in accordance with Embodiment 11, taken along cross-sectional line XLV-XLV in FIG. 46(A).
Figure 46:
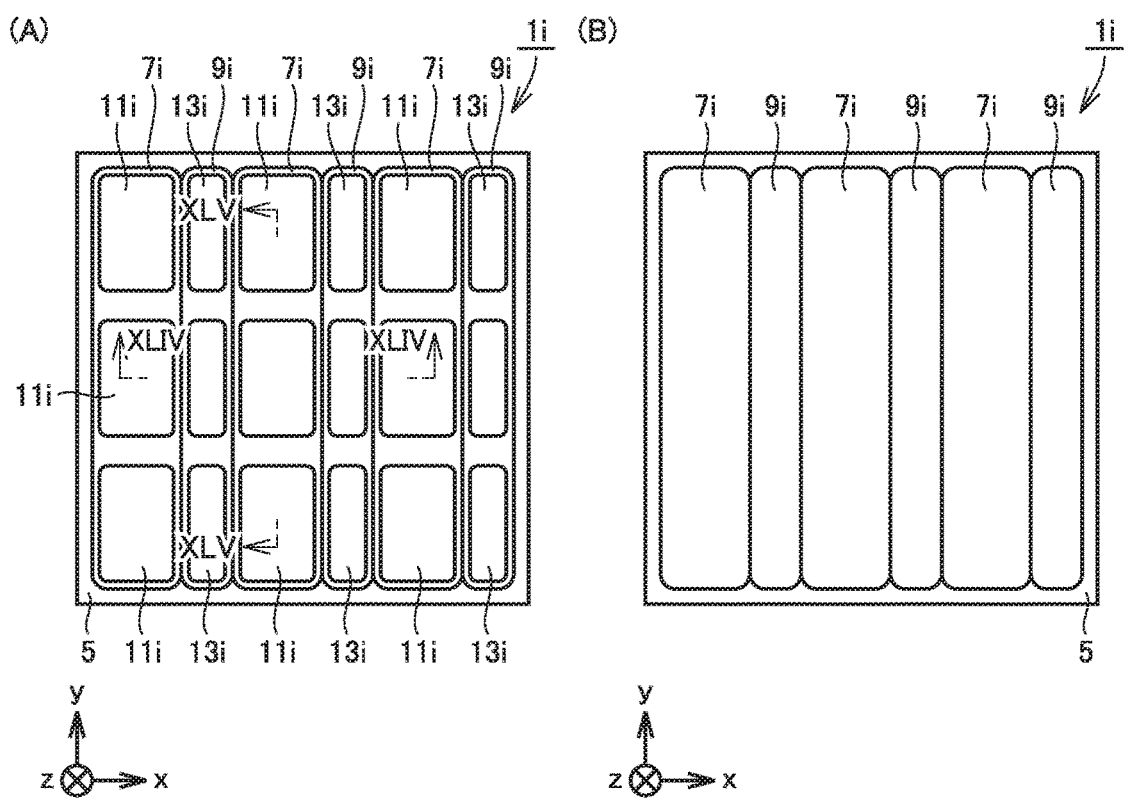
FIG. 46(A) is a schematic plan view of a photovoltaic device included in the photovoltaic module in accordance with Embodiment 11 as viewed from a second face side of a semiconductor substrate.
FIG. 46(B) is a schematic plan view of the photovoltaic device included in the photovoltaic module in accordance with Embodiment 11 as viewed from the second face side of the semiconductor substrate with first electrodes and second electrodes being omitted.
Figure 47:
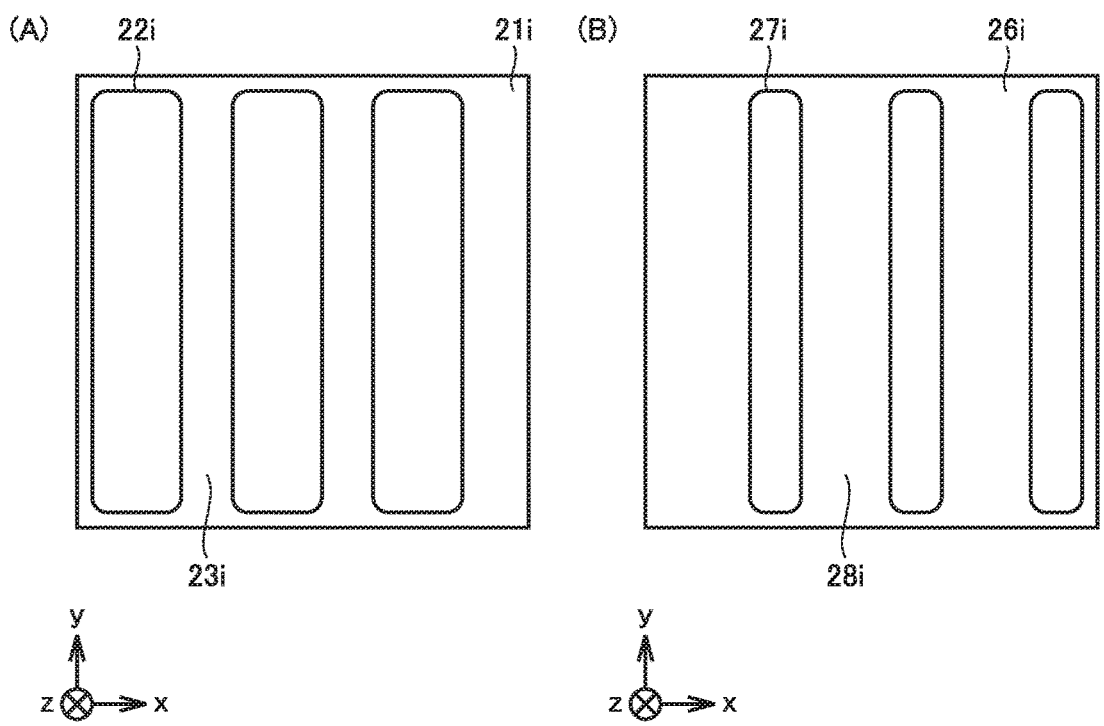
FIG. 47(A) is a schematic plan view of a first mask used in a method of manufacturing the photovoltaic device included in the photovoltaic module in accordance with Embodiment 11.
FIG. 47(B) is a schematic plan view of a second mask used in the method of manufacturing the photovoltaic device included in the photovoltaic module in accordance with Embodiment 11.

A photovoltaic module 51a and a method of manufacturing the photovoltaic module 51a will be described in accordance with Embodiment 10 in reference to FIGS. 41 to 43. The photovoltaic module 51a in accordance with the present embodiment basically has the same configuration and achieves the same effects as the photovoltaic module 51 in accordance with Embodiment 9 shown in FIGS. 31 to 34, and differs in the shape of the first amorphous semiconductor film 7 and the shape of the second amorphous semiconductor film 9.

The photovoltaic module 51a in accordance with the present embodiment includes the photovoltaic device 1 in accordance with Embodiment 1. Referring to FIGS. 43(A) and 43(B), the photovoltaic device 1 in accordance with the present embodiment has a configuration similar to that of the photovoltaic device 1h in accordance with Embodiment 9. In the photovoltaic device 1 in accordance with the present embodiment, however, the first amorphous semiconductor film 7 and the second amorphous semiconductor film 9 are divided into a plurality of sections not only in the first direction, but also in the second direction, when viewed from the second face 2b side of the semiconductor substrate 2. The sections of the first amorphous semiconductor film 7 and the sections of the second amorphous semiconductor film 9 in the present embodiment are arranged in lattice patterns on the second face 2b of the semiconductor substrate 2. The sections of the first amorphous semiconductor film 7 and the sections of the second amorphous semiconductor film 9 are not necessarily arranged in lattice patterns and may alternatively be arranged in triangular lattice patterns or non-cyclic patterns.

An exemplary method of manufacturing the photovoltaic module 51a in accordance with the present embodiment basically includes the same steps and achieves the same effects as the method of manufacturing the photovoltaic module 51 in accordance with Embodiment 9, and differs in the shape of the sections of the first opening 22 of the first mask 21 (see FIG. 9) and the shape of the sections of the second opening 27 of the second mask 26 (see FIG. 12). In the present embodiment, the first amorphous semiconductor film 7 is formed using the first mask 21 shown in FIG. 9, and the second amorphous semiconductor film 9 is formed using the second mask 26 shown in FIG. 12.

The exemplary method of manufacturing the photovoltaic module 51a in accordance with the present embodiment includes the following steps. The photovoltaic device 1 is prepared by the manufacturing method described in Embodiment 1. The wiring sheet 40 is prepared. The wiring sheet 40 may be manufactured by the method described in Embodiment 9. The wiring sheet 40 is then mechanically connected to the photovoltaic device 1 using the junction material 38. The photovoltaic device 1 is electrically connected to the wiring sheet 40.

The photovoltaic module 51a in accordance with the present embodiment achieves the following effects in addition to those achieved by the photovoltaic module 51 in accordance with Embodiment 9.

In the photovoltaic module 51a in accordance with the present embodiment, the first amorphous semiconductor film 7 and the second amorphous semiconductor film 9 are divided into a plurality of sections in the second direction. The photovoltaic module 51a in accordance with the present embodiment, in the second direction, has regions where neither the first amorphous semiconductor film 7 of the first conductivity type nor the second amorphous semiconductor film 9 of the second conductivity type is formed. This structure can reduce the area of the poorly heat resistant, first amorphous semiconductor film 7 of the first conductivity type and the area of the poorly heat resistant, second amorphous semiconductor film 9 of the second conductivity type. The photovoltaic module 51a in accordance with the present embodiment hence exhibits an improved heat resistance.

In the photovoltaic module 51a in accordance with the present embodiment, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 may be less than or equal to the diffusion length in the semiconductor substrate 2 of minority carriers generated in the semiconductor substrate 2 by the light incident on the first face 2a side of the semiconductor substrate 2. In this structure, the minority carriers can be efficiently collected through either the first amorphous semiconductor film 7 and the first electrodes 11 or the second amorphous semiconductor film 9 and the second electrodes 13.

In the photovoltaic module 51a in accordance with the present embodiment, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 may be from 30 μm to 1 mm inclusive. At least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 is not smaller than 30 μm. This structure can reduce the area of at least one of the poorly heat resistant, first amorphous semiconductor film 7 of the first conductivity type and the poorly heat resistant, second amorphous semiconductor film 9 of the second conductivity type. The photovoltaic module 51a in accordance with the present embodiment hence exhibits a further improved heat resistance. In addition, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 is not larger than 1 mm. This structure can prevent excess drop in light-energy-to-electric-energy conversion efficiency in the photovoltaic module 51a.

In the photovoltaic module 51a in accordance with the present embodiment, the distance $g_{1y}$ separating the second-direction-wise adjacent sections of the first amorphous semiconductor film 7 may be from one thousandth to one tenth inclusive, of the second-direction length, $w_{1y}$, of each section of the first amorphous semiconductor film 7. The distance $g_{1y}$ separating the second-direction-wise adjacent sections of the first amorphous semiconductor film 7 is not smaller than one thousandth of the second-direction length, $w_{1y}$, of each section of the first amorphous semiconductor film 7. This structure can reduce the area of the poorly heat resistant, first amorphous semiconductor film 7 of the first conductivity type. The photovoltaic module 51a in accordance with the present embodiment hence exhibits a further improved heat resistance. Additionally, the distance $g_{1y}$ separating the second-direction-wise adjacent sections of the first amorphous semiconductor film 7 is not larger than one tenth of the second-direction length, $w_{1y}$, of each section of the first amorphous semiconductor film 7. This structure can prevent excess drop in light-energy-to-electric-energy conversion efficiency in the photovoltaic module 51a.

In the photovoltaic module 51a in accordance with the present embodiment, the distance $g_{2y}$ separating the second-direction-wise adjacent sections of the second amorphous semiconductor film 9 may be from one thousandth to one tenth inclusive, of the second-direction length, $w_{2y}$, of each section of the second amorphous semiconductor film 9. The distance $g_{2y}$ separating the second-direction-wise adjacent sections of the second amorphous semiconductor film 9 is not smaller than one thousandth of the second-direction length, $w_{2y}$, of each section of the second amorphous semiconductor film 9. This structure can reduce the area of the poorly heat resistant, second amorphous semiconductor film 9 of the second conductivity type. The photovoltaic module 51a in accordance with the present embodiment hence exhibits a further improved heat resistance. Furthermore, the distance $g_{2y}$ separating the second-direction-wise adjacent sections of the second amorphous semiconductor film 9 is not larger than one tenth of the second-direction length, $w_{2y}$, of each section of the second amorphous semiconductor film 9. This structure can prevent excess drop in light-energy-to-electric-energy conversion efficiency in the photovoltaic module 51a.

The method of manufacturing the photovoltaic module 51a in accordance with the present embodiment achieves the Mowing effects in addition to those achieved by the method of manufacturing the photovoltaic module 51 in accordance with Embodiment 9.

According to the method of manufacturing the photovoltaic module 51a in accordance with the present embodiment, the first amorphous semiconductor film 7 and the second amorphous semiconductor film 9 are, in the second direction, divided into a plurality of sections. According to the method of manufacturing the photovoltaic module 51a in accordance with the present embodiment, the resultant photovoltaic module 51a, in the second direction, has regions where neither the first amorphous semiconductor film 7 of the first conductivity type nor the second amorphous semiconductor film 9 of the second conductivity type is formed. Therefore, the method can reduce the area of the poorly heat resistant, first amorphous semiconductor film 7 of the first conductivity type and the area of the poorly heat resistant, second amorphous semiconductor film 9 of the second conductivity type. According to the method of manufacturing the photovoltaic module 51a in accordance with the present embodiment, the resultant photovoltaic module 51a exhibits an improved heat resistance.

In the method of manufacturing the photovoltaic module 51a in accordance with the present embodiment, at least one of the second-direction width of the second bridge section 24 of the first mask 21 (see FIG. 9) and the second-direction width of the fourth bridge section 29 of the second mask 26 (see FIG. 12) may be less than or equal to the diffusion length in the semiconductor substrate 2 of minority carriers generated in the semiconductor substrate 2 by the light incident on the first face 2a side of the semiconductor substrate 2. By using at least one of the first mask 21 having the second bridge section 24 and the second mask 26 having the fourth bridge section 29, at least one of the distance $g_{1y}$ separating the second-direction-wise adjacent sections of the first amorphous semiconductor film 7 and the distance $g_{2y}$ separating the second-direction-vise adjacent sections of the second amorphous semiconductor film 9 can be rendered less than or equal to the diffusion length in the semiconductor substrate 2 of minority carriers generated in the semiconductor substrate 2 by the light incident on the first face 2a side of the semiconductor substrate 2. According to the method of manufacturing the photovoltaic module 51a in accordance with the present embodiment, the minority carriers can hence be efficiently collected through either the first amorphous semiconductor film 7 and the first electrodes 11 or the second amorphous semiconductor film 9 and the second electrodes 13.

In the method of manufacturing the photovoltaic module 51a in accordance with the present embodiment, at least one of the second-direction width of the second bridge section 24 of the first mask 21 (see FIG. 9) and the second-direction width of the fourth bridge section 29 of the second mask 26 (see FIG. 12) may be from 30 µm to 1 mm inclusive. By using at least one of the first mask 21 having the second bridge section 24 and the second mask 26 having the fourth bridge section 29, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 can be rendered not smaller than 30 µm. This structure can reduce the area of at least one of the poorly heat resistant, first amorphous semiconductor film 7 of the first conductivity type and the poorly heat resistant, second amorphous semiconductor film 9 of the second conductivity type. According to the method of manufacturing the photovoltaic module 51a in accordance with the present embodiment, the resultant photovoltaic module 51a hence exhibits a further improved heat resistance. In addition, at least one of the second-direction width of the second bridge section 24 of the first mask 21 and the second-direction width of the fourth bridge section 29 of the second mask 26 is not smaller than 30 µm. This structure can impart improved mechanical strength to at least one of the first mask 21 and the second mask 26. That can in turn restrain at least one of the first mask 21 and the second mask 26 from warping, thereby rendering at least one of the first opening 22 and the second opening 27 less likely to deform, when at least one of the first amorphous semiconductor film 7 and the second amorphous semiconductor film 9 is formed using at least one of the first mask 21 and the second mask 26. According to the method of manufacturing the photovoltaic module 51a in accordance with the present embodiment, at least one of the first amorphous semiconductor film 7 and the second amorphous semiconductor film 9 can hence be formed in a more accurate pattern. Furthermore, by using at least one of the first mask 21 having the second bridge section 24 and the second mask 26 having the fourth bridge section 29, at least one of the distance $g_{1y}$ separating the second-direction-wise adjacent sections of the first amorphous semiconductor film 7 and the distance $g_{2y}$ separating the second-direction-wise adjacent sections of the second amorphous semiconductor film 9 can be rendered not larger than 1 mm. The method of manufacturing the photovoltaic module 51a in accordance with the present embodiment can hence prevent excess drop in light-energy-to-electric-energy conversion efficiency in the photovoltaic module 51a.

In the method of manufacturing the photovoltaic module 51a in accordance with the present embodiment, the second-direction width of the second bridge section 24 of the first mask 21 (see FIG. 9) may be from one thousandth to one tenth inclusive, of the second-direction length, $w_{3y}$, of the first opening 22 of the first mask 21. By using the first mask 21 having the second bridge section 24, the distance $g_{1y}$ separating the second-direction-wise adjacent sections of the first amorphous semiconductor film 7 can be rendered not smaller than one thousandth of the second-direction length, $w_{1y}$, of each section of the first amorphous semiconductor film 7. This structure can reduce the area of the poorly heat resistant, first amorphous semiconductor film 7 of the first conductivity type. According to the method of manufacturing the photovoltaic module 51a in accordance with the present embodiment, the resultant photovoltaic module 51a hence exhibits a further improved heat resistance. Additionally, the second-direction width of the second bridge section 24 of the first mask 21 is not smaller than one thousandth of the second-direction length, $w_{3y}$, of the first opening 22 of the first mask 21. This structure can impart improved mechanical strength to the first mask 21. The structure can restrain the first mask 21 from warping, thereby rendering the first opening 22 less likely to deform, when the first amorphous semiconductor film 7 is form using the first mask 21. According to the method of manufacturing the photovoltaic module 51a in accordance with the present embodiment, the first amorphous semiconductor film 7 can hence be formed in a more accurate pattern. Furthermore, by using the first mask 21 having the second bridge section 24, the distance $g_{1y}$ separating the second-direction-wise adjacent sections of the first amorphous semiconductor film 7 can be rendered not larger than one tenth of the second-direction length, $w_{1y}$, of each section of the first amorphous semiconductor film 7. The method of manufacturing the photovoltaic module 51a in accordance with the present embodiment can hence prevent excess drop in light-energy-to-electric-energy conversion efficiency in the photovoltaic module 51a.

In the method of manufacturing the photovoltaic module 51a in accordance with the present embodiment, the second-direction width of the fourth bridge section 29 of the second mask 26 (see FIG. 12) may be from one thousandth to one tenth inclusive, of the second-direction length, $w_{4y}$, of the second opening 27 of the second mask 26. By using the second mask 26 having the fourth bridge section 29, the distance $g_{2y}$ separating the second-direction-wise adjacent sections of the second amorphous semiconductor film 9 can be rendered not smaller than one thousandth of the second-direction length, $w_{2y}$, of each section of the second amorphous semiconductor film 9. This structure can reduce the area of the poorly heat resistant, second amorphous semiconductor film 9 of the second conductivity type. According to the method of manufacturing the photovoltaic module 51a in accordance with the present embodiment, the resultant photovoltaic module 51a hence exhibits a further improved heat resistance. In addition, the second-direction width of the fourth bridge section 29 of the second mask 26 is not smaller than one thousandth of the second-direction length, $w_{4y}$, of the second opening 27 of the second mask 26. This structure can impart improved mechanical strength to the second mask 26. That can in turn restrain the second mask 26 from warping, thereby rendering the second opening 27 less likely to deform, when the second amorphous semiconductor film 9 is formed using the second mask 26. According to the method of manufacturing the photovoltaic module 51a in accordance with the present embodiment, the second amorphous semiconductor film 9 can hence be formed in a more accurate pattern. Additionally, by using the second mask 26 having the fourth bridge section 29, the distance $g_{2y}$ separating the second-direction-wise adjacent sections of the second amorphous semiconductor film 9 can be rendered not larger than one tenth of the second-direction length, $w_{2y}$, of each section of the second amorphous semiconductor film 9. The method of manufacturing the photovoltaic module 51a in accordance with the present embodiment can hence prevent excess drop in light-energy-to-electric-energy conversion efficiency in the photovoltaic module 51a.

Embodiment 11

A photovoltaic module 51b and a method of manufacturing the photovoltaic module 51b will be described in accordance with Embodiment 11 in reference to FIGS. 44 to 48. The photovoltaic module 51b in accordance with the present embodiment basically has the same configuration and achieves the same effects as the photovoltaic module 51 in accordance with Embodiment 9 shown in FIGS. 31 to 34, and differs in that a first amorphous semiconductor film 7i has a larger area than a second amorphous semiconductor film 9i, first electrodes 11i have a larger total area than second electrodes 13i, and each first electrode 11i has a larger area than each second electrode 13i, when viewed from the second face 2b side of the semiconductor substrate 2.

The photovoltaic module 51b in accordance with the present embodiment includes a photovoltaic device 1i. Referring to FIGS. 46(A) and 46(B), the photovoltaic device 1i in accordance with the present embodiment has a configuration similar to that of the photovoltaic device 1h in accordance with Embodiment 9. In the photovoltaic device 1i in accordance with the present embodiment, however, the first amorphous semiconductor film 7i has a larger area than the second amorphous semiconductor film 9i when viewed from the second face 2b side of the semiconductor substrate 2. Specifically; each section of the first amorphous semiconductor film 7i has a larger area than each section of the second amorphous semiconductor film 9i when viewed from the second face 2b side of the semiconductor substrate 2. More specifically, each section of the first amorphous semiconductor film 7i has a larger first-direction length than does each section of the second amorphous semiconductor film 9i. The first electrodes 11i have a larger total area than the second electrodes 13i when viewed from the second face 2b side of the semiconductor substrate 2. Specifically, each first electrode 11i has a larger area than each second electrode 13i. More specifically, each first electrode 11i has a larger first-direction length than does each second electrode 13i. The first electrodes 11i shown in FIG. 46(A) have the same configuration as the first electrodes 11a in accordance with Embodiment 2 shown in FIG. 15(A), and the second electrodes 13i shown in FIG. 46(A) have the same configuration as the second electrodes 13a in accordance with Embodiment 2 shown in FIG. 15(A).

An exemplary method of manufacturing the photovoltaic module 51b in accordance with the present embodiment basically includes the same steps and achieves the same effects as the method of manufacturing the photovoltaic module 51 in accordance with Embodiment 1. The preparation of the photovoltaic device 1i involves forming the first amorphous semiconductor film 7i that has a larger area than the second amorphous semiconductor film 9i when viewed from the second face 2b side of the semiconductor substrate 2. In the present embodiment, the first amorphous semiconductor film 7i is formed using a first mask 21i shown in FIG. 47(A), the second amorphous semiconductor film 9i is formed using a second mask 26i shown in FIG. 47(B), and the first electrodes 11i and the second electrodes 13i are formed using a third mask 31i shown in FIG. 48. The third mask 31i shown in FIG. 48 has the same configuration as the third mask 31a in accordance with Embodiment 2 shown in FIG. 16(C). A third opening 32i of the third mask 31i has a plurality of sections that is separated in the first direction by a fifth bridge section 33i and in the second direction by a sixth bridge section 34i.

Referring to FIGS. 47(A) and 47(B), a first opening 22i of the first mask 21i has a larger area than a second opening 27i of the second mask 26i. Specifically, each section of the first opening 22i of the first mask 21i has a larger area than each section of the second opening 27i of the second mask 26i. More specifically, each section of the first opening 22i of the first mask 21i has a larger first-direction length than does each section of the second opening 27i of the second mask 26i. The first opening 22i of the first mask 21i is, in the first direction, divided into these sections by a first bridge section 23i. The second opening 27i of the second mask 26i is, in the first direction, divided into these sections by a third bridge section 28i.

Figure 48:
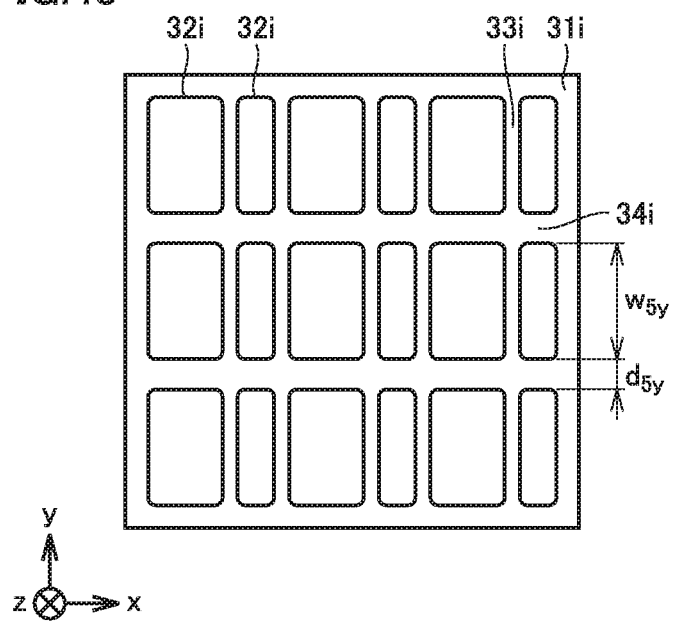
FIG. 48 is a schematic plan view of a third mask used in the method of manufacturing the photovoltaic device included in the photovoltaic module in accordance with Embodiment 11.
Figure 49:
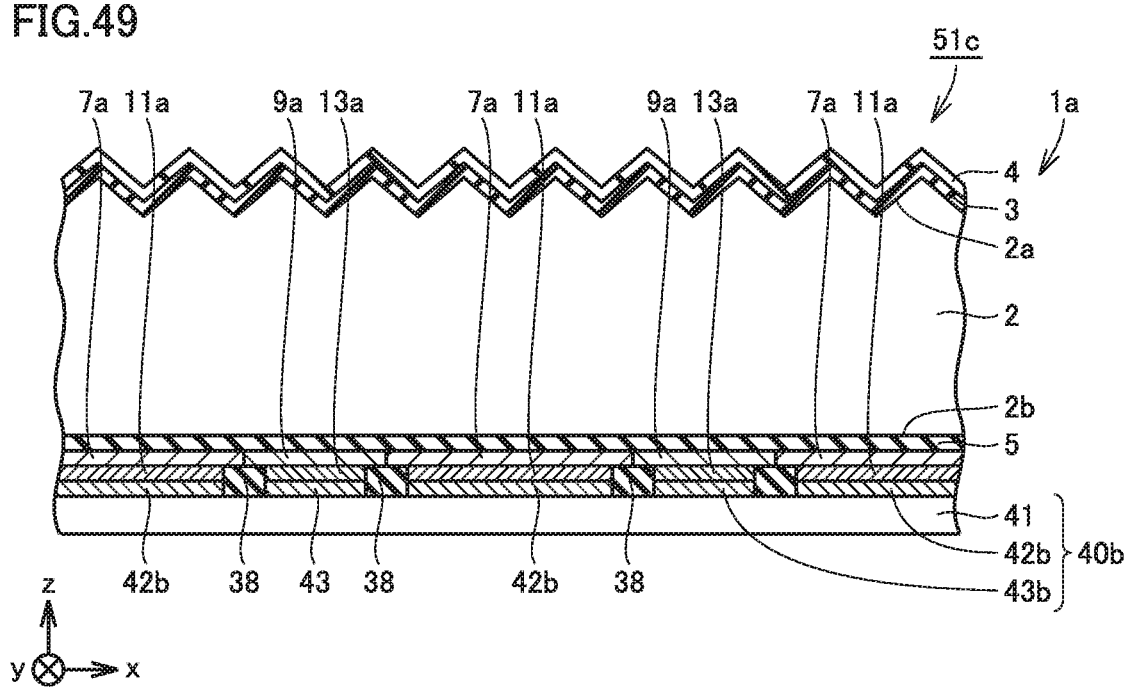
FIG. 49 is a schematic cross-sectional view of a photovoltaic module in accordance with Embodiment 12, taken along cross-sectional line XLIX-XLIX in FIG. 51(A).
Figure 50:
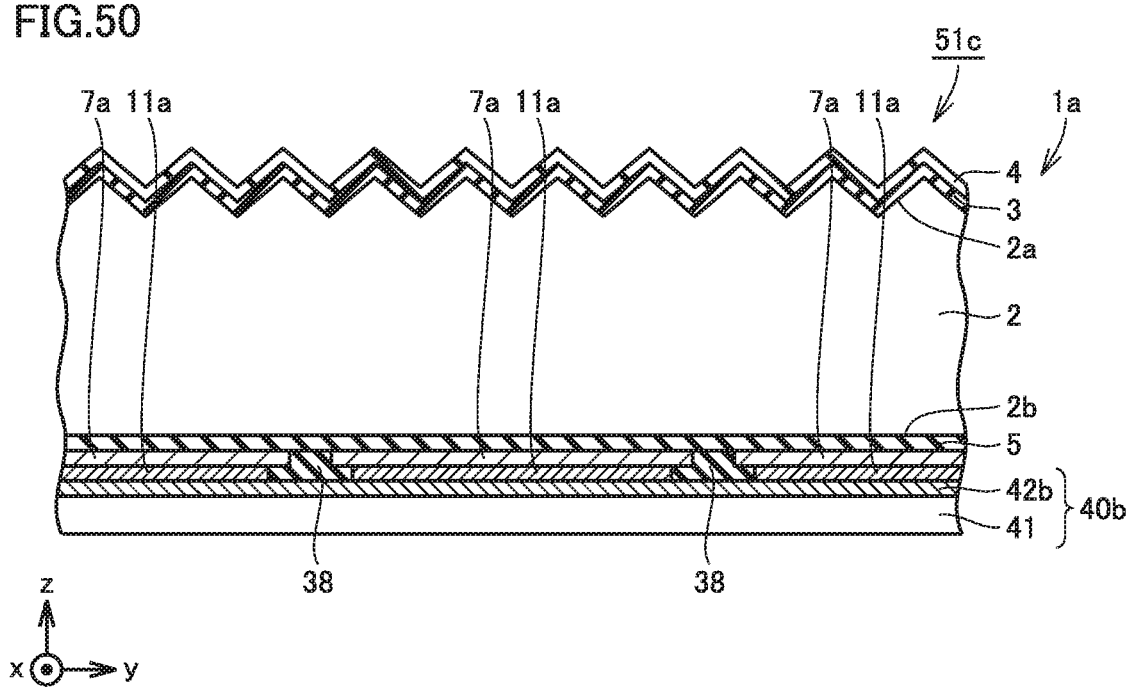
FIG. 50 is a schematic cross-sectional view of the photovoltaic module in accordance with Embodiment 12, taken along cross-sectional line L-L in FIG. 51(A).

Referring to FIG. 48, that third opening 32i of the third mask 31i which corresponds to the first electrodes 11i has a larger area than that third opening 32i of the third mask 31i which corresponds to the second electrodes 13i. Specifically, each section of the third opening 32i that corresponds to one of the first electrodes 11i has a larger area than each section of the third opening 32i that corresponds to one of the second electrodes 13i. More specifically, each section of the third opening 32i that corresponds to one of the first electrodes 11i has a larger first-direction length than does each section of the third opening 32i that corresponds to one of the second electrodes 13i.

The photovoltaic module 51*b* in accordance with the present embodiment achieves the following effects in addition to those achieved by the photovoltaic module 51 in accordance with Embodiment 9. In the photovoltaic module 51*b* in accordance with the present embodiment, the first amorphous semiconductor film 7*i* has a larger area than the second amorphous semiconductor film 9*i* when viewed from the second face 2*b* side of the semiconductor substrate 2. The photovoltaic module 51*b* in accordance with the present embodiment allows the area ratio of the first amorphous semiconductor film 7*i* to the semiconductor substrate 2 and the area ratio of the second amorphous semiconductor film 9*i* to the semiconductor substrate 2 to be freely altered. As an example, electric current collection in the photovoltaic device 1*b* can be improved by increasing the proportion of the area of the first amorphous semiconductor film 7*i* which is composed of a p-type amorphous silicon film to the area of the semiconductor substrate 2 which is composed of an n-type monocrystal semiconductor substrate, as viewed from the second face 2*b* side of the semiconductor substrate 2. On the other hand, passivation characteristics in the photovoltaic device 1*i* can be improved by increasing the proportion of the area of the second amorphous semiconductor film 9*i* which is composed of an n-type amorphous silicon film to the area of the semiconductor substrate 2 which is composed of an n-type monocrystal semiconductor substrate, as viewed from the second face 2*b* side of the semiconductor substrate 2. The photovoltaic module 51*b* in accordance with the present embodiment allows for greater freedom in design.

The method of manufacturing the photovoltaic module 51*b* in accordance with the present embodiment achieves the following effects in addition to those achieved by the method of manufacturing the photovoltaic module 51 in accordance with Embodiment 9. In the method of manufacturing the photovoltaic module 51*b* in accordance with the present embodiment, the preparation of the photovoltaic device 1*i* involves forming the first amorphous semiconductor film 7*i* that has a larger area than the second amorphous semiconductor film 9*i* when viewed from the second face 2*b* side of the semiconductor substrate 2. The method of manufacturing the photovoltaic module 51*b* in accordance with the present embodiment allows the area ratio of the first amorphous semiconductor film 7*i* to the semiconductor substrate 2 and the area ratio of the second amorphous semiconductor film 9*i* to the semiconductor substrate 2 to be freely altered. As an example, electric current collection in the photovoltaic device 1*b* can be improved by increasing the proportion of the area of the first amorphous semiconductor film 7*i* which is composed of a p-type amorphous silicon film to the area of the semiconductor substrate 2 which is composed of an n-type monocrystal semiconductor substrate, as viewed from the second face 2*b* side of the semiconductor substrate 2. On the other hand, passivation characteristics in the photovoltaic device 1*i* can be improved by increasing the proportion of the area of the second amorphous semiconductor film 9*i* which is composed of an n-type amorphous silicon film to the area of the semiconductor substrate 2 which is composed of an n-type monocrystal semiconductor substrate, as viewed from the second face 2*b* side of the semiconductor substrate 2. According to the method of manufacturing the photovoltaic module 51*b* in accordance with the present embodiment, the resultant photovoltaic module 51*b* thus allows for greater freedom in design.

Embodiment 12

A photovoltaic module 51*c* and a method of manufacturing the photovoltaic module 51*c* will be described in accordance with Embodiment 12 in reference to FIGS. 49 to 51(B). The photovoltaic module 51*c* in accordance with the present embodiment basically has the same configuration and achieves the same effects as the photovoltaic module 51*b* in accordance with Embodiment 11 shown in FIGS. 21 to 23(B), and differs in the shape of the first amorphous semiconductor film 7*a* and the shape of the second amorphous semiconductor film 9*a*.

Figure 51:
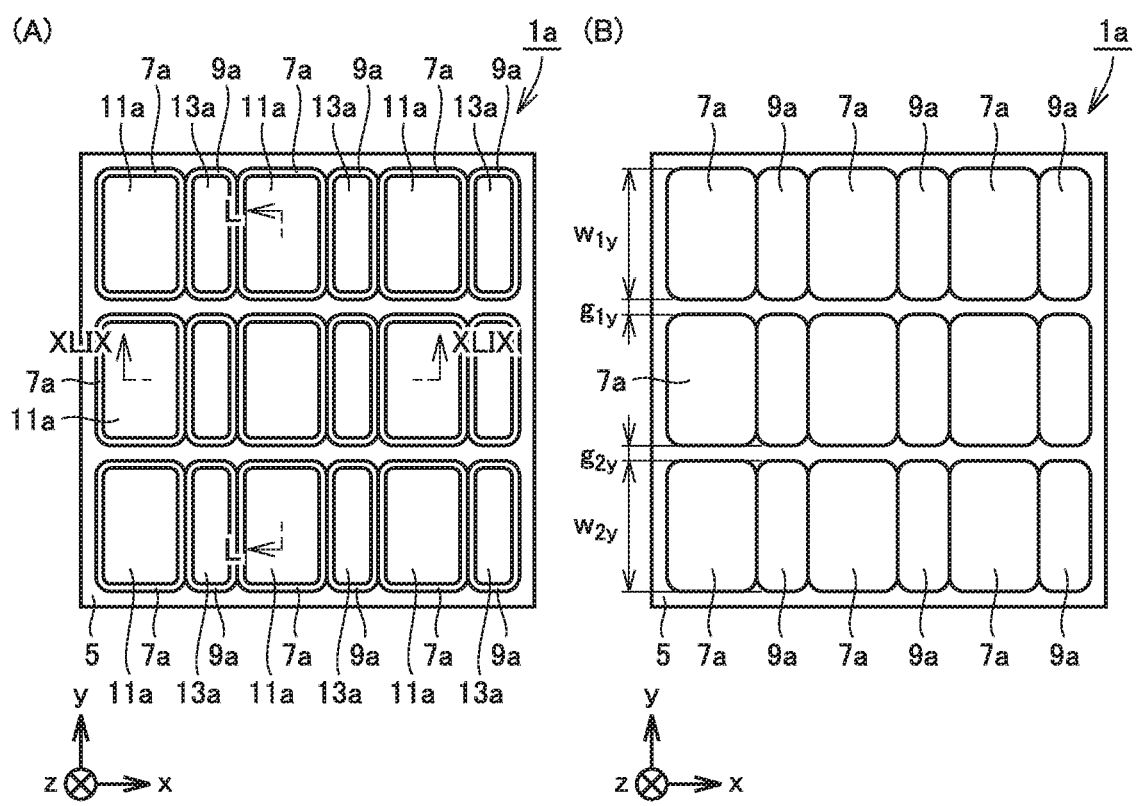
FIG. 51(A) is a schematic plan view of a photovoltaic device included in the photovoltaic module in accordance with Embodiment 12 as viewed from a second face side of a semiconductor substrate.
FIG. 51(B) is a schematic plan view of the photovoltaic device included in the photovoltaic module in accordance with Embodiment 12 as viewed from the second face side of the semiconductor substrate with first electrodes and second electrodes being omitted.
Figure 52:
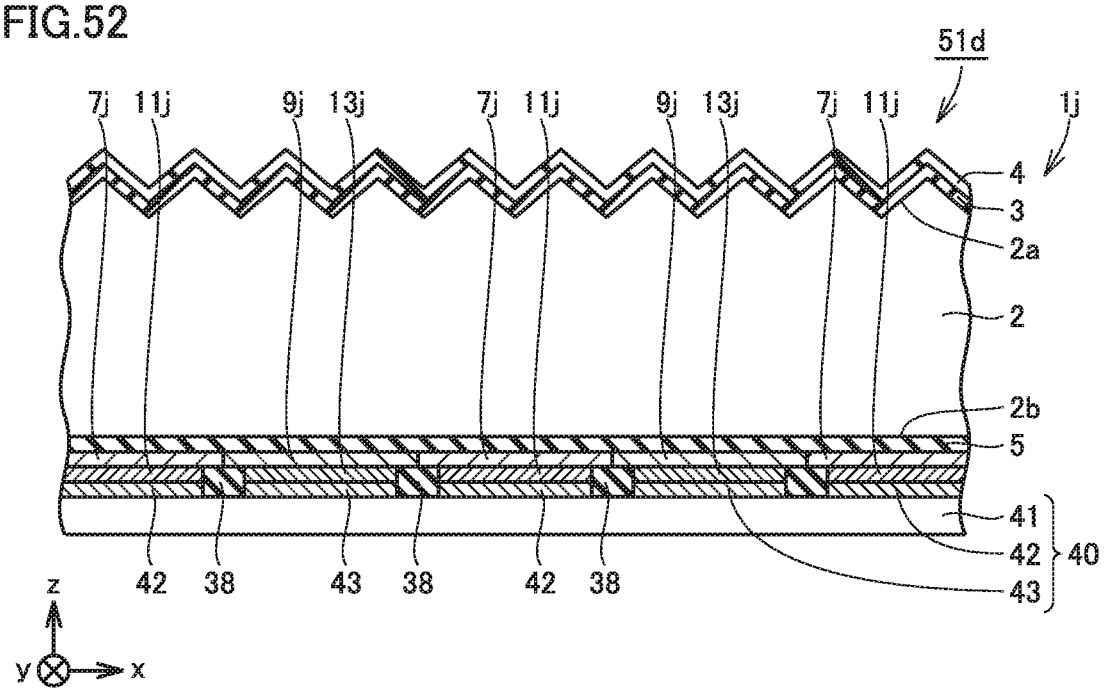
FIG. 52 is a schematic cross-sectional view of a photovoltaic module in accordance with Embodiment 13, taken along cross-sectional line LII-LII in FIG. 54.
Figure 53:
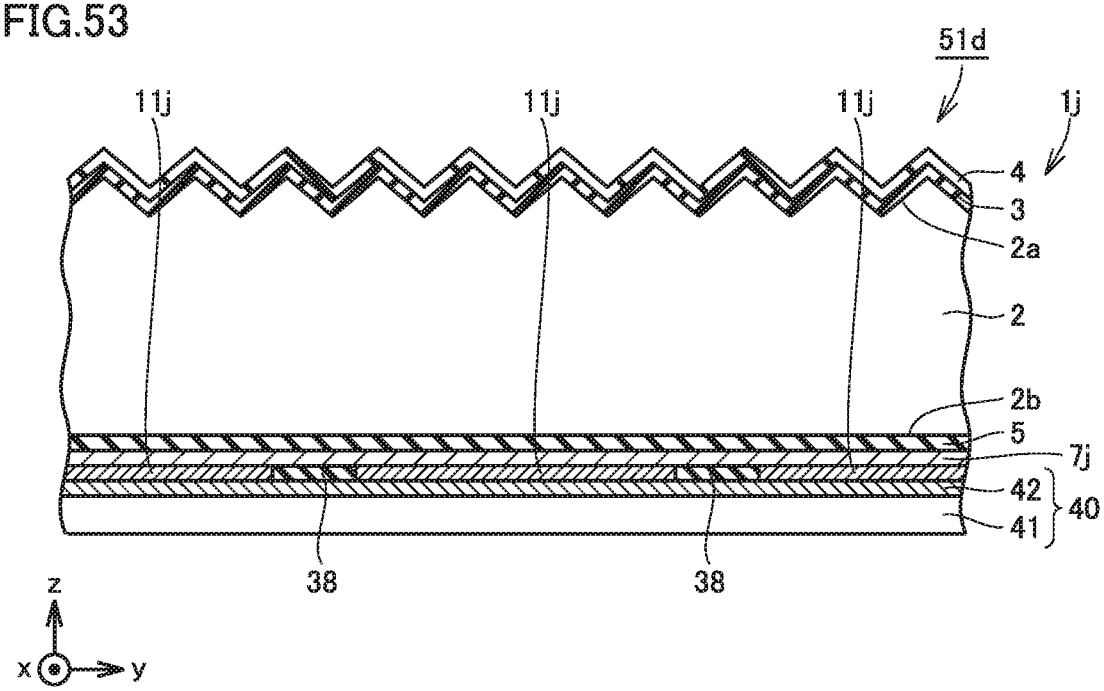
FIG. 53 is a schematic cross-sectional view of the photovoltaic module in accordance with Embodiment 13, taken along cross-sectional line LIII-LIII in FIG. 54.

The photovoltaic module 51*c* in accordance with the present embodiment includes the photovoltaic device 1*a* in accordance with Embodiment 2. Referring to FIG. 51, the photovoltaic device 1*a* in accordance with the present embodiment has a configuration similar to that of the photovoltaic device 1 in accordance with Embodiment 10. In the photovoltaic device 1*a* in accordance with the present embodiment, however, the first amorphous semiconductor film 7*a* and the second amorphous semiconductor film 9*a* are divided into a plurality of sections not only in the first direction, but also in the second direction, when viewed from the second face 2*b* side of the semiconductor substrate 2. The first amorphous semiconductor film 7*a* and the second amorphous semiconductor film 9*a* are arranged in lattice patterns.

An exemplary method of manufacturing the photovoltaic module 51*c* in accordance with the present embodiment basically includes the same steps and achieves the same effects as the method of manufacturing the photovoltaic module 51*b* in accordance with Embodiment 11, and differs in the shape of the sections of the first opening 22*a* of the first mask 21*a* (see FIG. 16(A)) and the shape of the sections of the second opening 27*a* of the second mask 26*a* (see FIG. 16(B)). In the present embodiment, the first amorphous semiconductor film 7*a* is formed using the first mask 21*a* shown in FIG. 16(A), the second amorphous semiconductor film 9*a* is formed using the second mask 26*a* shown in FIG. 16(B), and the first electrodes 11*a* and the second electrodes 13*a* are formed using the third mask 31*a* shown in FIG. 16(C).

The exemplary method of manufacturing the photovoltaic module 51*c* in accordance with the present embodiment includes the following steps. The photovoltaic device 1*a* is prepared by the manufacturing method described in Embodiment 2. The wiring sheet 40 is prepared. The wiring sheet 40 may be manufactured by the method described in Embodiment 9. The wiring sheet 40 is then mechanically connected to the photovoltaic device 1*a* using the junction material 38. The photovoltaic device 1*a* is electrically connected to the wiring sheet 40.

The photovoltaic module 51*c* in accordance with the present embodiment achieves both the effects achieved by the photovoltaic module 51*a* in accordance with Embodiment 10 and the effects achieved by the photovoltaic module 51*b* in accordance with Embodiment 11. The method of manufacturing the photovoltaic module 51*c* in accordance with the present embodiment achieves both the effects achieved by the method of manufacturing the photovoltaic module 51*a* in accordance with Embodiment 10 and the effects achieved by the method of manufacturing the photovoltaic module 51*b* in accordance with Embodiment 11.

Embodiment 13

A photovoltaic module 51*d* and a method of manufacturing the photovoltaic module 51*d* will be described in accordance with Embodiment 13 in reference to FIGS. 52 to 55. The photovoltaic module 51*d* in accordance with the present embodiment basically has the same configuration and achieves the same effects as the photovoltaic module 51 in accordance with Embodiment 9 shown in FIGS. 31 to 34, and differs in the arrangement patterns of first electrodes 11*j* and second electrodes 13*j*.

Figure 54:
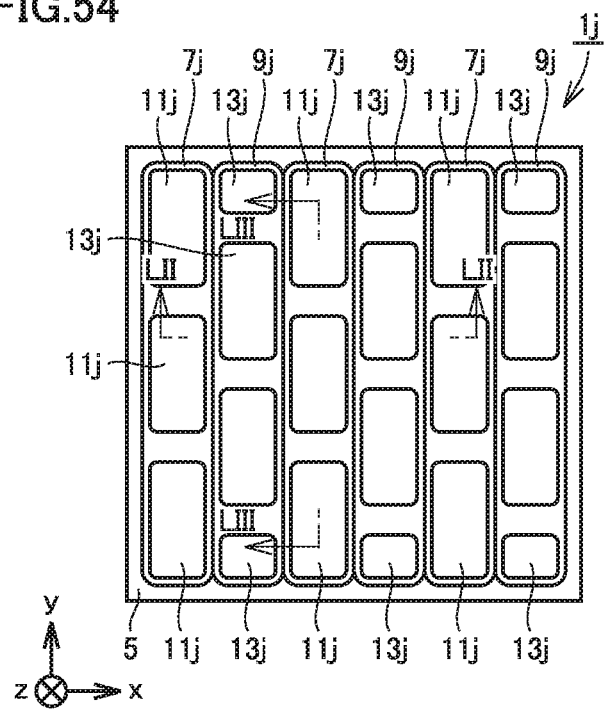
FIG. 54 is a schematic plan view of a photovoltaic device included in the photovoltaic module in accordance with Embodiment 13 as viewed from a second face side of a semiconductor substrate.
Figure 55:
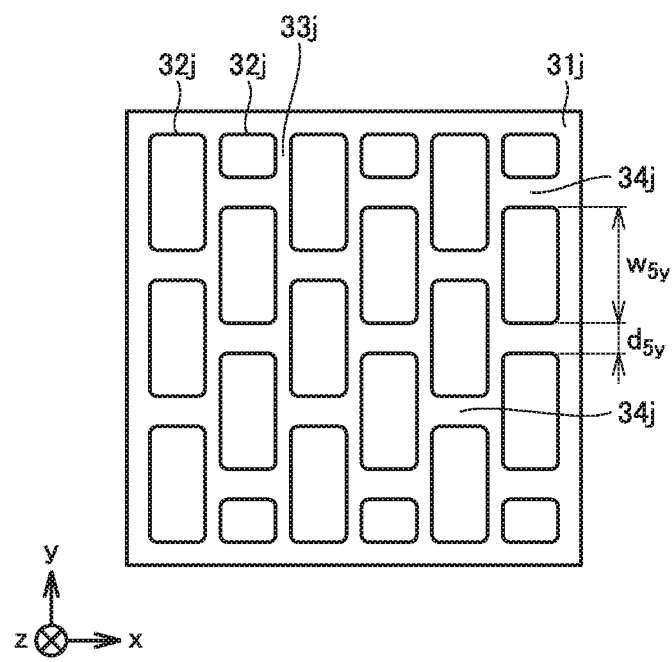
FIG. 55 is a schematic plan view of a third mask used in a method of manufacturing the photovoltaic device included in the photovoltaic module in accordance with Embodiment 13.
Figure 56:
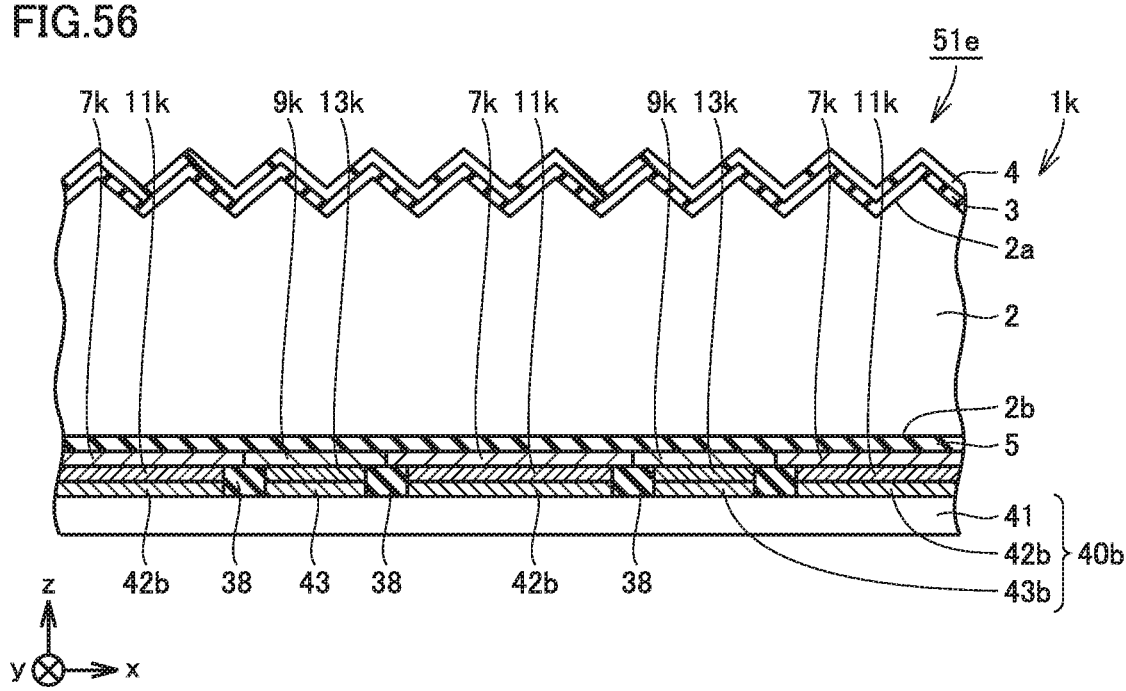
FIG. 56 is a schematic cross-sectional view of a photovoltaic module in accordance with Embodiment 14, taken along cross-sectional line LVI-LVI in FIG. 58.
Figure 57:
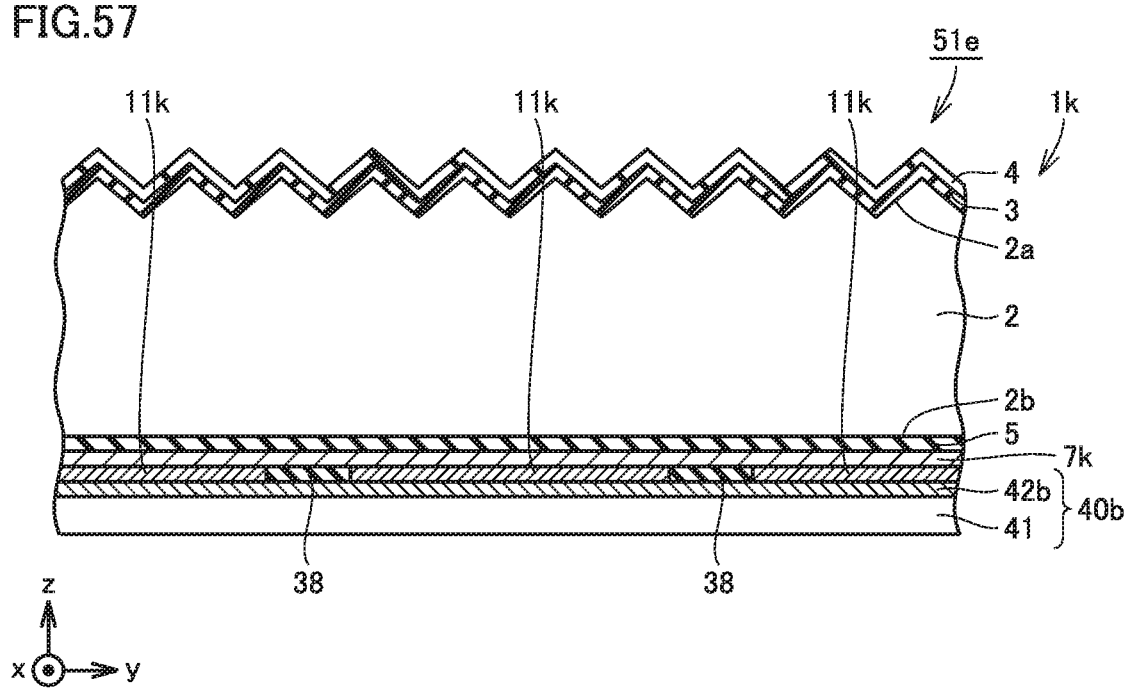
FIG. 57 is a schematic cross-sectional view of the photovoltaic module in accordance with Embodiment 14, taken along cross-sectional line LVII-LVII in FIG. 58.

The photovoltaic module 51*d* in accordance with the present embodiment includes a photovoltaic device 1*j*. Referring to FIG. 54, the photovoltaic device 1*j* in accordance with the present embodiment has a configuration similar to that of the photovoltaic device 1*h* in accordance with Embodiment 9. In the photovoltaic device 1*j* in accordance with the present embodiment, however, the first electrodes 11*j* and the second electrodes 13*j* are arranged in zigzag patterns when viewed from the second face 2*b* side of the semiconductor substrate 2. The first electrodes 11*j* in accordance with the present embodiment shown in FIG. 54 are similar to the first electrodes 11*b* in accordance with Embodiment 3 shown in FIG. 17(A), and the second electrodes 13*j* in accordance with the present embodiment shown in FIG. 54 are similar to the second electrodes 13*h* in accordance with Embodiment 3 shown in FIG. 17(A). The first electrodes 11*j* and the second electrodes 13*j* may be arranged in other various patterns.

An exemplary method of manufacturing the photovoltaic module 51*d* in accordance with the present embodiment basically includes the same steps and achieves the same effects as the method of manufacturing the photovoltaic module 51 in accordance with Embodiment 9, and differs in the pattern of a third opening 32*j* of a third mask 31*j*. In the present embodiment, the first electrodes 11*j* and the second electrodes 13*j* are formed using the third mask 31*j* shown in FIG. 55. That third opening 32*j* of the third mask 31*j* which corresponds to the first electrodes 11*j* in the present embodiment has the same pattern as that third opening 32 of the third mask 31 (see FIG. 14) which corresponds to the first electrodes 11*h* in accordance with Embodiment 9. That third opening 32*j* of the third mask 31*j* which corresponds to the second electrodes 13*j* in the present embodiment has a pattern in which that third opening 32 of the third mask 31 (see FIG. 14) which corresponds to the second electrodes 13*h* in accordance with Embodiment 9 is shifted by half a cycle in the second direction. The third mask 31*j* in accordance with the present embodiment shown in FIG. 55 has the same configuration as the third mask 31*b* in accordance with Embodiment 3 shown in FIG. 18(B). The third opening 32*j* is divided into a plurality of sections that is separated in the first direction by a fifth bridge section 33*j* and in the second direction by a sixth bridge section 34*j*. A first amorphous semiconductor film 7*j* and a second amorphous semiconductor film 9*j* in accordance with the present embodiment have the same configurations as the first amorphous semiconductor film 7*h* and the second amorphous semiconductor film 9*h* in accordance with Embodiment 9 respectively.

The photovoltaic module 51*d* in accordance with the present embodiment achieves the following effects in addition to those achieved by the photovoltaic module 51 in accordance with Embodiment h. The photovoltaic module 51*d* in accordance with the present embodiment allows the first electrodes 11*j* and the second electrodes 13*j* to be arranged in various patterns. The photovoltaic module 51*d* thus allows for greater freedom in design.

In the photovoltaic module 51*d* in accordance with the present embodiment, the first electrodes 11*j* and the second electrodes 13*j* are arranged in zigzag patterns. This structure distributes, more evenly in the second direction, the gaps separating the second-direction-wise adjacent first electrodes 11*j* and the gaps separating the second-direction-wise adjacent second electrodes 13*j*. The junction material 38 is provided in the gaps separating the second-direction-wise adjacent first electrodes 11*j* and in the gaps separating the second-direction-wise adjacent second electrodes 13*j*. The photovoltaic module 51*d* in accordance with the present embodiment hence provides more uniform mechanical connection strength in the second direction between the photovoltaic device 1*j* and the wiring sheet 40.

The method of manufacturing the photovoltaic module 51*d* in accordance with the present embodiment achieves the following effects in addition to those achieved by the method of manufacturing the photovoltaic module 51 in accordance with Embodiment 9. The first electrodes 11*j* and the second electrodes 13*j* may be arranged in various patterns. According to the method of manufacturing the photovoltaic module 51*d* in accordance with the present embodiment, the resultant photovoltaic module 51*d* thus allows for greater freedom in design.

According to the method of manufacturing the photovoltaic module 51*d* in accordance with the present embodiment, the first electrodes 11*j* and the second electrodes 13*j* are arranged in zigzag patterns. This structure distributes, more evenly in the second direction, the gaps separating the second-direction-wise adjacent first electrodes 11*j* and the gaps separating the second-direction-wise adjacent second electrodes 13*j*. The junction material 38 is provided in the gaps separating the second-direction-wise adjacent first electrodes 11*j* and in the gaps separating the second-direction-wise adjacent second electrodes 13*j*. According to the method of manufacturing the photovoltaic module 51*d* in accordance with the present embodiment, the resultant photovoltaic module 51*d* hence provides more uniform mechanical connection strength in the second direction between the photovoltaic device 1*j* and the wiring sheet 40.

A variation example of the photovoltaic module 51*d* in accordance with the present embodiment will be described. In this variation example, the first amorphous semiconductor film 7*j* and the second amorphous semiconductor film 9*j* may be divided into a plurality of sections not only in the first direction, but also in the second direction, when viewed from the second face 2*b* side of the semiconductor substrate 2. In this variation example, the first amorphous semiconductor film 7*j* and the second amorphous semiconductor film 9*j* are arranged in zigzag patterns when viewed from the second face 2*b* side of the semiconductor substrate 2. The first amorphous semiconductor film 7*j* and the second amorphous semiconductor film 9*j* may be arranged in other patterns when viewed from the second face 2*b* side of the semiconductor substrate 2.

Embodiment 14

A photovoltaic module 51*e* and a method of manufacturing the photovoltaic module 51*e* will be described in accordance with Embodiment 14 in reference to FIGS. 56 to 59. The photovoltaic module 51*e* in accordance with the present embodiment basically has the same configuration and achieves the same effects as the photovoltaic module 51*b* in accordance with Embodiment 11 shown in FIGS. 44 to 46(B), and differs in the arrangement patterns of first electrodes 11*k* and second electrodes 13*k*.

Figure 58:
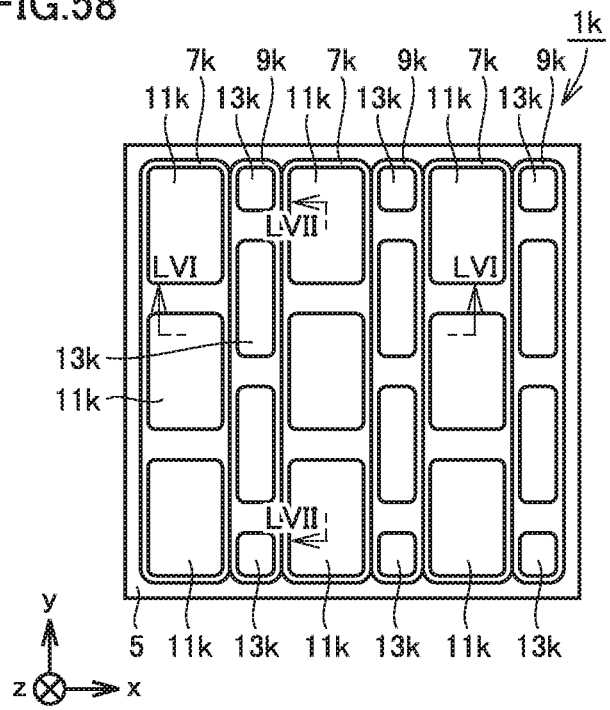
FIG. 58 is a schematic plan view of a photovoltaic device included in the photovoltaic module in accordance with Embodiment 14 as viewed from a second face side of a semiconductor substrate.
Figure 59:
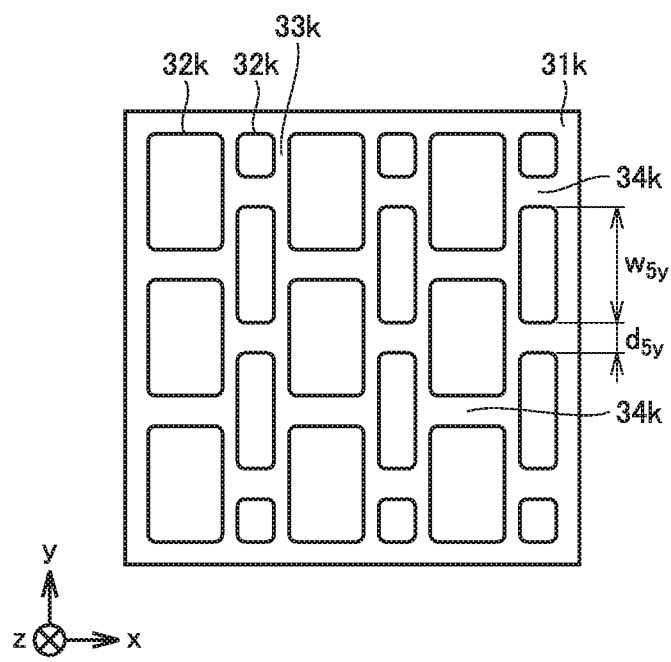
FIG. 59 is a schematic plan view of a third mask used in a method of manufacturing the photovoltaic device included in the photovoltaic module in accordance with Embodiment 14.
Figure 60:
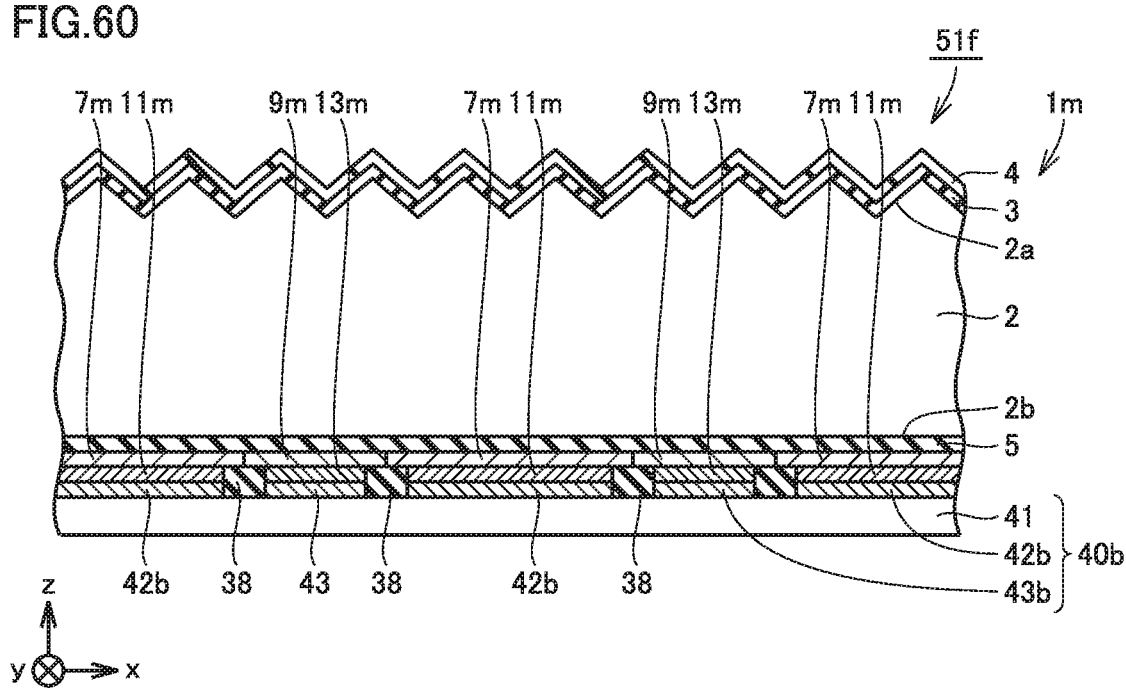
FIG. 60 is a schematic cross-sectional view of a photovoltaic module in accordance with Embodiment 15, taken along cross-sectional line LX-LX in FIG. 62.
Figure 61:
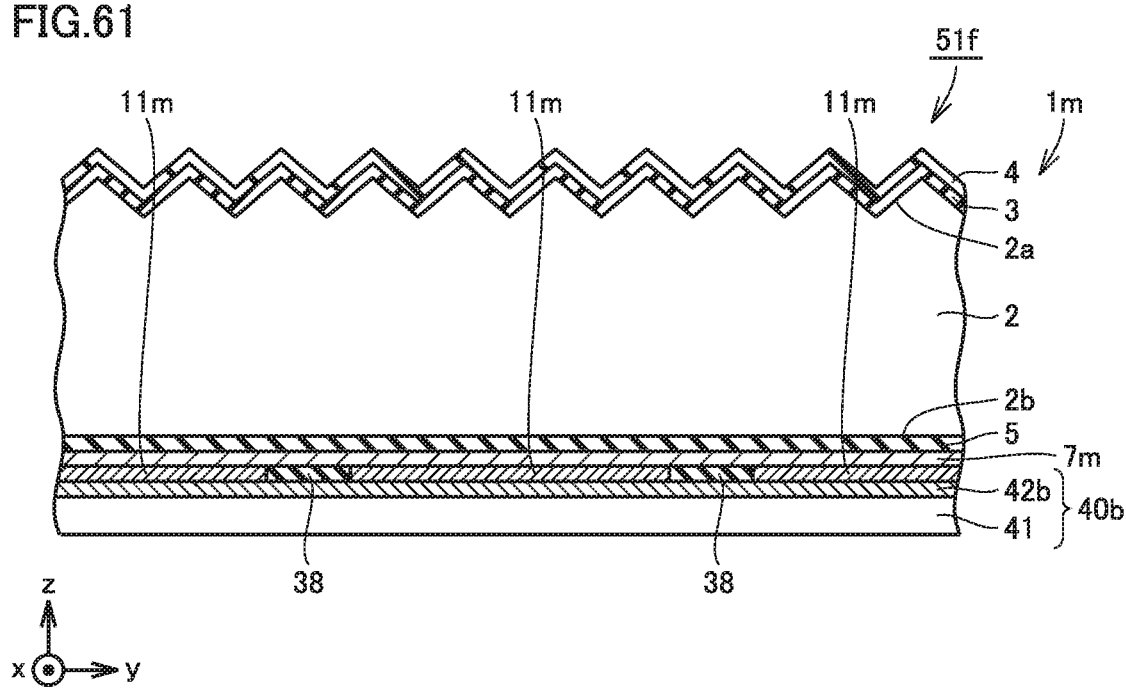
FIG. 61 is a schematic cross-sectional view of the photovoltaic module in accordance with Embodiment 15, taken along cross-sectional line LXI-LXI in FIG. 62.

The photovoltaic module 51*e* in accordance with the present embodiment includes a photovoltaic device 1*k*. Referring to FIG. 58, the photovoltaic device 1*k* in accordance with the present embodiment has a configuration similar to that of the photovoltaic device 1*i* in accordance with Embodiment 11. In the photovoltaic device 1*k* in accordance with the present embodiment, however, the first electrodes 11k and the second electrodes 13k are arranged in zigzag patterns when viewed from the second face 2b side of the semiconductor substrate 2. The first electrodes 11k in accordance with the present embodiment shown in FIG. 58 are similar to the first electrodes 11c in accordance with Embodiment 4 shown in FIG. 19(A), and the second electrodes 13k in accordance with the present embodiment shown in FIG. 58 are similar to the second electrodes 13c in accordance with Embodiment 4 shown in FIG. 19(A). The first electrodes 11k and the second electrodes 13k are not necessarily arranged in zigzag patterns. A first amorphous semiconductor film 7k and a second amorphous semiconductor film 9k in accordance with the present embodiment have the same configurations as the first amorphous semiconductor film 7i and the second amorphous semiconductor film 9i in accordance with Embodiment 11 respectively.

An exemplary method of manufacturing the photovoltaic module 51e in accordance with the present embodiment basically includes the same steps and achieves the same effects as the method of manufacturing the photovoltaic module 51b in accordance with Embodiment 11, and differs in the pattern of a third opening 32k of a third mask 31k. The first electrodes 11k and the second electrodes 13k in the present embodiment are formed using the third mask 31k shown in FIG. 59. That third opening 32k of the third mask 31k which corresponds to the first electrodes 11k in the present embodiment has the same pattern as that third opening 32i of the third mask 31i (see FIG. 48) which corresponds to the first electrodes 11i in accordance with Embodiment 11. That third opening 32k of the third mask 31k which corresponds to the second electrodes 13k in the present embodiment has a pattern in which that third opening 32i of the third mask 31i (see FIG. 48) which corresponds to the second electrodes 13i in accordance with Embodiment 11 is shifted by half a cycle in the second direction. The third opening 32k is divided into a plurality of sections that is separated in the first direction by a fifth bridge section 33k and in the second direction by a sixth bridge section 34k. The third mask 31k shown in FIG. 59 has the same configuration as the third mask 31c shown in FIG. 20(B).

The photovoltaic module 51e in accordance with the present embodiment achieves both the effects achieved by the photovoltaic module 51b in accordance with Embodiment 11 and the effects achieved by the photovoltaic module 51d in accordance with Embodiment 13. The method of manufacturing the photovoltaic module 51e in accordance with the present embodiment achieves both the effects achieved by the method of manufacturing the photovoltaic module 51b in accordance with Embodiment 11 and the effects achieved by the method of manufacturing the photovoltaic module 51d in accordance with Embodiment 13.

A variation example of the photovoltaic module 51e in accordance with the present embodiment will be described. In this variation example, the first amorphous semiconductor film 7k and the second amorphous semiconductor film 9k may be divided into a plurality of sections not only in the first direction, but also in the second direction, when viewed from the second face 2b side of the semiconductor substrate 2. In this variation example, the first amorphous semiconductor film 7k and the second amorphous semiconductor film 9k are arranged in zigzag patterns when viewed from the second face 2b side of the semiconductor substrate 2. The first amorphous semiconductor film 7k and the second amorphous semiconductor film 9k may be arranged in other patterns when viewed from the second face 2b side of the semiconductor substrate 2.

Embodiment 15

A photovoltaic module 51f and a method of manufacturing the photovoltaic module 51f will be described in accordance with Embodiment 15 in reference to FIGS. 60 to 63. The photovoltaic module 51f in accordance with the present embodiment basically has the same configuration and achieves the same effects as the photovoltaic module 51b in accordance with Embodiment 11 shown in FIGS. 44 to 46(B), and differs in the arrangement patterns of first electrodes 11m and second electrodes 13m.

Figure 62:
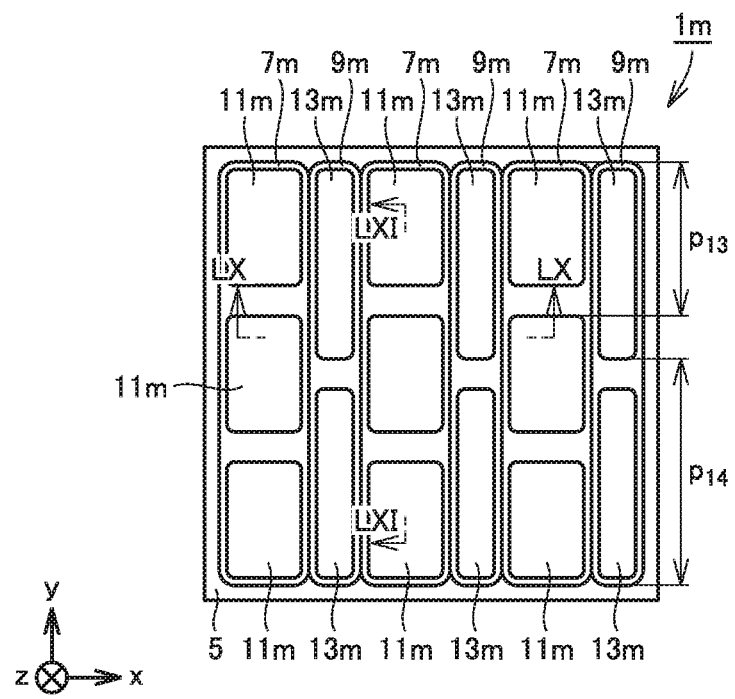
FIG. 62 is a schematic plan view of a photovoltaic device included in the photovoltaic module in accordance with Embodiment 15 as viewed from a second face side of a semiconductor substrate.

The photovoltaic module 51f in accordance with the present embodiment includes a photovoltaic device 1m. Referring to FIG. 62, the photovoltaic device 1m in accordance with the present embodiment has a configuration similar to that of the photovoltaic device 1i in accordance with Embodiment 11. In the photovoltaic device 1m in accordance with the present embodiment, however, the first electrodes 11m have a cycle $p_{13}$ in the second direction, and the second electrodes 13m have a cycle $p_{14}$ in the second direction, the cycle $p_{13}$ being shorter than the cycle $p_{14}$. Each first electrode 11f has a smaller second-direction length than does each second electrode 13f. A first amorphous semiconductor film 7m and a second amorphous semiconductor film 9m in accordance with the present embodiment have the same configurations as the first amorphous semiconductor film 7i and the second amorphous semiconductor film 9i in accordance with Embodiment 11 respectively.

Figure 63:
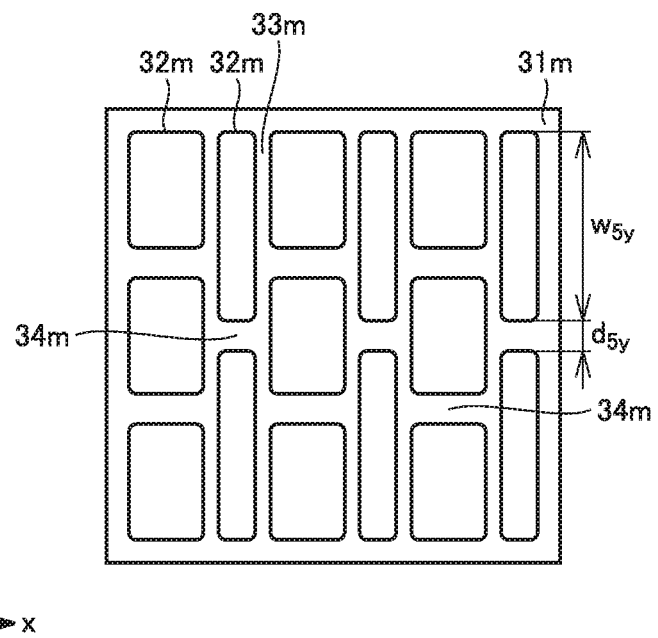
FIG. 63 is a schematic plan view of a third mask used in a method of manufacturing the photovoltaic device included in the photovoltaic module in accordance with Embodiment 15.
Figure 64:
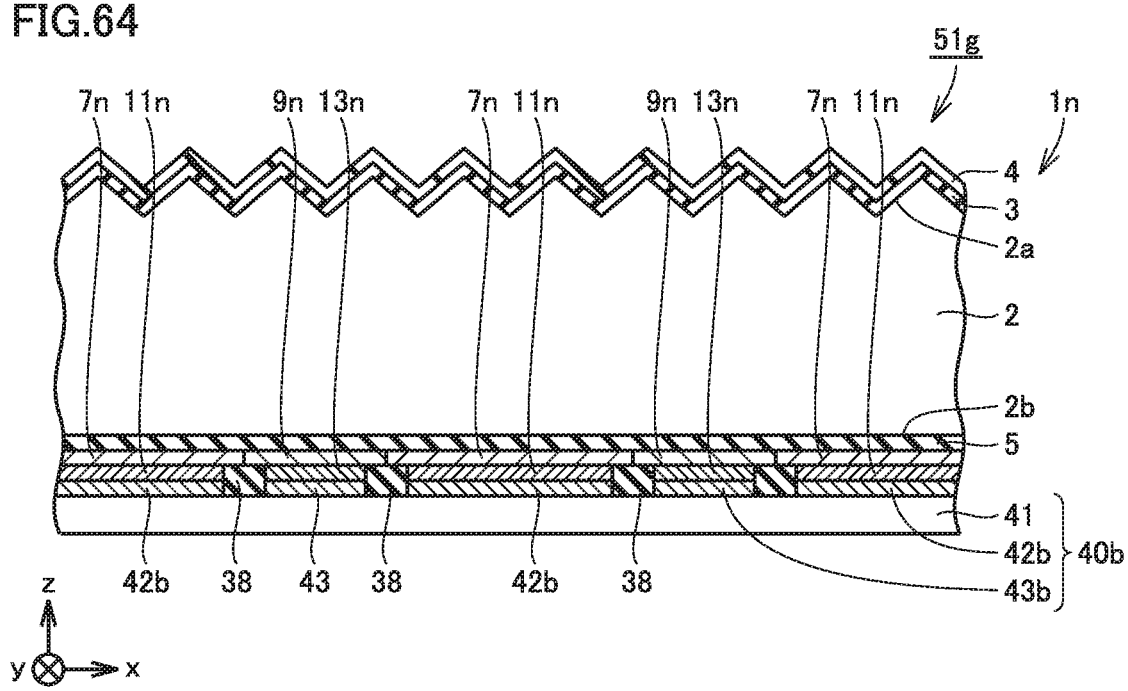
FIG. 64 is a schematic cross-sectional view of a photovoltaic module in accordance with Embodiment 16, taken along cross-sectional line LXIV-LXIV in FIG. 66.
Figure 65:
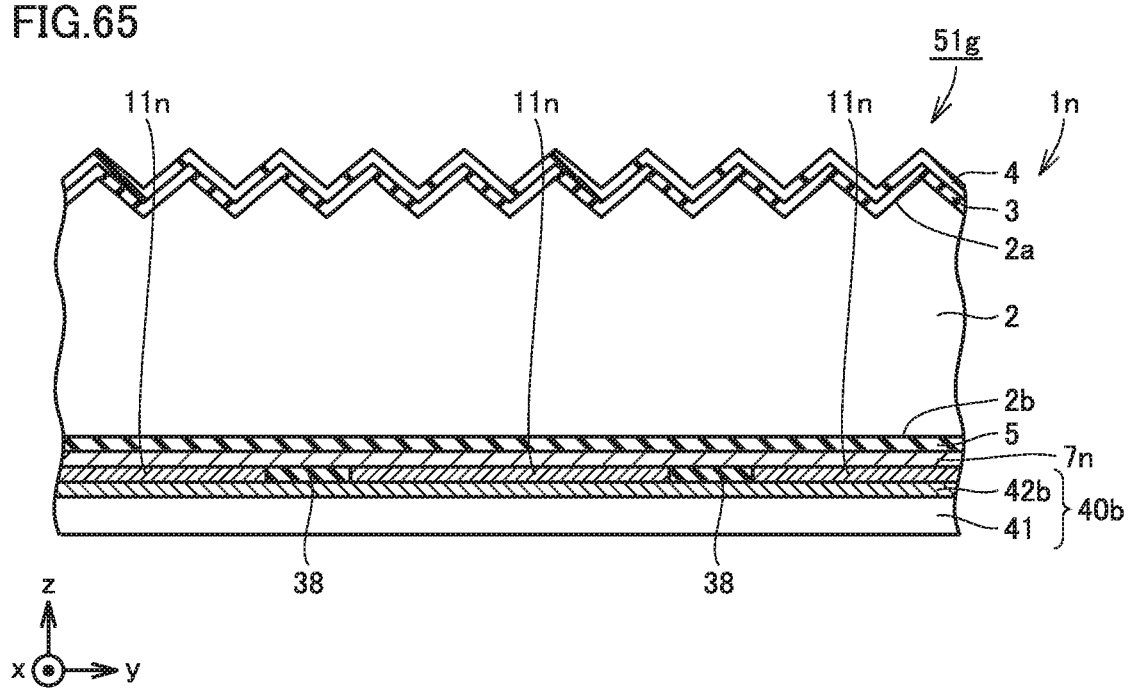
FIG. 65 is schematic cross-sectional view of the photovoltaic module in accordance with Embodiment 16, taken along cross-sectional line LXV-LXV in FIG. 66.

An exemplary method of manufacturing the photovoltaic module 51f in accordance with the present embodiment basically includes the same steps and achieves the same effects as the method of manufacturing the photovoltaic module 51b in accordance with Embodiment 11, and differs in the pattern of a third opening 32m of a third mask 31m. Referring to FIG. 63, those sections of the third opening 32m of the third mask 31m which correspond to the first electrodes 11m have a shorter cycle than do those sections of the third opening 32m of the third mask 31m which correspond to the second electrodes 13m. Each section of the third opening 32m of the third mask 31m that corresponds to one of the first electrodes 11m has a second-direction length that is smaller than the second-direction length $w_{5y}$ of each section of the third opening 32m of the third mask 31m that corresponds to one of the second electrodes 13m. The sections of the third opening 32m are separated in the first direction by a fifth bridge section 33m and in the second direction by a sixth bridge section 34m.

Effects of the photovoltaic module 51f and the method of manufacturing the photovoltaic module 51f in accordance with the present embodiment will be described. In the photovoltaic module 51f in accordance with the present embodiment, the cycle $p_{13}$ of the first electrodes 11m in the second direction is shorter than the cycle $p_{14}$ of the second electrodes 13m in the second direction. The area of the region surrounded by the wiring sheet 40 and those first electrodes 11m which are adjacent in a plan view from the second face 2b of the semiconductor substrate 2 increases. The junction material 38 provides an increased junction area for the photovoltaic device 1m and the wiring sheet 40. As a result, the photovoltaic module 51f and the method of manufacturing the photovoltaic module 51f in accordance with the present embodiment impart further improved mechanical connection strength to the photovoltaic device 1m and the wiring sheet 40.

Each first electrode 11m has a larger area than each second electrode 13m. Especially, when the junction material 38 is not provided on the first electrodes 11m, mechanical junction strength decreases relatively between the photovoltaic device 1m and the wiring sheet 40 on regions of the first amorphous semiconductor film 7m where the first electrodes 11m reside. Setting the cycle $p_{13}$ of the first electrodes 11m in the second direction to a value smaller than the cycle $p_{14}$ of the second electrodes 13m in the second direction can prevent relative decrease of mechanical junction strength between the photovoltaic device 1m and the wiring sheet 40 on those regions of the first amorphous semiconductor film 7m.

Embodiment 16

A photovoltaic module 51g and a method of manufacturing the photovoltaic module 51g will be described in accordance with Embodiment 16 in reference to FIGS. 64 to 67. The photovoltaic module 51g in accordance with the present embodiment basically has the same configuration and achieves the same effects as the photovoltaic module 51b in accordance with Embodiment 11 shown in FIGS. 44 to 46(B), and differs in the arrangement patterns of first electrodes 11n and second electrodes 13n.

Figure 66:
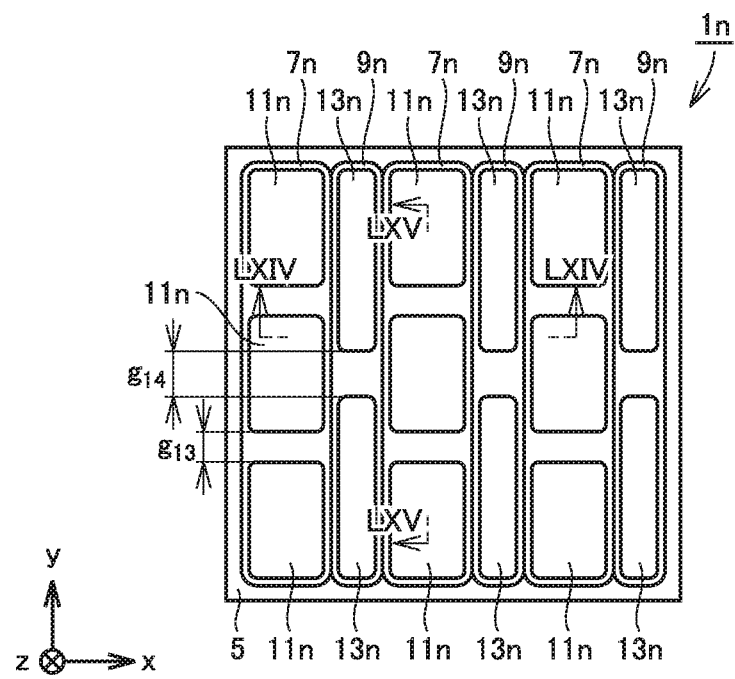
FIG. 66 is a schematic plan view of a photovoltaic device included in the photovoltaic module in accordance with Embodiment 16 as viewed from a second face side of a semiconductor substrate.

The photovoltaic module 51g in accordance with the present embodiment includes a photovoltaic device 1n. Referring to FIG. 66, the photovoltaic device 1n in accordance with the present embodiment has a configuration similar to that of the photovoltaic device 1i in accordance with Embodiment 11. In the photovoltaic device 1n in accordance with the present embodiment, however, the first electrodes 11n are separated in the second direction by a distance $g_{13}$, and the second electrodes 13n are separated in the second direction by a distance $g_{14}$, the distance $g_{13}$ being smaller than the distance $g_{14}$. Each first electrode 11n has a smaller length in the second direction than does each second electrode 13n. A first amorphous semiconductor film 7n and a second amorphous semiconductor film 9n in accordance with the present embodiment have the same configurations as the first amorphous semiconductor film 7i and the second amorphous semiconductor film 9i in accordance with Embodiment 11 respectively.

Figure 67:
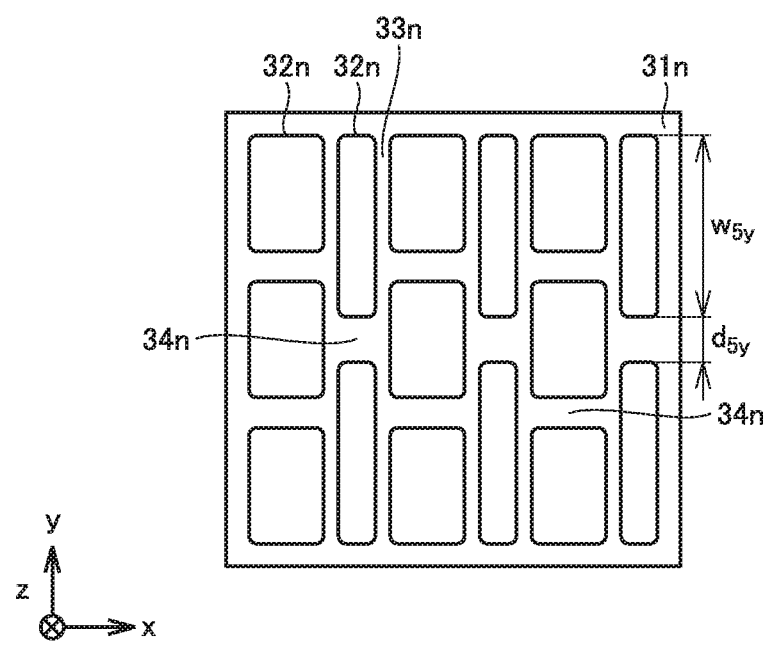
FIG. 67 is a schematic plan view of a third mask used in a method of manufacturing the photovoltaic device included in the photovoltaic module in accordance with Embodiment 16.

An exemplary method of manufacturing the photovoltaic module 51g in accordance with the present embodiment basically includes the same steps and achieves the same effects as the method of manufacturing the photovoltaic module 51b in accordance with Embodiment 11, and differs in the pattern of a third opening 32n of a third mask 31n. Referring to FIG. 67, those sections of the third opening 32n of the third mask 31n which correspond to the first electrodes 11n are separated by a distance that is smaller than the distance $d_{5y}$ separating those sections of the third opening 32n of the third mask 31n which correspond to the second electrodes 13n. Each section of the third opening 32n of the third mask 31n which corresponds to one of the first electrodes 11n has a smaller length in the second direction than the second-direction length $w_{5y}$ of each section of the third opening 32n of the third mask 31n which corresponds to one of the second electrodes 13n. The sections of the third opening 32n are separated in the first direction by a fifth bridge section 33n and in the second direction by a sixth bridge section 34n.

Effects of the photovoltaic module 51g and the method of manufacturing the photovoltaic module 51g in accordance with the present embodiment will be described. In the photovoltaic module 51g in accordance with the present embodiment, the distance $g_{13}$ separating the first electrodes 11n in the second direction is smaller than the distance $g_{14}$ separating the second electrodes 13n in the second direction. Therefore, the carriers generated in the semiconductor substrate 2 by the light incident on the first face 2a side of the semiconductor substrate 2 can be more efficiently collected through the first amorphous semiconductor film 7n and the first electrodes 11n.

Additional Description (1) An embodiment disclosed here includes a semiconductor substrate, a first amorphous semiconductor film of a first conductivity type, a second amorphous semiconductor film of a second conductivity type that differs from the first conductivity type, first electrodes, and second electrodes. The semiconductor substrate has a first face and a second face opposite the first face. The semiconductor substrate is a monocrystal semiconductor substrate. The semiconductor substrate stretches in a first direction and a second direction that intersects the first direction. The first amorphous semiconductor film is disposed on the second face of the semiconductor substrate and divided into a plurality of sections in the first direction and the second direction. The second amorphous semiconductor film is disposed on the second face of the semiconductor substrate and divided into a plurality of sections in the first direction and the second direction. The first electrodes are disposed respectively on these sections of the first amorphous semiconductor film. The second electrodes are disposed respectively on these sections of the second amorphous semiconductor film. The photovoltaic device in accordance with an embodiment disclosed here exhibits an improved heat resistance.

In a photovoltaic device in accordance with an embodiment disclosed here, the first electrodes are separated not only in the first direction, but also in the second direction that intersects the first direction. Therefore, some of the first electrodes could possibly come off the first amorphous semiconductor film, but the other first electrodes will not come off the first amorphous semiconductor film. The photovoltaic device in accordance with an embodiment disclosed here hence has a low defective rate. In the photovoltaic device in accordance with an embodiment disclosed here, the second electrodes are separated not only in the first direction, but also in the second direction that intersects the first direction. Therefore, some of the second electrodes could possibly come off the second amorphous semiconductor film, but the other second electrodes will not come off the second amorphous semiconductor film. The photovoltaic device in accordance with an embodiment disclosed here hence has a low defective rate.

(2) In a photovoltaic device in accordance with an embodiment disclosed here, at least one of the sections of the first amorphous semiconductor film and the sections of the second amorphous semiconductor film may be shaped like a circle, a polygon, or a polygon with rounded corners, when viewed from a second face side of the semiconductor substrate. This structure can restrain the carriers generated in the semiconductor substrate by the light incident on the first face side of the semiconductor substrate from accumulating in a particular part of the first amorphous semiconductor film or the second amorphous semiconductor film, thereby suppressing temperature rises in this particular part. That can in turn restrain the first amorphous semiconductor film and the second amorphous semiconductor film from being degraded or coming off the semiconductor substrate due to a temperature rise in the first amorphous semiconductor film or the second amorphous semiconductor film.

(3) In a photovoltaic device in accordance with an embodiment disclosed here, the circles and rounded corners may have a radius of curvature of from 1 μm to 10 mm inclusive. This structure can restrain the carriers generated in the semiconductor substrate by the light incident on the first face side of the semiconductor substrate from accumulating in a particular part of the first amorphous semiconductor film or the second amorphous semiconductor film, thereby further suppressing temperature rises in this particular part. That can in turn further restrain the first amorphous semiconductor film and the second amorphous semiconductor film from being degraded or coming off the semiconductor substrate due to a temperature rise in the first amorphous semiconductor film or the second amorphous semiconductor film.

(4) in a photovoltaic device in accordance with an embodiment disclosed here, at least one of the distance separating the first-direction-wise adjacent sections of the first amorphous semiconductor film, the distance separating the first-direction-wise adjacent sections of the second amorphous semiconductor film, the distance separating the second-direction-wise adjacent sections of the first amorphous semiconductor film, and the distance separating the second-direction-wise adjacent sections of the second amorphous semiconductor film may be less than or equal to the diffusion length in the semiconductor substrate of minority carriers generated in the semiconductor substrate by the light incident on the first face side of the semiconductor substrate. Therefore, the minority carriers generated in the semiconductor substrate by the light incident on the first face side of the semiconductor substrate can be efficiently collected through either the first amorphous semiconductor film and the first electrodes or the second amorphous semiconductor film and the second electrodes.

(5) In a photovoltaic device in accordance with an embodiment disclosed here, at least one of the distance separating the first-direction-wise adjacent sections of the first amorphous semiconductor film, the distance separating the first-direction-wise adjacent sections of the second amorphous semiconductor film, the distance separating the second-direction-wise adjacent sections of the first amorphous semiconductor film, and the distance separating the second-direction-wise adjacent sections of the second amorphous semiconductor film may be from 30 μm to 1 mm inclusive. The photovoltaic device in accordance with an embodiment disclosed here hence exhibits a further improved heat resistance. Excess drop in light-energy-to-electric-energy conversion efficiency in the photovoltaic device can be prevented.

(6) In a photovoltaic device in accordance with an embodiment disclosed here, the distance separating the second-direction-wise adjacent sections of the first amorphous semiconductor film may be from one thousandth to one tenth inclusive, of the second-direction length of each section of the first amorphous semiconductor film. The photovoltaic device in accordance with an embodiment disclosed here hence exhibits a further improved heat resistance. Excess drop in light-energy-to-electric-energy conversion efficiency in the photovoltaic device can be prevented.

(7) In a photovoltaic device in accordance with an embodiment disclosed here, the distance separating the second-direction-wise adjacent sections of the second amorphous semiconductor film may be from one thousandth to one tenth inclusive, of the second-direction length of each section of the second amorphous semiconductor film. The photovoltaic device in accordance with an embodiment disclosed here hence exhibits a further improved heat resistance. Excess drop in light-energy-to-electric-energy conversion efficiency in the photovoltaic device can be prevented.

(8) In a photovoltaic device in accordance with an embodiment disclosed here, the first amorphous semiconductor film may have a larger area than the second amorphous semiconductor film, when viewed from the second face side of the semiconductor substrate. The photovoltaic device in accordance with an embodiment disclosed here thus allows for greater freedom in design.

(9) In a photovoltaic device in accordance with an embodiment disclosed here, the first amorphous semiconductor film and the second amorphous semiconductor film may be arranged in a lattice pattern or a zigzag pattern, when viewed from the second face side of the semiconductor substrate. The photovoltaic device accordance with an embodiment disclosed here thus allows for greater freedom in design.

(10) In a photovoltaic device in accordance with an embodiment disclosed here, the sections of the first amorphous semiconductor film may have a shorter cycle in the second direction than do the sections of the second amorphous semiconductor film. The photovoltaic device in accordance with an embodiment disclosed here hence exhibits a further improved heat resistance.

(11) In a photovoltaic device in accordance with an embodiment disclosed here, the sections of the first amorphous semiconductor film may be separated in the second direction by a smaller distance than are the sections of the second amorphous semiconductor film. According to the photovoltaic device in accordance with an embodiment disclosed here, the carriers generated in the semiconductor substrate by the light incident on the first face side of the semiconductor substrate can hence be more efficiently collected through the first amorphous semiconductor film and the first electrodes.

(12) A photovoltaic device in accordance with an embodiment disclosed here may further include an i-type amorphous semiconductor film between the semiconductor substrate and the first amorphous semiconductor film and between the semiconductor substrate and the second amorphous semiconductor film. The photovoltaic device in accordance with an embodiment disclosed here can hence further improve the light-energy-to-electric-energy conversion efficiency.

(13) A method of manufacturing a photovoltaic device in accordance with an embodiment disclosed here includes the following steps. The first amorphous semiconductor film of the first conductivity type is formed on the second face of the semiconductor substrate using the first mask, the semiconductor substrate having the first face and the second face opposite the first face. The semiconductor substrate is a monocrystal semiconductor substrate and stretches in the first direction and the second direction that intersects the first direction. The first mask includes a first bridge section, a second bridge section, and a first opening. The first opening is, in the first direction, divided into a plurality of sections by the first bridge section. The first opening is, in the second direction, divided into a plurality of sections by the second bridge section. The second amorphous semiconductor film of the second conductivity type that differs from the first conductivity type is formed on the second face of the semiconductor substrate, using the second mask having a third bridge section, a fourth bridge section, and a second opening. The second opening is, in the first direction, divided into a plurality of sections by the third bridge section. The second opening is, in the second direction, divided into a plurality of sections by the fourth bridge section. The first electrodes are formed respectively on the sections of the first amorphous semiconductor film. The second electrodes are formed respectively on the sections of the second amorphous semiconductor film. According to the method of manufacturing a photovoltaic device in accordance with an embodiment disclosed here, the resultant photovoltaic device exhibits an improved heat resistance.

According to a method of manufacturing a photovoltaic device in accordance with an embodiment disclosed here, the first electrodes are separated not only in the first direction, but also in the second direction that intersects the first direction. Therefore, some of the first electrodes could possibly come off the first amorphous semiconductor film, but the other first electrodes will not come off the first amorphous semiconductor film. According to the method of manufacturing a photovoltaic device in accordance with an embodiment disclosed here, the photovoltaic device can hence be manufactured at an improved non-defective product rate. According to the method of manufacturing a photovoltaic device in accordance with an embodiment disclosed here, the second electrodes are separated not only in the first direction, but also in the second direction that intersects the first direction. Therefore, some of the second electrodes could possibly come off the second amorphous semiconductor film, but the other second electrodes will not come off the second amorphous semiconductor film. According to the method of manufacturing a photovoltaic device in accordance with an embodiment disclosed here, the photovoltaic device can hence be manufactured at an improved non-defective product rate.

(14) In a method of manufacturing a photovoltaic device in accordance with an embodiment disclosed here, at least one of the sections of the first opening of the first mask and the sections of the second opening of the second mask may be shaped like a circle, a polygon, or a polygon with rounded corners. This structure can restrain the carriers generated in the semiconductor substrate by the light incident on the first face side of the semiconductor substrate from accumulating in a particular part of the first amorphous semiconductor film or the second amorphous semiconductor film, thereby suppressing temperature rises in this particular part. That can in turn restrain the first amorphous semiconductor film and the second amorphous semiconductor film from being degraded or coming off the semiconductor substrate due to a temperature rise in the first amorphous semiconductor film or the second amorphous semiconductor film

(15) In a method of manufacturing a photovoltaic device in accordance with an embodiment disclosed here, the circles and rounded corners may have a radius of curvature of from 1 µm to 10 mm inclusive. This structure can restrain the carriers generated in the semiconductor substrate by the light incident on the first face side of the semiconductor substrate from accumulating in a particular part of the first amorphous semiconductor film or the second amorphous semiconductor film, thereby further suppressing temperature rises in this particular part. That can in turn further restrain the first amorphous semiconductor film and the second amorphous semiconductor film from being degraded or coming off the semiconductor substrate due to a temperature rise in the first amorphous semiconductor film or the second amorphous semiconductor film.

(16) In a method of manufacturing a photovoltaic device in accordance with an embodiment disclosed here, at least one of the first-direction width of the first bridge section of the first mask, the second-direction width of the second bridge section of the first mask, the first-direction width of the third bridge section of the second mask, and the second-direction width of the fourth bridge section of the second mask may be less than or equal to the diffusion length in the semiconductor substrate of minority carriers generated in the semiconductor substrate by the light incident on the first face side of the semiconductor substrate. Therefore, the minority carriers generated in the semiconductor substrate by the light incident on the first face side of the semiconductor substrate can be efficiently collected through either the first amorphous semiconductor film and the first electrodes or the second amorphous semiconductor film and the second electrodes.

(17) In a method of manufacturing a photovoltaic device in accordance with an embodiment disclosed here, at least one of the first-direction width of the first bridge section of the first mask, the second-direction width of the second bridge section of the first mask, the first-direction width of the third bridge section of the second mask, and the second-direction width of the fourth bridge section of the second mask may be from 30 µm to 1 mm inclusive. Therefore, the resultant photovoltaic device exhibits a further improved heat resistance and prevents excess drop in light-energy-to-electric-energy conversion efficiency.

(18) In a method of manufacturing a photovoltaic device in accordance with an embodiment disclosed here, the second-direction distance of the second bridge section of the first mask may be from one thousandth to one tenth inclusive, of the second-direction length of each section of the first opening of the first mask. Therefore, the resultant photovoltaic device exhibits a further improved heat resistance and prevents excess drop in light-energy-to-electric-energy conversion efficiency.

(19) In a method of manufacturing a photovoltaic device in accordance with an embodiment disclosed here, the second-direction distance of the fourth bridge section of the second mask may be from one thousandth to one tenth inclusive, of the second-direction length of each section of the second opening of the second mask. Therefore, the resultant photovoltaic device exhibits a further improved heat resistance and prevents excess drop in light-energy-to-electric-energy conversion efficiency.

(20) In a method of manufacturing a photovoltaic device in accordance with an embodiment disclosed here, the first opening of the first mask may have a larger area than the second opening of the second mask. Therefore, the resultant photovoltaic device allows for greater freedom in design.

(21) A method of manufacturing a photovoltaic device in accordance with an embodiment disclosed here may further involve forming an i-type amorphous semiconductor film between the semiconductor substrate and the first amorphous semiconductor film and between the semiconductor substrate and the second amorphous semiconductor film. Therefore, the resultant photovoltaic device can further improve the light-energy-to-electric-energy conversion efficiency.

(22) An embodiment disclosed here includes a photovoltaic device and a wiring sheet. The photovoltaic device includes a semiconductor substrate, a first amorphous semiconductor film of a first conductivity type, a second amorphous semiconductor film of a second conductivity type that differs from the first conductivity type, first electrodes, and second electrodes. The semiconductor substrate has a first face and a second face opposite the first face. The semiconductor substrate is a monocrystal semiconductor substrate. The semiconductor substrate stretches in a first direction and a second direction that intersects the first direction. The first amorphous semiconductor film is disposed on the second face of the semiconductor substrate. The second amorphous semiconductor film is disposed on the second face of the semiconductor substrate. The first electrodes are disposed on the first amorphous semiconductor film and separated in the first direction and the second direction. The second electrodes are disposed on the second amorphous semiconductor film and separated in the first direction and the second direction. The photovoltaic device is mechanically connected to the wiring sheet using a junction material. The junction material is disposed in at least one of a region surrounded by the wiring sheet and an adjacent pair of the sections of the first electrodes and a region surrounded by the wiring sheet and an adjacent pair of the sections of the second electrodes. The wiring sheet includes first wires electrically connected to the first electrodes and second wires electrically connected to the second electrodes. The photovoltaic device in accordance with an embodiment disclosed here hence improves mechanical connection strength between the photovoltaic device and the wiring sheet.

In a photovoltaic module in accordance with an embodiment disclosed here, the first electrodes are separated not only in the first direction, but also in the second direction that intersects the first direction. Therefore, some of the first electrodes could possibly come off the first amorphous semiconductor film, but the other first electrodes will not come off the first amorphous semiconductor film. The photovoltaic module in accordance with an embodiment disclosed here hence has a low defective rate. In the photovoltaic module in accordance with an embodiment disclosed here, the second electrodes are separated not only in the first direction, but also in the second direction that intersects the first direction. Therefore, some of the second electrodes could possibly come off the second amorphous semiconductor film, but the other second electrodes will not come off the second amorphous semiconductor film. The photovoltaic module in accordance with an embodiment disclosed here hence has a low defective rate.

(23) In a photovoltaic module in accordance with an embodiment disclosed here, at least one of the first electrodes and the second electrodes may be shaped like a circle, a polygon, or a polygon with rounded corners when viewed from the second face side of the semiconductor substrate. According to the photovoltaic module in accordance with an embodiment disclosed here, the carriers generated in the semiconductor substrate by the light incident on the first face side of the semiconductor substrate can hence be restrained from accumulating in a particular part of the first electrodes or the second electrodes, which suppresses temperature rises in this particular part. That can in turn restrain the first electrodes and the second electrodes from being degraded or coming off the semiconductor substrate due to a temperature rise in the first electrodes or the second electrodes.

(24) In a photovoltaic module in accordance with an embodiment disclosed here, these circles and rounded corners may have a radius of curvature of from 1 μm to 10 mm inclusive. According to the photovoltaic module in accordance with an embodiment disclosed here, the carriers generated in the semiconductor substrate by the light incident on the first face side of the semiconductor substrate are restrained from accumulating in a particular part of the first electrodes or the second electrodes, which further suppresses temperature rises in this particular part. That can in turn further restrain the first electrodes and electrodes from being degraded or coming off the semiconductor substrate due to a temperature rise in the first electrodes or the second electrodes.

(25) in a photovoltaic module in accordance with an embodiment disclosed here, at least one of the distance separating the second-direction-wise adjacent first electrodes and the distance separating the second-direction-wise adjacent second electrodes may be less than or equal to the diffusion length in the semiconductor substrate of minority carriers generated in the semiconductor substrate by the light incident on the first face side of the semiconductor substrate. According to the photovoltaic module in accordance with an embodiment disclosed here, the minority carriers generated in the semiconductor substrate by the light incident on the first face side of the semiconductor substrate can hence be efficiently collected through either the first electrodes or the second electrodes.

(26) In a photovoltaic module in accordance with an embodiment disclosed here, at least one of the distance separating the second-direction-wise adjacent first electrodes and the distance separating the second-direction-wise adjacent second electrodes may be from 30 μm to 1 mm inclusive. The photovoltaic module in accordance with an embodiment disclosed here can hence further improve mechanical connection strength between the photovoltaic device and the wiring sheet. This structure can prevent excess drop in light-energy-to-electric-energy conversion efficiency in the photovoltaic module in accordance with an embodiment disclosed here.

(27) In a photovoltaic module in accordance with an embodiment disclosed here, the distance separating the second-direction-wise adjacent first electrodes may be from one thousandth to one tenth inclusive, of the second-direction length of each first electrode. The photovoltaic module in accordance with an embodiment disclosed here hence further improves mechanical connection strength between the photovoltaic device and the wiring sheet. This structure can prevent excess drop in light-energy-to-electric-energy conversion efficiency in the photovoltaic module in accordance with an embodiment disclosed here.

(28) In a photovoltaic module in accordance with an embodiment disclosed here, the distance separating the second-direction-wise adjacent second electrodes may be from one thousandth to one tenth inclusive, of the second-direction length of each second electrode. The photovoltaic module in accordance with an embodiment disclosed here hence further improves mechanical connection strength between the photovoltaic device and the wiring sheet. This structure can prevent excess drop in light-energy-to-electric-energy conversion efficiency in the photovoltaic module in accordance with an embodiment disclosed here.

(29) In a photovoltaic module in accordance with an embodiment disclosed here, the first amorphous semiconductor film may have a larger area than the second amorphous semiconductor film, when viewed from the second face side of the semiconductor substrate. The photovoltaic module in accordance with an embodiment disclosed here thus allows for greater freedom in design.

(30) In a photovoltaic module in accordance with an embodiment disclosed here, the first amorphous semiconductor film and the second amorphous semiconductor film may be arranged in a stripe pattern, a lattice pattern, or a zigzag pattern, when viewed from the second face side of the semiconductor substrate. The photovoltaic module in accordance with an embodiment disclosed here thus allows for greater freedom in design.

(31) In a photovoltaic module in accordance with an embodiment disclosed here, the first electrodes may have a shorter cycle in the second direction than do the second electrodes. The photovoltaic module in accordance with an embodiment disclosed here hence further improves mechanical connection strength between the photovoltaic device and the wiring sheet.

(32) In a photovoltaic module in accordance with an embodiment disclosed here, the distance separating the first electrodes in the second direction may be smaller than the distance separating the second electrodes in the second direction. According to the photovoltaic module in accordance with an embodiment disclosed here, the carriers generated in the semiconductor substrate by the light incident on the first face side of the semiconductor substrate can hence be more efficiently collected through the first amorphous semiconductor film and the first electrodes.

(33) A photovoltaic module in accordance with an embodiment disclosed here may further include an i-type amorphous semiconductor film between the semiconductor substrate and the first amorphous semiconductor film and between the semiconductor substrate and the second amorphous semiconductor film. The photovoltaic module in accordance with an embodiment disclosed here can hence further improve the tight-energy-to-electric-energy conversion efficiency.

(34) A method of manufacturing a photovoltaic module in accordance with an embodiment disclosed here includes the following steps. A photovoltaic device is prepared. The photovoltaic device includes a semiconductor substrate, a first amorphous semiconductor film of a first conductivity type, a second amorphous semiconductor film of a second conductivity type that differs from the first conductivity type, first electrodes, and second electrodes. The semiconductor substrate has a first face and a second face opposite the first face. The semiconductor substrate is a monocrystal semiconductor substrate. The semiconductor substrate stretches in a first direction and a second direction that intersects the first direction. The first amorphous semiconductor film is disposed on the second face of the semiconductor substrate. The second amorphous semiconductor film is disposed on the second face of the semiconductor substrate. The first electrodes are separated in the first direction and the second direction. The second electrodes are separated in the first direction and the second direction. A wiring sheet is prepared that includes first wires and second wires. A junction material is disposed on at least one of the wiring sheet and the photovoltaic device. The photovoltaic device is mechanically connected to the wiring sheet using the junction material. The junction material is disposed in at least one of a region surrounded by the wiring sheet and an adjacent pair of the first electrodes and a region surrounded by the wiring sheet and an adjacent pair of the second electrodes. The first wires are electrically connected to the first electrodes, and the second wires are electrically connected to the second electrodes. The method of manufacturing a photovoltaic device in accordance with an embodiment disclosed here can hence improve mechanical connection strength between the photovoltaic device and the wiring sheet.

According to a method of manufacturing a photovoltaic module in accordance with an embodiment disclosed here, the resultant photovoltaic module includes the first electrodes being separated not only in the first direction, but also in the second direction that intersects the first direction. Therefore, some of the first electrodes could possibly come off the first amorphous semiconductor film, but the other first electrodes will not come off the first amorphous semiconductor film. According to the method of manufacturing a photovoltaic module in accordance with an embodiment disclosed here, the photovoltaic module can be manufactured at an improved non-detective product rate. According to the method of manufacturing a photovoltaic device in accordance with an embodiment disclosed here, the resultant photovoltaic module includes the second electrodes being separated not only in the first direction, but also in the second direction that intersects the first direction. Therefore, some of the second electrodes could possibly come off the second amorphous semiconductor film, but the other second electrodes will not come off the second amorphous semiconductor film. According to the method of manufacturing a photovoltaic module in accordance with an embodiment disclosed here, the photovoltaic module can be manufactured at an improved non-defective product rate.

(35) In a method of manufacturing a photovoltaic module in accordance with an embodiment disclosed here, the preparation of a photovoltaic device may involve forming the first electrodes and the second electrodes using a mask (third mask 31) having a first bridge section (fifth bridge section 33), a second bridge section (sixth bridge section 34), and an opening (third opening 32). The opening (third opening 32) may, in the first direction, be divided into a plurality of sections by the first bridge section (fifth bridge section 33). The opening (third opening 32) may, in the second direction, be divided into a plurality of sections by the second bridge section (sixth bridge section 34). According to the method of manufacturing a photovoltaic module in accordance with an embodiment disclosed here, the mask (third mask 31) has not only the first bridge section (fifth bridge section 33), but also the second bridge section (sixth bridge section 34). Therefore, the first bridge section (fifth bridge section 33) and the second bridge section (sixth bridge section 34) can impart improved mechanical strength to the mask (third mask 31). According to the method of manufacturing a photovoltaic module in accordance with an embodiment disclosed here, the first electrodes and the second electrodes can be formed in a more accurate pattern.

(36) In a method of manufacturing a photovoltaic module in accordance with an embodiment disclosed here, each section of the opening (third opening 32) of the mask (third mask 31) may be shaped like a circle, a polygon, or a polygon with rounded corners. According to the method of manufacturing a photovoltaic module in accordance with an embodiment disclosed here, the carriers generated in the semiconductor substrate by the light incident on the first face side of the semiconductor substrate can hence be restrained from accumulating in a particular part of the first electrodes or the second electrodes, which suppresses temperature rises in this particular part. That can in turn restrain the first electrodes and electrodes from being degraded or coming off the semiconductor substrate due to a temperature rise in the first electrodes or the second electrodes.

(37) In a method of manufacturing a photovoltaic module in accordance with an embodiment disclosed here, the circles and rounded corners may have a radius of curvature of from 1 µm to 10 mm inclusive. According to the method of manufacturing a photovoltaic module in accordance with an embodiment disclosed here, the carriers generated in the semiconductor substrate b the light incident on the first face side of the semiconductor substrate can hence be restrained from accumulating in a particular part of the first electrodes or the second electrodes, which further suppresses temperature rises in this particular part. That can in turn further restrain the first electrodes and electrodes from being degraded or coming off the semiconductor substrate due to a temperature rise in the first electrodes or the second electrodes.

(38) In a method of manufacturing a photovoltaic module in accordance with an embodiment disclosed here, the width of the second bridge section (sixth bridge section 34) may be less than or equal to the diffusion length in the semiconductor substrate of minority carriers generated in the semiconductor substrate by the light incident on the first face side of the semiconductor substrate. According to the method of manufacturing a photovoltaic module in accordance with an embodiment disclosed here, the minority carriers generated in the semiconductor substrate by the light incident on the first face side of the semiconductor substrate can be efficiently collected through either the first amorphous semiconductor film and the first electrodes or the second amorphous semiconductor film and the second electrodes.

(39) In a method of manufacturing a photovoltaic module in accordance with an embodiment disclosed here, the width of the second bridge section (sixth bridge section 34) may be from 30 μm to 1 mm inclusive. The method of manufacturing a photovoltaic module in accordance with an embodiment disclosed here can hence further improve mechanical connection strength between the photovoltaic device and the wiring sheet. The method of manufacturing a photovoltaic module in accordance with an embodiment disclosed here can prevent excess drop in light-energy-to-electric-energy conversion efficiency in the photovoltaic module.

(40) In a method of manufacturing a photovoltaic module in accordance with an embodiment disclosed here, the width of the second bridge section (sixth bridge section 34) may be from one thousandth to one tenth inclusive, of the second-direction length of each section of the opening (third opening 32) of the mask (third mask 31). The method of manufacturing a photovoltaic module in accordance with an embodiment disclosed here can hence further improve mechanical connection strength between the photovoltaic device and the wiring sheet. The method of manufacturing a photovoltaic module in accordance with an embodiment disclosed here can prevent excess drop in light-energy-to-electric-energy conversion efficiency in the photovoltaic module.

(41) In a method of manufacturing a photovoltaic module in accordance with an embodiment disclosed here, the preparation of a photovoltaic device may involve forming the first amorphous se conductor film having a larger area than the second amorphous semiconductor film, when viewed from the second face side of the semiconductor substrate. According to the method of manufacturing a photovoltaic module in accordance with an embodiment disclosed here, the photovoltaic module can be manufactured with greater freedom in design.

(42) In a method of manufacturing a photovoltaic module in accordance with an embodiment disclosed here, the preparation of the photovoltaic device may further involve forming an i-type amorphous semiconductor film between the semiconductor substrate and the first amorphous semiconductor film and between the semiconductor substrate and the second amorphous semiconductor film. The method of manufacturing a photovoltaic module in accordance with an embodiment disclosed here can hence further improve the light-energy-to-electric-energy conversion efficiency.

The embodiments disclosed herein are for illustrative purposes only in every respect and provide no basis for restrictive interpretations. The scope of the present invention is defined only by the claims and never bound by the description. Those modifications and variations that may lead to equivalents of claimed elements are all included within the scope of the invention.

REFERENCE SIGNS LIST 1, 1a, 1b, 1c, 1d, 1e, 1f, 1g, 1h, 1i, 1j, 1k, 1m, 1n: Photovoltaic Device
2: Semiconductor Substrate
2a: First Face
2b: Second Face
3: Third Amorphous Semiconductor Film
4: Antireflection Coat
5: Amorphous Semiconductor Film
7, 7a, 7b, 7c, 7d, 7e, 7f, 7g, 7h, 7i, 7j, 1k, 7m, 7n: First Amorphous Semiconductor Film
9, 9a, 9h, 9c, 9d, 9e, 9f, 9g, 9h, 9i, 9j, 9k, 9m, 9n: Second Amorphous Semiconductor Film
11, 11a, 11b, 11c, 11d, 11e, 11f, 11g, 11h, 11i, 11j, 11k, 11m, 11n: First Electrode
13, 13a, 13b, 13c, 13d, 13e, 13f, 13g, 13h, 13i, 13j, 13k, 13m, 13n: Second Electrode
21, 21a, 21d, 21h, 21i: First Mask
22, 22a, 22d, 22h, 22i: First Opening
23, 23a, 23d, 23h, 23i: First Bridge Section
24, 24a, 24d: Second Bridge Section
26, 26a, 26b, 26c, 26d, 26f, 26g, 26h, 26i: Second Mask
27, 27a, 27b, 27c, 27d, 27f, 27g, 27h, 27i: Second Opening
28, 28a, 28b, 28c, 28d, 28f, 28g, 28h, 28i: Third Bridge Section
29, 29a, 29b, 29c, 29d, 29f, 29g: Fourth Bridge Section
31, 31a, 31b, 31c, 31d, 31e, 31f, 31g, 31i, 31j, 31k, 31m, 31n: Third Mask
32, 32a, 32b, 32c, 32d, 32e, 32f, 32g, 32k, 32m, 32n: Third Opening
33, 33a, 33b, 33c, 33e, 33f, 33g, 33i, 33j, 33k, 33m, 33n: Fifth Bridge Section
34, 34a, 34b, 34c, 34f, 34g, 34i, 34j, 34k, 34m, 34n: Sixth Bridge Section
38: Junction Material
40: Wiring Sheet
41: Base Material
42: First Wire
43: Second Wire
44: Power Collection Wire
51, 51a, 51b, 51c, 51d, 51e, 51f, 51g: Photovoltaic Module

What is claimed is:

1. A photovoltaic device comprising:
a semiconductor substrate having a first face and a second face opposite the first face, the semiconductor substrate comprising a monocrystal semiconductor substrate and extending in a first direction and a second direction that intersects the first direction;
a first amorphous semiconductor film of a first conductivity type disposed on the second face of the semiconductor substrate and divided into a plurality of first column sections in the first direction;
a second amorphous semiconductor film of a second conductivity type disposed on the second face of the semiconductor substrate, the second conductivity type different from the first conductivity type, the second amorphous semiconductor film divided into a plurality of second column sections in the first direction;

a plurality of first electrodes arranged in the first direction and the second direction on the plurality of first column sections;

a plurality of second electrodes arranged in the first direction and the second direction on the plurality of second column sections;

a plurality of first boundaries between each of the plurality of first electrodes on each of the plurality of the first column sections; and a plurality of second boundaries between each of the plurality of second electrodes on each of the plurality of the second column sections, wherein the plurality of first column sections and the plurality of second column sections are arranged alternately in the first direction column-by-column, wherein each first column section of the plurality of the first column sections surrounds two or more of the first electrodes arranged in the second direction on that first column section;

wherein each second column section of the plurality of the second column sections surrounds two or more of the second electrodes arranged in the second direction on that second column section, wherein a first width in the first direction of the plurality of first column sections is wider than a second width in the first direction of the plurality of second column sections, and wherein a third width in the first direction of the plurality of first electrodes is wider than a fourth width in the first direction of the plurality of second electrodes.

2. The photovoltaic device according to claim 1, wherein at least one of the plurality of first electrodes and the plurality of second electrodes is shaped like a circle, a polygon, or a polygon with rounded corners, when viewed from a second face side of the semiconductor substrate.

3. The photovoltaic device according to claim 1, wherein the first amorphous semiconductor film has a larger area than the second amorphous semiconductor film, when viewed from a second face side of the semiconductor substrate.

4. The photovoltaic device according to claim 1, wherein the plurality of second column sections of the second amorphous semiconductor film are arranged in a stripe pattern, when viewed from a second face side of the semiconductor substrate.

5. The photovoltaic device according to claim 1, wherein the plurality of first electrodes have a shorter cycle in the second direction than the plurality of second electrodes.

6. The photovoltaic device according to claim 1, wherein the plurality of first electrodes are separated in the second direction by a smaller distance than the plurality of second electrodes.

7. The photovoltaic device according to claim 1, further comprising an i-type amorphous semiconductor film between the semiconductor substrate and the first amorphous semiconductor film and between the semiconductor substrate and the second amorphous semiconductor film.

8. The photovoltaic device according to claim 1, wherein the plurality of first electrodes have a larger area than the plurality of second electrodes, when viewed from a second face side of the semiconductor substrate.

9. The photovoltaic device according to claim 1, wherein the plurality of first electrodes and the plurality of second electrodes are arranged alternately in the first direction, and none of the plurality of second electrodes is adjacent to another one of the plurality of second electrodes in the first direction.

10. The photovoltaic device according to claim 1, wherein the semiconductor substrate is of n-type, the first amorphous semiconductor film is of p-type, and the second amorphous semiconductor film is of n-type.

11. The photovoltaic device according to claim 1, wherein at least one of the plurality of first electrodes and the plurality of second electrodes is shaped like a circle or a polygon with rounded corners, when viewed from a second face side of the semiconductor substrate.

12. The photovoltaic device according to claim 1, wherein:
the plurality of first column sections and the plurality of second column sections are not divided into a plurality of parts in the second direction,
a first divided number of the plurality of first electrodes in one first column section is larger than a second divided number of the plurality of second electrodes in one second column section.

13. The photovoltaic device according to claim 1, wherein the plurality of first column sections and the plurality of second column sections are not divided into a plurality of parts in the second direction,
a first period of the plurality of first electrodes arranged along the second direction in one first column section is shorter than a second period of the plurality of second electrodes arranged along the second direction in one second column section.

14. The photovoltaic device according to claim 1, wherein a first divided number of the plurality of first electrodes in one first column section is larger than a second divided number of the plurality of second electrodes in one second column section.

15. The photovoltaic device according to claim 1, wherein a first period of the plurality of first electrodes arranged along the second direction in one first column section is shorter than a second period of the plurality of second electrodes arranged along the second direction in one second column section.

16. The photovoltaic device according to claim 1, wherein:
the plurality of second column sections is adjacent to the plurality of first column sections in the second direction such that a zigzag pattern is formed,
the plurality of first boundaries is shifted from the plurality of second boundaries.

17. The photovoltaic device according to claim 1, wherein the plurality of first column sections is not connected to each other by a pattern of the first amorphous semiconductor film, and the plurality of second column sections is not connected to each other by a pattern of the second amorphous semiconductor film.

18. A photovoltaic module comprising:
a photovoltaic device according to claim 1; and
a wiring sheet,
wherein the photovoltaic device is mechanically connected to the wiring sheet using a junction material,
wherein each first electrode of the plurality of first electrodes is adjacent to a second electrode of the plurality of second electrodes in the first direction,
wherein the junction material is disposed in regions between the plurality of first electrodes and the plurality of second electrodes and is disposed in the plurality of first boundaries and the plurality of second boundaries, and wherein the wiring sheet comprises first wires electrically connected to the plurality of first electrodes and second wires electrically connected to the plurality of second electrodes.

19. The photovoltaic device according to claim 18, wherein the junction material is a resin adhesive.

\* \* \* \* \*

UNITED STATES PATENT AND TRADEMARK OFFICE
CERTIFICATE OF CORRECTION

Page 1 of 1

PATENT NO. : 10,903,379 B2
APPLICATION NO. : 15/557728
DATED : January 26, 2021
INVENTOR(S) : Teruaki Higo et al.

It is certified that error appears in the above-identified patent and that said Letters Patent is hereby corrected as shown below:

In the Claims

1) In Claim 1, Column 77, Line 8, should read "...on each of the plurality of first..."

2) In Claim 1, Column 77, Line 12, should read "second column sections"

3) In Claim 1, Column 77, Line 16, should read "...each first column section of the plurality of"

4) In Claim 1, Column 77, Line 20, should read "...each second column section of the plurality of"

5) In Claim 1, Column 77, Lines 21-22, should read "...two or more of the plurality of second electrodes..."

6) In Claim 12, Column 78, Line 14, should read "of parts in the second direction, and"

7) In Claim 13, Column 78, Line 22, should read "in the second direction, and"

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*